United States Patent
Iwato et al.

(10) Patent No.: US 9,017,917 B2
(45) Date of Patent: Apr. 28, 2015

(54) RESIST COMPOSITION AND METHOD OF FORMING PATTERN THEREWITH

(75) Inventors: Kaoru Iwato, Haibara-gun (JP); Kazuto Kunita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 435 days.

(21) Appl. No.: 12/535,240

(22) Filed: Aug. 4, 2009

(65) Prior Publication Data

US 2010/0028804 A1    Feb. 4, 2010

Related U.S. Application Data

(60) Provisional application No. 61/086,941, filed on Aug. 7, 2008.

(30) Foreign Application Priority Data

Aug. 4, 2008 (JP) ................................. 2008-201309

(51) Int. Cl.
| | | |
|---|---|---|
| *G03F 7/039* | (2006.01) | |
| *G03F 7/004* | (2006.01) | |
| *G03F 7/075* | (2006.01) | |
| *G03F 7/20* | (2006.01) | |
| *G03F 7/30* | (2006.01) | |

(52) U.S. Cl.
CPC ................ *G03F 7/0046* (2013.01); *G03F 7/30* (2013.01); *G03F 7/0045* (2013.01); *G03F 7/0397* (2013.01); *G03F 7/0757* (2013.01); *G03F 7/0758* (2013.01); *G03F 7/2041* (2013.01)

(58) Field of Classification Search
None
See application file for complete search history.

(56) References Cited

U.S. PATENT DOCUMENTS

| | | | |
|---|---|---|---|
| 2004/0058269 A1 | 3/2004 | Hada et al. | |
| 2006/0246373 A1* | 11/2006 | Wang ......................... | 430/270.1 |
| 2007/0059639 A1* | 3/2007 | Kanda et al. ............... | 430/270.1 |
| 2007/0134590 A1* | 6/2007 | Fukuhara et al. .......... | 430/270.1 |
| 2007/0218401 A1 | 9/2007 | Ando et al. | |
| 2007/0231738 A1* | 10/2007 | Kaneko et al. ............. | 430/270.1 |
| 2008/0026331 A1* | 1/2008 | Hasegawa et al. ........... | 430/327 |
| 2008/0090173 A1 | 4/2008 | Harada et al. | |
| 2008/0248425 A1* | 10/2008 | Nishiyama et al. ........ | 430/285.1 |
| 2009/0325103 A1* | 12/2009 | Sato et al. .................. | 430/270.1 |

FOREIGN PATENT DOCUMENTS

| | | |
|---|---|---|
| JP | 2003-167347 A | 6/2003 |
| JP | 2003-223001 A | 8/2003 |
| JP | 2007-249192 A | 9/2007 |
| JP | 2008-65098 A | 3/2008 |
| JP | 2008-088343 A | 4/2008 |
| JP | 2008-102276 A | 5/2008 |
| WO | 2009/142183 A1 | 11/2009 |

OTHER PUBLICATIONS

Japanese Office Action issued in application No. 2009-178796 dated Mar. 12, 2013.

* cited by examiner

*Primary Examiner* — Sin Lee
(74) *Attorney, Agent, or Firm* — Sughrue Mion, PLLC

(57) ABSTRACT

A resist composition comprises two or more polymers containing a first polymer and a second polymer and a compound that when exposed to actinic rays or radiation, generates an acid, wherein when the resist composition is formed into a dry resist film, the mixing ratios of at least the first and second polymers in the resist film exhibit a gradient distribution such that the mixing ratios continuously change in entirety or partially in the direction of the depth from the surface of the resist film on the air side toward a support, and wherein the mixing ratio of the first polymer at a superior portion of the resist film is higher than that of the second polymer, while the mixing ratio of the second polymer at an inferior portion of the resist film is higher than that of the first polymer.

14 Claims, 1 Drawing Sheet

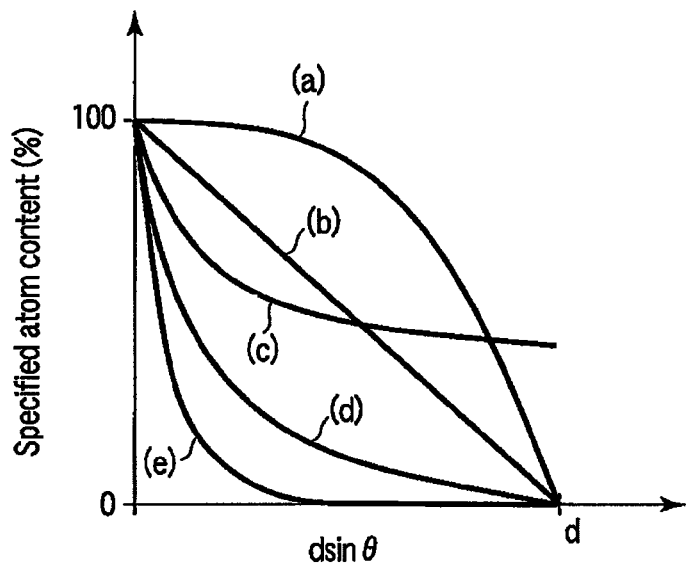
F I G. 1
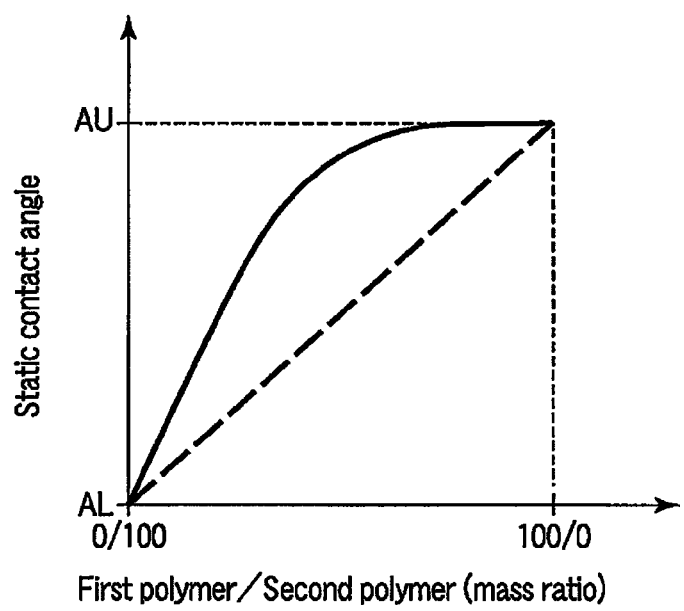
F I G. 2

RESIST COMPOSITION AND METHOD OF FORMING PATTERN THEREWITH

CROSS-REFERENCE TO RELATED APPLICATIONS

This application claims the benefit of U.S. Provisional Application No. 61/086,941, filed Aug. 7, 2008.

This application is based upon and claims the benefit of priority from prior Japanese Patent Applications No. 2008-201309, filed Aug. 4, 2008, the entire contents of which are incorporated herein by reference.

BACKGROUND OF THE INVENTION

1. Field of the Invention

The present invention relates to a resist composition for use in a process for producing a semiconductor such as an IC, a process for producing a circuit board for e.g., a thermal head or a liquid crystal, and other photofabrication processes, and relates to a method of forming a pattern by use of the composition. More particularly, the present invention relates to a resist composition that finds appropriate application when an exposure light source emits far-ultraviolet rays, electron beams or the like of wavelength 250 nm or shorter, preferably 220 nm or shorter, and also relates to a method of forming a pattern by use of the composition.

2. Description of the Related Art

A chemical amplification photosensitive composition is a pattern forming material that is capable of, upon exposure to far-ultraviolet or other radiation, generating an acid at the exposed area and, by a reaction catalyzed by the acid, changing the solubility in a developer between the area having been exposed to actinic radiation and the nonexposed area to thereby attain pattern formation on a substrate.

In using a KrF excimer laser as an exposure light source, a resin whose fundamental skeleton consists of a poly(hydroxystyrene) exhibiting a low absorption mainly in the region of 248 nm is employed as a major component of the composition. Accordingly, there can be attained a high sensitivity, high resolving power and favorable pattern formation. Thus, a system superior to the conventional naphthoquinone diazide/novolak resin system is realized.

In contrast, in using a light source of a further shorter wavelength, for example, an ArF excimer laser (193 nm), as an exposure light source, as the compounds having an aromatic group inherently exhibit a sharp absorption in the region of 193 nm, the above-mentioned chemical amplification system has not been satisfactory.

Therefore, resists for an ArF excimer laser containing a resin with an alicyclic hydrocarbon structure have been developed. For example, patent references 1 and 2 below describe compositions containing resins each simultaneously having a polycyclic acid-decomposable repeating unit and a non-acid-decomposable repeating unit. These resins without exception provide a chemical amplification resist having a protective group that is dissociated by an acid, thus being unstable to acids. However, in the current situation in which a further nanonization of resist pattern is demanded, it has become difficult to obtain a satisfactory resist performance by the employment of these resins only. Accordingly, a technology involving blending multiple polymers with each other has been proposed. For example, patent references 3 to 5 below describe the development of a technology involving blending of a polymer containing a fluorine atom.

However, the conventional resist compositions have been unsatisfactory in some respects, and further improvement has been demanded on the LWR, exposure latitude and pattern collapse performance.

[Patent reference 1] Jpn. Pat. Appln. KOKAI Publication No. (hereinafter referred to as JP-A-) 2003-167347,
[Patent reference 2] JP-A-2003-223001,
[Patent reference 3] JP-A-2007-249192,
[Patent reference 4] JP-A-2008-102276, and
[Patent reference 5] JP-A-2008-88343.

BRIEF SUMMARY OF THE INVENTION

The present invention has been made in view of the above background of the art. It is an object of the present invention to provide a resist composition that finds applications in the formation of nanonized patterns for semiconductor production and that is superior to the conventional products in the exposure latitude, LWR and pattern collapse performance.

The inventors have focused attention on the dependence on resist process (exposure, baking and development) in the direction of the depth of a resist film as a shortcoming of the conventional resist compositions, and have conducted extensive and intensive studies. As a result, the above object has been attained.

That is, during the resist process (exposure, baking and development), as regards image formation the resist film would suffer optical image influences (light is absorbed at a superior portion so that the light reaching an inferior portion is decreased in the direction of the depth of the film) at the stage of exposure, would suffer heat conduction influences (temperature readily rises at a superior portion) at the stage of baking, and would suffer alkali developer permeation influences (duration of developer permeation is prolonged at a superior portion) at the stage of alkali development.

The conventional resist films have a single-layer structure. In this structure, the above-mentioned influences of each of the stages of the process are straightforward. For example, when the image formation at a superior portion of the resist film where the amounts of light, heat and alkali are large is taken as the basis, the image formation at an inferior portion would be unsatisfactory. In contrast, when the image formation at an inferior portion is taken as the basis, the image formation at a superior portion of the resist film would be excessive to thereby invite film thinning or other pattern collapse.

The above-mentioned failure to conduct control in the direction of the depth of the film for coping with the resist process has necessitated a traditional trade-off among various performances, such as the exposure latitude, sensitivity, LWR and pattern collapse (support adherence). Especially, as to the leading-edge EUV or ArF liquid immersion exposure ultrafine resists, it is becoming extremely difficult to attain satisfaction in all of the performances.

However, as a result of extensive and intensive studies, the inventors have succeeded in creating, in a resist film containing two or more specified polymers, a gradient distribution such that the mixing ratios of the polymers continuously change in the direction of the depth of the film. This success has resolved the above traditional trade-off among various performances attributed to the resist process dependence in the direction of the depth of the film. That is, the present invention realizes the most appropriate process dependence by the arrangement of polymers capable of image formation in conformity to a superior portion and an inferior portion of the film, thereby resolving the trade-off among various performances.

The present invention is as follows.

(1) A resist composition comprising two or more polymers containing a first polymer and a second polymer and a compound that when exposed to actinic rays or radiation, generates an acid, wherein when the resist composition is formed into a dry resist film, the mixing ratios of at least the first and second polymers in the resist film exhibit a gradient distribution such that the mixing ratios continuously change in entirety or partially in the direction of the depth from the surface of the resist film on the air side toward a support, and wherein the mixing ratio of the first polymer at a superior portion of the resist film is higher than that of the second polymer, while the mixing ratio of the second polymer at an inferior portion of the resist film is higher than that of the first polymer.

(2) The resist composition according to item (1), wherein the first and second polymers satisfy either requirement (i) or requirement (ii) below:

(i) affinity to air surface: first polymer>second polymer, and (ii) affinity to support surface: first polymer<second polymer.

(3) The resist composition according to item (1) or (2), wherein each of the first and the second polymers independently contains a repeating unit that generates an alkali-soluble group by acid decomposition and/or a repeating unit that generates an alkali-soluble group by alkali hydrolysis.

(4) The resist composition according to any of items (1) to (3), wherein the first polymer contains an F atom and/or an Si atom.

(5) The resist composition according to any of items (1) to (4), wherein the second polymer contains an N atom, an Si atom or a Ti atom.

(6) The resist composition according to any of items (3) to (5), wherein at least one alkali-soluble group generated by the repeating unit contained in the first polymer and/or the second polymer is an acid group of 11 or below acid dissociation constant (pKa).

(7) The resist composition according to any of items (3) to (6), wherein the first polymer and/or the second polymer contains two or more repeating units that generate an alkali-soluble group by acid decomposition.

(8) The resist composition according to any of items (3) to (7), wherein at least one repeating unit that generates an alkali-soluble group by acid decomposition, contained in the first polymer and/or the second polymer has a 5- or 6-membered monocyclic hydrocarbon protective group or a polycyclic hydrocarbon protective group containing a 5- or 6-membered cyclic structure.

(9) The resist composition according to any of items (3) to (8), wherein the first polymer and/or the second polymer contains two or more repeating units that generate an alkali-soluble group by alkali hydrolysis.

(10) The resist composition according to any of items (3) to (9), wherein at least one repeating unit that generates an alkali-soluble group by alkali hydrolysis, contained in the first polymer and/or the second polymer has a lactone structure.

(11) The resist composition according to item (10), wherein the repeating unit having the lactone structure is represented by the general formula (1):

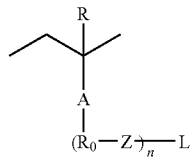

(1)

wherein:

R represents a hydrogen atom or an optionally substituted alkyl group;

A represents:

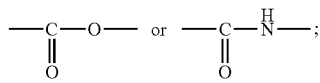

$R_0$, each independently in the presence of two or more groups, represents an optionally substituted alkylene group, an optionally substituted cycloalkylene group or a combination thereof;

Z, each independently in the presence of two or more groups, represents an ether bond, an ester bond, an amido bond, a urethane bond or a urea bond;

L represents a substituent with a lactone structure; and n represents the number of repetitions and is an integer of 1 to 5.

(12) A method of forming a pattern, comprising the steps of forming the resist composition according to any of items (1) to (11) into a resist film, exposing the resist film to light and developing the exposed film.

The present invention has made it feasible to provide a resist composition that is improved in the exposure latitude, LWR and pattern collapse performance, being suitable for use in the formation of a nanonized pattern for semiconductor production.

BRIEF DESCRIPTION OF THE SEVERAL VIEWS OF THE DRAWING

FIG. 1 is a graph schematically showing the results of measurement by ESCA for the purpose of explaining a gradient distribution of polymer.

FIG. 2 is a graph schematically showing the results of measurement of static contact angle for the purpose of explaining a gradient distribution of polymer.

DETAILED DESCRIPTION OF THE INVENTION

The present invention will be described in detail below.

With respect to the expression of a group (atomic group) used in this specification, the expression even when there is no mention of "substituted and unsubstituted" encompasses groups not only having no substituent but also having substituents. For example, the expression "alkyl groups" encompasses not only alkyls having no substituent (unsubstituted alkyls) but also alkyls having substituents (substituted alkyls).

1. Resin (A) Whose Solubility in an Alkali Developer is Increased by Acid Decomposition or Alkali Hydrolysis The resist composition of the present invention contains at least a first polymer and a second polymer as the resins (A). With respect to the first and second polymers for use in the present invention, when the resist composition is applied and dried into a dry resist film, the mixing ratios thereof in the resist film exhibit a gradient distribution such that the mixing ratios continuously change in entirety or partially in the direction of the depth from the surface of the resist film on the air side toward a support.

That is, by the employment of these polymers, the mixing ratio of the first polymer relative to all the polymers constituting the resins (A) in the dry resist film continuously decreases in the direction of the depth from the surface of the resist film on the air side toward a support. In contrast, the mixing ratio of the second polymer relative to all the polymers constituting the resins (A) in the dry resist film continuously increases in the direction of the depth from the surface of the resist film on the air side toward a support. Accordingly, there can be obtained a resist film wherein at a superior portion of the resist film the mixing ratio of the first polymer is higher than that of the second polymer (hereinafter the first polymer may also be referred to as the "superior-portion polymer" or the like), while at an inferior portion of the resist film the mixing ratio of the second polymer is higher than that of the first polymer (hereinafter the second polymer may also be referred to as the "inferior-portion polymer" or the like). In the present invention, it is not needed for each of the mixing ratios of the first and second polymers to exhibit a gradient distribution such that the mixing ratio continuously changes throughout the direction of the depth from the surface of the resist film on the air side toward a support. It is only needed that a superior portion at which the mixing ratio of the first polymer is higher than that of the second polymer and an inferior portion at which the mixing ratio of the second polymer is higher than that of the first polymer are formed in the dry resist film by realizing a gradient distribution in part in the direction of the depth.

Herein, the "superior portion" of the resist film refers to an area of within 30% of the film thickness from the surface of the resist film on the air side. The "inferior portion" of the resist film refers to an area of within 30% of the film thickness from the surface of the resist film on the support side.

When the resist composition of the present invention contains a third polymer, it is preferred for the mixing ratio of the third polymer to have a gradient distribution such that the mixing ratio continuously increases from a low mixing ratio from the surface of the resist film on the air side toward a support, becoming high in an interior and continuously decreases toward a further depth.

When the resist composition of the present invention contains the hydrophobic resin (HR) to be described hereinafter, the hydrophobic resin is a polymer with the property of undergoing a phase separation and being localized at the uppermost surface and thus is not involved in the polymers realizing a gradient distribution according to the present invention.

Various properties of the resist, such as the exposure latitude, LWR and pattern collapse, having been a subject of trade-off at the superior portion and inferior portion of the resist film can be improved by use of polymers whose mixing ratios exhibit a gradient distribution such that the mixing ratios continuously change in the direction of the depth.

In the present invention, whether or not the distribution of the mixing ratios of individual polymers in the direction of the depth is a gradient distribution can be analyzed by, for example, the measurement of the degree of distribution of a specified atom, such as an F atom, in the direction of the depth by ESCA (see FIG. 1), or alternatively any change of surface contact angle (see FIG. 2).

In connection with the measurement of the degree of distribution of a specified atom in the direction of the depth by ESCA, FIG. 1 is a graph schematically showing the measurement result by variable-angle XPS with respect to a mixture of two types of polymers. In the graph, the abscissa axis indicates d sin θ being a function of incident angle θ (0°<θ≤90°) and distance d in the direction of the depth that can be measured by the described measuring method. The ordinate axis indicates the specified atom/carbon atom intensity ratio (for example, F/C when the superior-portion polymer (first polymer) contains an F atom while the inferior-portion polymer (second polymer) does not contain F) in a mixture of two types of polymers. In the event that the compound that, when exposed to actinic rays or radiation, generates an acid, and which is contained in the resist composition of the present invention, contains the same specified atom (for example, an F atom) as in the first polymer, the mixture of two types of polymers consisting of the first and second polymers is employed as a measuring sample.

As to the "gradient" distribution of the mixing ratios in the direction of the depth, the curves (a) to (e) of FIG. 1 provide typical patterns thereof.

With respect to the numerical requirement as a guide for being "gradient," the gradient slope Kg defined by the formula below preferably satisfies the relationship $-1.0 \leq Kg \leq -0.01$, more preferably $-0.3 \leq Kg \leq -0.01$ and most preferably $-0.1 \leq Kg \leq -0.03$. In the system wherein Kg is 0, the first and second polymers are homogeneously compatibilized with each other in the direction of the depth (that is, no concentration distribution in the direction of the depth). In the system wherein Kg is $-\infty$, the first polymer undergoes a phase separation so as to be localized in the surface. In the dry film formed from the resist composition of the present invention, satisfying the relationship $-1.0 \leq Kg \leq -0.01$ is a guide for the realization of the state that the first and second polymers exhibit a gradient without being homogeneously compatibilized with each other in the direction of the depth and without undergoing a phase separation.

Herein, when f(x) refers to F/C exhibited when d sin θ=x, the gradient slope Kg is expressed by the formula below.

$$Kg=\Delta(F/C)/\Delta(d\sin\theta)=[f(1.0)-f(0.4)]/[1.0-0.4]$$

FIG. 2 is a graph schematically showing the measurement results of static contact angles with respect to a mixture of two types of polymers. In the graph, the abscissa represents the polymer mixing ratio (mass ratio) expressed as "first polymer/second polymer," and the ordinate represents the static contact angle of polymer mixture films. On the ordinate, the mark AU indicates the static contact angle of a film consisting only of the superior-portion polymer (first polymer) while the mark AL indicates the static contact angle of a film consisting only of the inferior-portion polymer (second polymer). The method described in the Examples appearing hereinafter is employed in the measurement of the static contact angle.

When the first and second polymers are compatibilized with each other, the static contact angle is on a simple arithmetic average value line shown by a dashed line in the center of the graph. When the mixing ratios are "gradient," the static contact angle is on an upward convex curve. Regarding the numerical requirement as a guide for being "gradient" (convex in the graph of FIG. 2), use can be made of a surface coverage ratio. That when the amount of first polymer added is 10 mass % based on the total solid content of the composition, the surface coverage ratio of the first polymer determined by the method described in the Examples appearing hereinafter is preferably in the range of 20 to 95%, more preferably 30 to 70% and most preferably 40 to 60% is a guide for being "gradient."

Within the preferred numerical range indicated using the above FIGS. 1 and 2, the two polymers realize a gradient distribution without being compatibilized with each other or without any phase separation, thereby favorably improving the image forming capability and development defect (without homogeneous dissolution in a developer, inviting occurrence of residue or other scum on the pattern) performance.

It is preferred for the first and second polymers realizing this gradient structure to satisfy the following requirement. That is, the individual polymers are those each independently having an image forming capability in the resist process and satisfying either requirement (i) or requirement (ii) below:

(i) affinity to air surface: first polymer>second polymer, and (ii) affinity to support surface: first polymer<second polymer.

As another preferred instance, there can be mentioned a closeness in affinity between the first and second polymers. For example, the absolute value of a difference between the solubility parameter SP values (MPa$^{1/2}$) calculated with respect to the individual polymers in accordance with the Okitsu method (Journal of the Adhesive Society of Japan, Vol. 29, No. 5 [1993], pages 204-211, Role of solubility parameter [SP], First report, Method of determining SP from molar attraction constant), ΔSP value, is preferably in the range of 0 to 5, more preferably 0.1 to 3 and most preferably 0.2 to 2. When the ΔSP value falls within this range, favorably, any phase separation would be suppressed and the attainment of a gradient distribution would be facilitated.

From the viewpoint of simultaneous attainment of affinity to the inferior-portion polymer and developability, the contact angle of a film consisting only of the superior-portion polymer is preferably in the range of 60 to 100°, more preferably 60 to 80° and most preferably 60 to 75°. In particular, when the hydrophobic resin (HR) to be described with examples hereinafter is added to the resist composition of the present invention, the above range is appropriate for floating the hydrophobic resin (HR) to the uppermost layer.

Moreover, the film consisting only of the first polymer preferably has a surface free energy (γtotal) of 15 to 40 mJ/m$^2$, more preferably 18 to 35 mJ/m$^2$ and further preferably 20 to 30 mJ/m$^2$. The value of this surface free energy (γtotal) is determined in accordance with Owens-Wendt described in "Technical know-how collection for control/evaluation of wettability according to object/use" (Technical Information Institute Co., Ltd., pages 139-). In the determination, a solution of a mixture of water and iodomethane is used as the probe solution, and the value of contact angle is one measured one second after landing of a probe solution droplet.

As an appropriate example of the structure of the first polymer (superior-portion polymer), there can be mentioned a polymer containing an F atom or an Si atom. An especially preferred polymer is one containing a fluorine carbide group as an F-atom-containing unit or a silicone group (SiOSi) as an Si-atom-containing unit. The content of repeating unit containing this unit based on all the repeating units contained in the first polymer is preferably in the range of 10 to 50 mol %, more preferably 15 to 40 mol % and most preferably 20 to 40 mol %. This range is desired from the viewpoint of not only the attainment of a gradient distribution design (neither homogeneous compatibilization nor phase separation in the direction of the depth) but also the simultaneous attainment of development residue and pattern collapse (PC) performance involving the collapse of line pattern, etc. at the time of development.

A monomer unit having an adamantyl group directly linked to its side chain exhibits high polymer self-cohesive properties and is likely to induce a nanophase separation. Therefore, in the use thereof, it is necessary to limit the content thereof. The content based on all the repeating units contained in the first polymer is preferably in the range of 0 mol % to 30 mol %, more preferably 20 mol % or below and most preferably 10 mol % or below. Higher contents are unfavorable as the occurrence of development defects tends to increase.

The monomer unit having an adamantyl group directly linked to its side chain means, for example, a monomer unit having the oxygen of (meth)acrylic acid directly bonded to a carbon as a constituent of adamantane as expressed by the general formula below. Even when, for example, the substituent R$_2$ contains an F atom or an Si atom, the above limit applies.

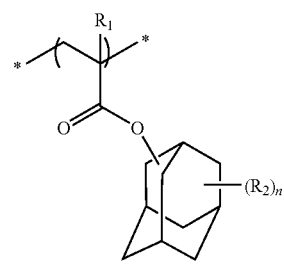

In the above formula, each of R$_1$ and R$_2$ independently represents a hydrogen atom or a substituent, and n is an integer of 0 to 6. When n is 2 or greater, the multiple R$_2$s may be identical to or different from each other.

Particular examples of preferred repeating units containing an F atom and repeating units containing an Si atom contained in the first polymer will be described below.

It is preferred for the first polymer to be a resin having, as a partial structure having a fluorine atom, an alkyl group having a fluorine atom, a cycloalkyl group having a fluorine atom, an aryl group having a fluorine atom or a lactone structure having a fluorine atom.

The alkyl group having a fluorine atom (preferably having 1 to 10 carbon atoms, more preferably 1 to 4 carbon atoms) is a linear or branched alkyl group having at least one hydrogen atom thereof substituted with a fluorine atom. Further, other substituents may be contained.

The cycloalkyl group having a fluorine atom is a cycloalkyl group of a single ring or multiple rings having at least one hydrogen atom thereof substituted with a fluorine atom. Further, other substituents may be contained.

As the aryl group having a fluorine atom, there can be mentioned one having at least one hydrogen atom of the aryl group, such as a phenyl or naphthyl group, substituted with a fluorine atom. Further, other substituents may be contained.

As preferred alkyl groups having a fluorine atom, cycloalkyl groups having a fluorine atom and aryl groups having a fluorine atom, there can be mentioned groups of general formulae F2 to F4, below, which however in no way limit the scope of the present invention.

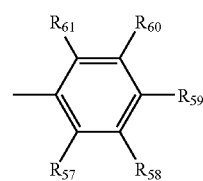

(F2)

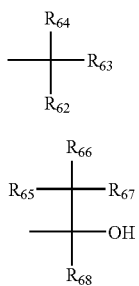

In general formulae (F2) to (F4), each of $R_{57}$ to $R_{68}$ independently represents a hydrogen atom, a fluorine atom or an alkyl group, provided that at least one of each of $R_{57}$-$R_{61}$, $R_{62}$-$R_{64}$ and $R_{65}$-$R_{68}$ represents a fluorine atom or an alkyl group (preferably having 1 to 4 carbon atoms) having at least one hydrogen atom thereof substituted with a fluorine atom. It is preferred for all of $R_{57}$-$R_{61}$ and $R_{65}$-$R_{67}$ to represent fluorine atoms. Each of $R_{62}$, $R_{63}$ and $R_{68}$ preferably represents an alkyl group (especially having 1 to 4 carbon atoms) having at least one hydrogen atom thereof substituted with a fluorine atom, more preferably a perfluoroalkyl group having 1 to 4 carbon atoms. $R_{62}$ and $R_{63}$ may be bonded to each other to thereby form a ring.

Specific examples of the groups of general formula (F2) include a p-fluorophenyl group, a pentafluorophenyl group, a 3,5-di(trifluoromethyl)phenyl group and the like.

Specific examples of the groups of general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of general formula (F4) include —C(CF$_3$)$_2$OH, —C(C$_2$F$_5$)$_2$OH, —C(CF$_3$)(CH$_3$)OH, —CH(CF$_3$)OH and the like. —C(CF$_3$)$_2$OH is preferred.

As preferred repeating units with the lactone structure having a fluorine atom, there can be mentioned the repeating units represented by the general formula (F5) below.

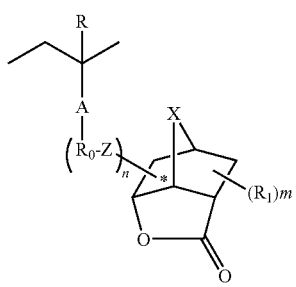

In the general formula (F5),
R, A, $R_0$, Z and n are the same as in general formula (1) to be described hereinafter.

$R_1$, each independently in the presence of two or more groups, represents an optionally substituted alkyl group, an optionally substituted cycloalkyl group, an optionally substituted ester group, a cyano group, a hydroxyl group or an alkoxy group. In the presence of two or more groups, two $R_1$s may be bonded with each other to thereby form a ring. At least one $R_1$ represents a substituent containing a fluorine atom.

X represents an alkylene group, an oxygen atom or a sulfur atom, and m is the number of substituents and is an integer of 0 to 5.

A further detailed description will be made with respect to the general formula (F5).

The preferred examples of the groups represented by R and $R_0$ are the same as mentioned with respect to the general formula (1).

As the alkylene group represented by X, there can be mentioned a methylene group, an ethylene group or the like.

As the substituent containing a fluorine atom represented by $R_1$, the group represented by the following general formula (F5-1) is preferred. The substitution site of at least one substituent containing a fluorine atom represented by $R_1$ is preferably the β-position of the lactone.

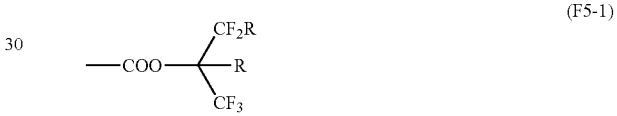

In the general formula (F5-1), each of R independently represents a hydrogen atom, a fluorine atom, or an alkyl group, having 1 to 6 carbon atoms, optionally substituted with a fluorine atom.

The especially preferred groups represented by the formula (F5-1) will be mentioned below.

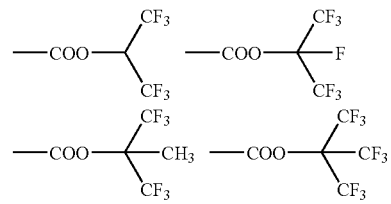

Specific examples of the repeating units having a fluorine atom will be shown below, which however in no way limit the scope of the present invention.

In the specific examples, $X_1$ represents a hydrogen atom, —CH$_3$, —F or —CF$_3$.
$X_2$ represents —F or —CF$_3$.

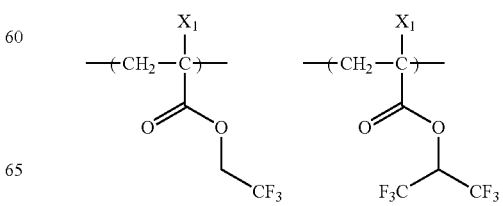

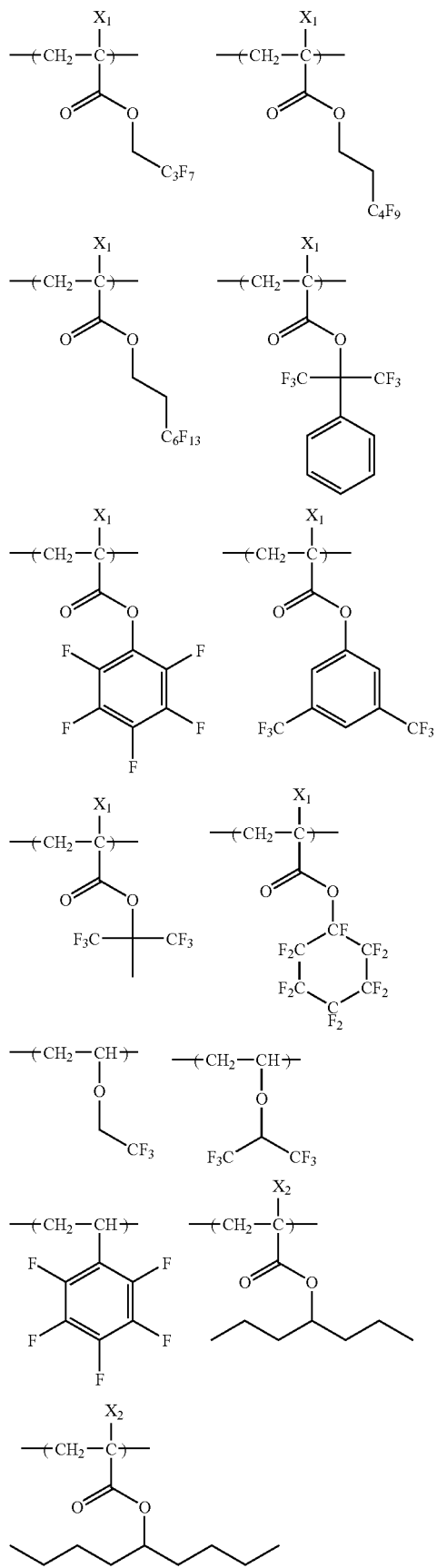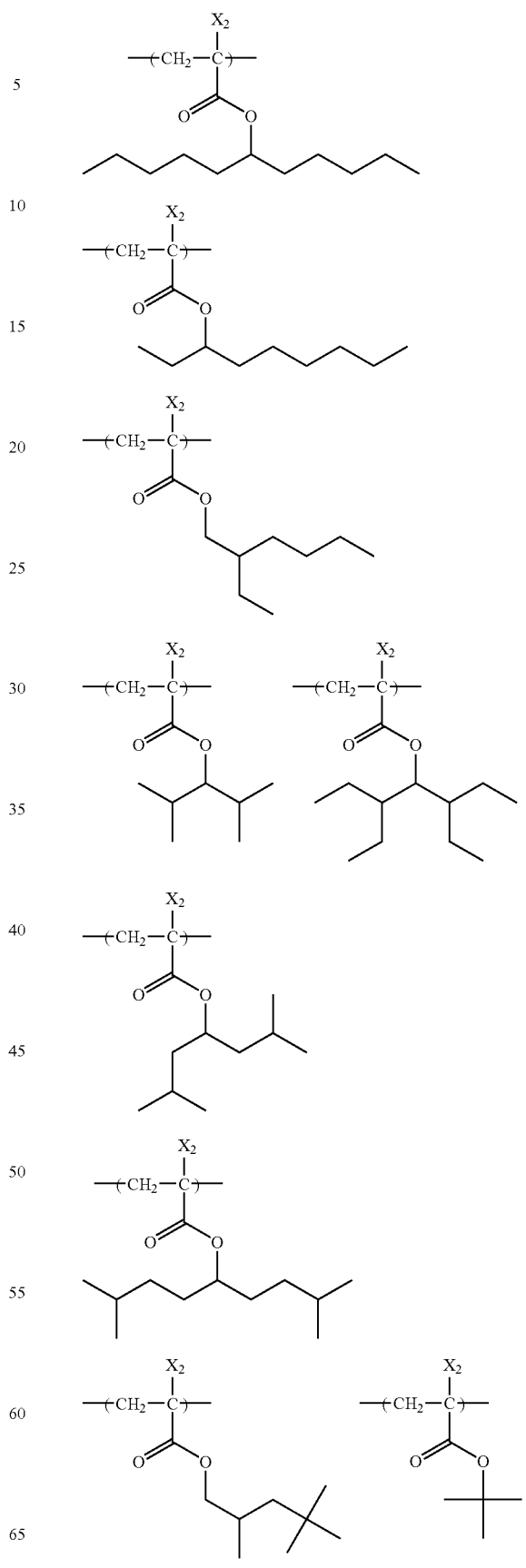

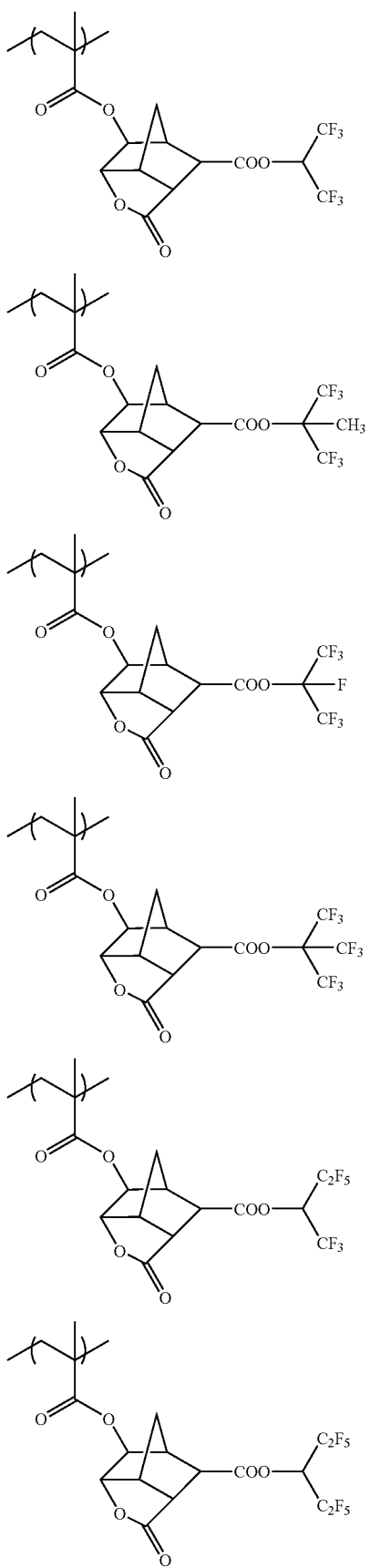
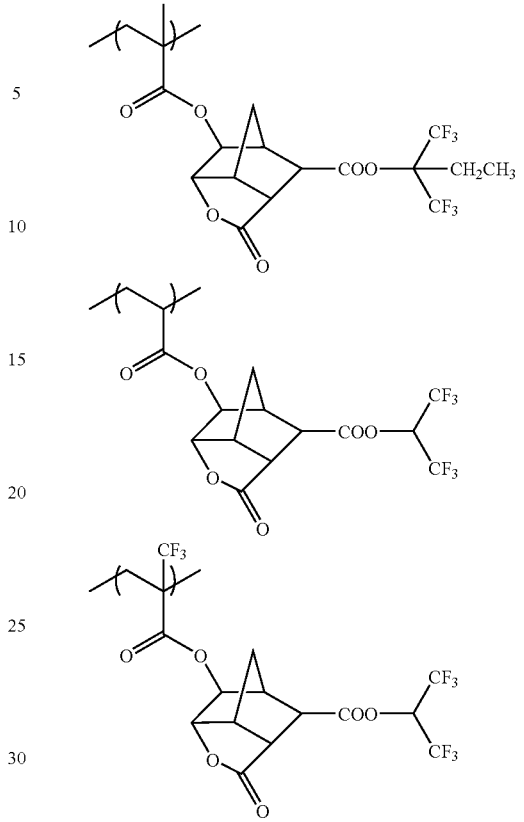
The first polymer is preferably a resin having an alkylsilyl structure (preferably a trialkylsilyl group) or a cyclosiloxane structure as a partial structure having a silicon atom.
As the alkylsilyl structure or cyclosiloxane structure, there can be mentioned, for example, any of the groups of general formulae (CS-1) to (CS-3), below, or the like.
(CS-1)
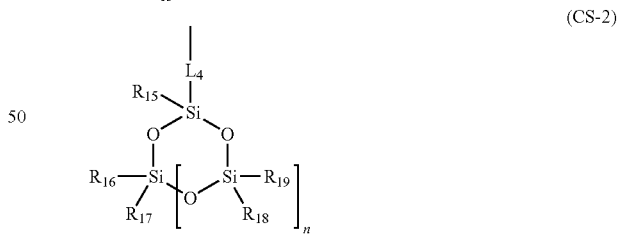
(CS-2)
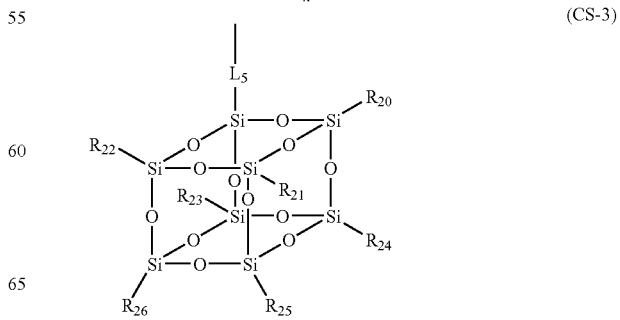
(CS-3)

In general formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a bivalent connecting group. As the bivalent connecting group, there can be mentioned any one or a combination of two or more groups selected from an alkylene group, a phenylene group, an ether group, a thioether group, a carbonyl group, an ester group, an amido group, a urethane group and a urea group.

In the formulae, n is an integer of 1 to 5.

Specific examples of the repeating units having the groups of general formulae (CS-1) to (CS-3) will be shown below, which however in no way limit the scope of the present invention. In the specific examples, $X_1$ represents a hydrogen atom, —$CH_3$, —F or —$CF_3$.

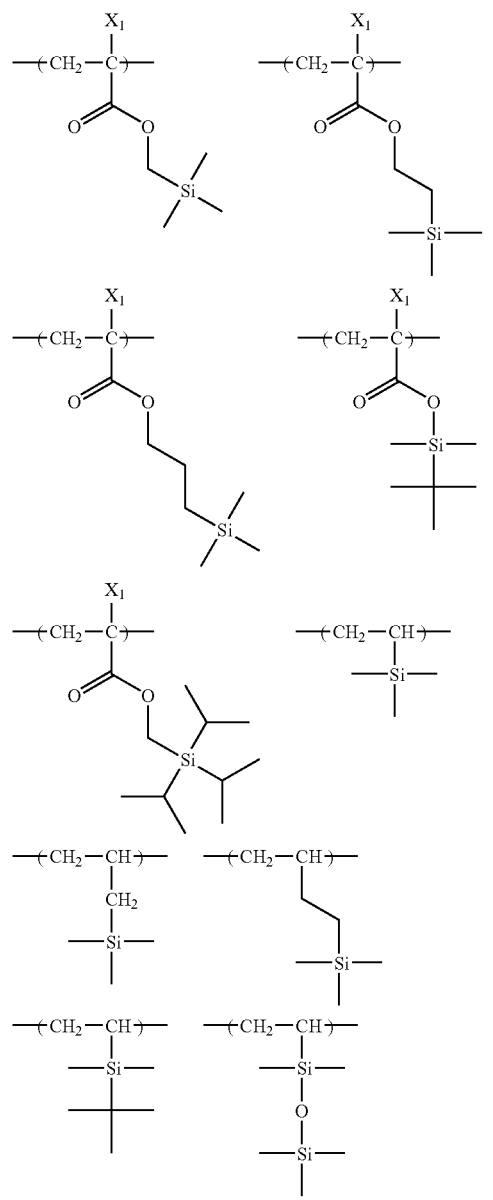

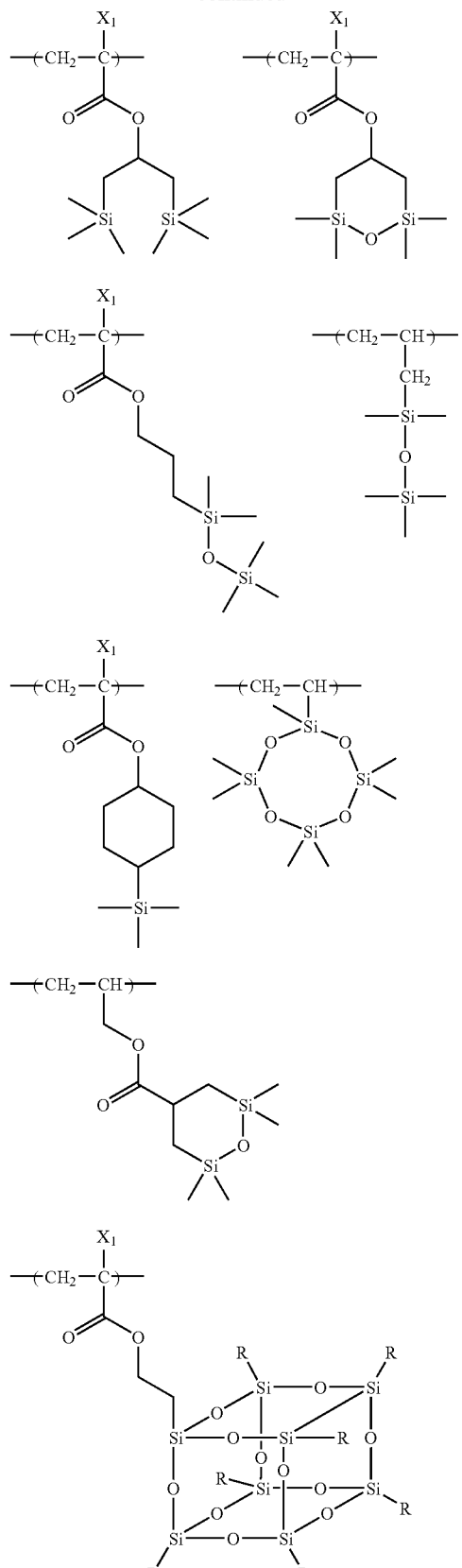

R = $CH_3$, $C_2H_5$, $C_3H_7$, $C_4H_9$

-continued

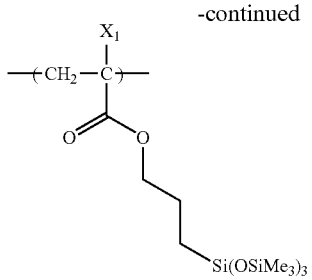

It has been found that when the first polymer contains any of the units of the general formula (F5), a striking enhancement of LWR can be attained by combination with the second polymer having a fluoroalcohol unit.

It is preferred for the second polymer to contain a unit having any of the fluoroalcohol partial structures of general formula FA-1 below.

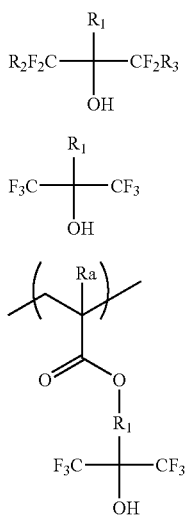

In the general formula FA-1, each of $R_1$, $R_2$ and $R_3$ independently represents a substituent. Any of $R_1$ to $R_3$ is bonded to a polymer. $R_1$, $R_2$ and $R_3$ may be bonded to each other to thereby form a ring. Each of $R_2$ and $R_3$ preferably represents F or a fluoroalkyl group having 1 to 4 carbon atoms.

As a preferred form of the fluoroalcohol partial structure of the general formula FA-1, there can be mentioned general formula FA-2 above. In the general formula FA-2, $R_1$ represents a substituent.

Further, as a preferred form of the unit having any of the fluoroalcohol partial structures of the general formula FA-1, there can be mentioned general formula FA-3 above. In the general formula FA-3, Ra represents a hydrogen atom, an optionally substituted alkyl group having 1 to 4 carbon atoms, a fluorine atom or a cyano group.

The content of units having a fluoroalcohol partial structure in the second polymer is preferably in the range of 3 to 30 mol %, more preferably 5 to 25 mol %.

Further, as preferred forms of the structures of the second polymer (inferior-portion polymer), there can be mentioned polymers having an N, Si or Ti atom. Especially preferably, an N-atom-containing heterocyclic group or the like can be mentioned as an N-atom-containing unit, Si(OR)n or the like as an Si-atom-containing unit and Ti(OR)n or the like as a Ti-atom-containing unit. In the formulae, R represents an alkyl group, an aryl group or an acyl group.

The content of repeating units containing these units based on all the repeating units contained in the second polymer is preferably in the range of 5 to 30 mol %, more preferably 5 to 20 mol % and most preferably 5 to 10 mol %. This range is preferred from the viewpoint of not only the designing of a gradient distribution (free from any phase separation and homogeneous compatibilization in the direction of the depth) but also the simultaneous satisfaction of developability and development defect (re-adhesion of scum after development).

Preferred specific examples of the N-atom-containing units, Si-atom-containing units and Ti-atom-containing will be shown below.

As a preferred example of the N-atom-containing units, in particular, there can be mentioned a monovalent group (substituted heterocyclic group) as formed by bonding the substituent of the above-mentioned substituted alkyl groups to a monovalent group resulting from removal of one hydrogen atom on a heterocycle or a group resulting from further removal of one hydrogen atom from the monovalent group. Preferred examples of the heterocycles are as follows.

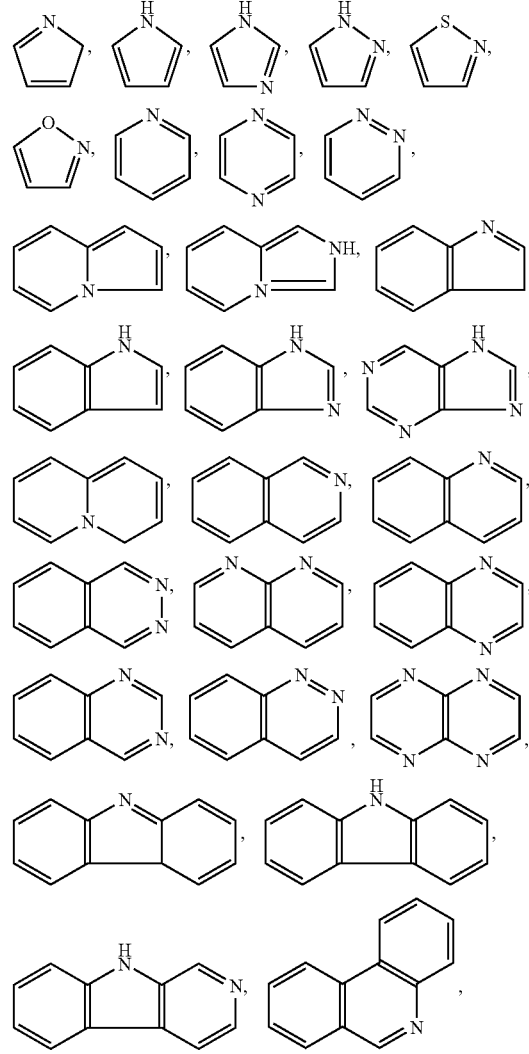

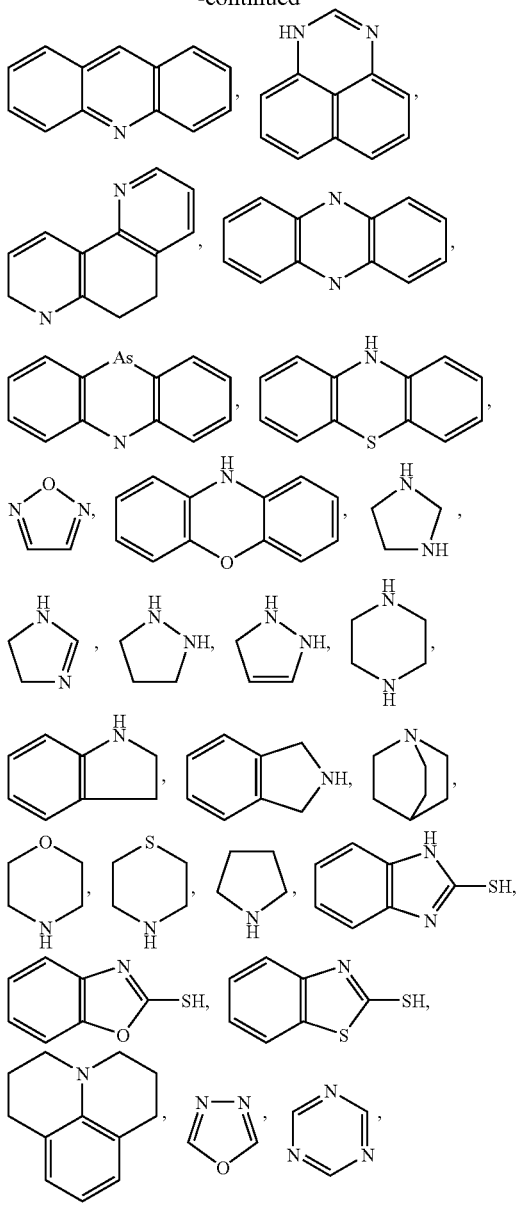

As preferred examples of the Si-atom-containing units and Ti-atom-containing units, there can be mentioned, in particular, those formed by removing one hydrogen from any of the structures of general formula (3), below, to thereby obtain a terminal functional group and linking the same to the principal chain or an end of the inferior-portion polymer.

In general formula (3), $R^{14}$ represents a hydrogen atom, an alkyl group or an aryl group. $R^{15}$ represents an alkyl group, an aryl group or an acyl group. X represents Si or Ti, and n is an integer of 0 to 2.

When $R^{14}$ or $R^{15}$ represents an alkyl group, the number of carbon atoms thereof is preferably in the range of 1 to 6. The alkyl group or aryl group may have a substituent. As the substituent that can be introduced therein, there can be mentioned a halogen atom, an amino group, a mercapto group or the like.

Specific examples of the structures of general formula (3) will be set forth below, which however in no way limit the scope of the present invention.

When X is Si, there can be mentioned, for example, trimethoxysilane, triethoxysilane, tripropoxysilane, tetramethoxysilane, tetraethoxysilane, tetrapropoxysilane, methyltrimethoxysilane, ethyltrimethoxysilane, propyltrimethoxysilane, methyltriethoxysilane, ethyltriethoxysilane, propyltriethoxysilane, dimethyldimethoxysilane, diethyldiethoxysilane, γ-chloropropyltriethoxysilane, γ-mercaptopropyltrimethoxysilane, γ-mercaptopropyltriethoxysilane, γ-aminopropyltriethoxysilane, phenyltrimethoxysilane, phenyltriethoxysilane, phenyltripropoxysilane, diphenyldimethoxysilane, diphenyldiethoxysilane and the like.

As especially preferred examples among these, there can be mentioned tetramethoxysilane, tetraethoxysilane, methyltrimethoxysilane, ethyltrimethoxysilane, methyltriethoxysilane, ethyltriethoxysilane, dimethyldimethoxysilane, diethyldiethoxysilane, phenyltrimethoxysilane, phenyltriethoxysilane, diphenyldimethoxysilane, diphenyldiethoxysilane and the like.

When X is Ti, there can be mentioned, for example, trimethoxytitanate, tetramethoxytitanate, triethoxytitanate, tetraethoxytitanate, tetrapropoxytitanate, chlorotrimethoxytitanate, chlorotriethoxytitanate, ethyltrimethoxytitanate, methyltriethoxytitanate, ethyltriethoxytitanate, diethyldiethoxytitanate, phenyltrimethoxytitanate, phenyltriethoxytitanate and the like.

Specific examples of the preferred N-atom-containing, Si-atom-containing and Ti-atom-containing repeating units as constituents of the second polymer will be shown below.

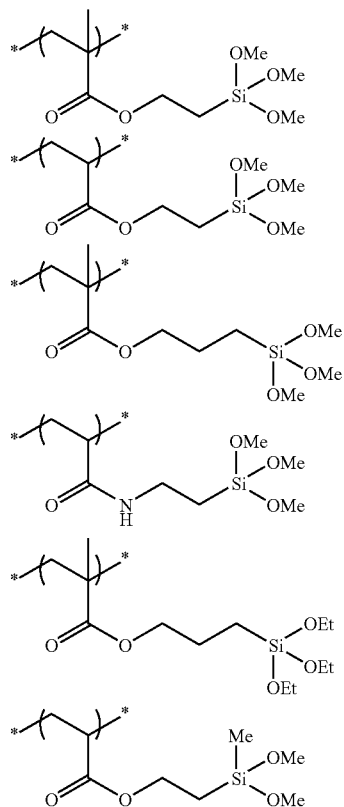

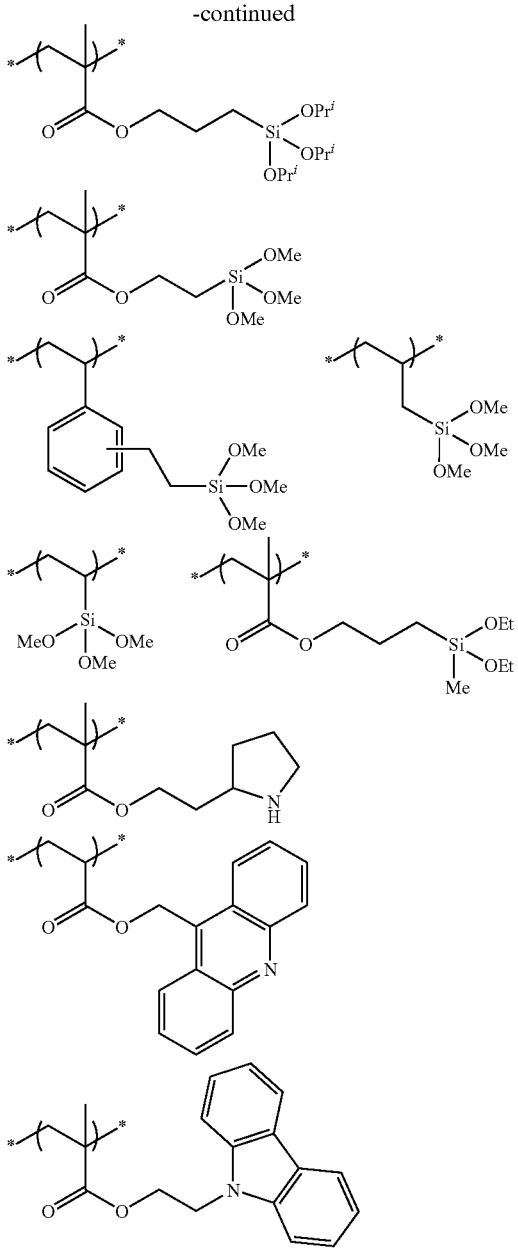

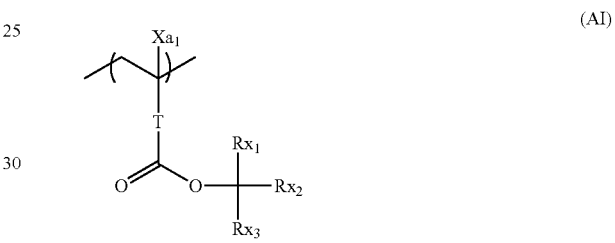

Polymers (hereinafter referred to as "the resin (A) polymers" or "the polymers") that comprise a first polymer and a second polymer contained in the resin (A) may have, in its principal chain or side chain, or both of its principal chain and side chain, a group (hereinafter also referred to as "an acid-decomposable group") that is decomposed by the action of an acid to thereby generate an alkali soluble group.

As the alkali soluble group, there can be mentioned a phenolic hydroxyl group, a carboxyl group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis (alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris (alkylsulfonyl)methylene group or the like.

The alkali-soluble group is preferably an acid group whose acid dissociation constant pKa is 11 or below. In the present invention, the acid dissociation constant is calculated by means of the analytical software ACD/pKa DBV8.0 produced by advanced chemistry development (ACD).

As preferred alkali soluble groups, there can be mentioned a carboxyl group, a fluoroalcohol group (preferably hexafluoroisopropanol) and a sulfonate group.

The acid-decomposable group is preferably a group as obtained by substituting the hydrogen atom of any of these alkali soluble groups with an acid eliminable group.

As the acid eliminable group, there can be mentioned, for example, $-C(R_{36})(R_{37})(R_{38})$, $-C(R_{36})(R_{37})(OR_{39})$, $-C(R_{01})(R_{02})(OR_{39})$ or the like.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded with each other to thereby form a ring structure.

Each of $R_{01}$ to $R_{02}$ independently represents a hydrogen atom, an alkyl group, a cycloalkyl group, an aryl group, an aralkyl group or an alkenyl group.

Preferably, the acid-decomposable group is a cumyl ester group, an enol ester group, an acetal ester group, a tertiary alkyl ester group or the like. A tertiary alkyl ester group is more preferred.

The repeating unit with an acid-decomposable group that may be contained in the resin (A) polymers is preferably any of those of the following general formula (AI).

(AI)

In the general formula (AI), $Xa_1$ represents a hydrogen atom, a methyl group, a trifluoromethyl group or a hydroxymethyl group.

T represents a single bond or a bivalent connecting group.

Each of $Rx_1$ to $Rx_3$ independently represents an alkyl group (linear or branched) or a cycloalkyl group (monocyclic or polycyclic).

At least two of $Rx_1$ to $Rx_3$ may be bonded with each other to thereby form a cycloalkyl group (monocyclic or polycyclic).

As the bivalent connecting group represented by T, there can be mentioned an alkylene group, a group of the formula —COO-Rt-, a group of the formula —O-Rt- or the like. In the formulae, Rt represents an alkylene group or a cycloalkylene group.

T is preferably a single bond or a group of the formula —COO-Rt-. Rt is preferably an alkylene group having 1 to 5 carbon atoms, more preferably a —$CH_2$— group or —$(CH_2)_3$— group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group.

The cycloalkyl group formed by bonding of at least two of $Rx_1$ to $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group.

In a preferred mode, $Rx_1$ is a methyl group or an ethyl group, and $Rx_2$ and $Rx_3$ are bonded with each other to thereby form any of the above-mentioned cycloalkyl groups.

Each of the resin (A) polymers preferably contains two or more types of repeating units having acid-decomposable groups. In the repeating units, it is preferred for at least one thereof to be a repeating unit having a 5- or 6-membered monocyclic hydrocarbon protective group or a polycyclic hydrocarbon protective group containing a 5- or 6-membered cyclic structure.

The content of repeating unit having an acid-decomposable group (total content when two or more types of repeating units are contained) based on all the repeating units of the resin (A) polymers is preferably in the range of 20 to 70 mol %, more preferably 30 to 50 mol %.

Specific examples of the preferred repeating units having acid-decomposable groups will be shown below, which however in no way limit the scope of the present invention.

In the formulae below, Rx represents a hydrogen atom, $CH_3$, $CF_3$ or $CH_2OH$. Each of Rxa and Rxb represents an alkyl group having 1 to 4 carbon atoms. Z represents a substituent containing a polar group. As the substituent containing a polar group, there can be mentioned a linear or branched alkyl group or cycloalkyl group having a hydroxyl, cyano, amino, alkylamido or sulfonamido group. Of these, an alkyl group having a hydroxyl group is especially preferred. p represents 0 or a positive integer.

1
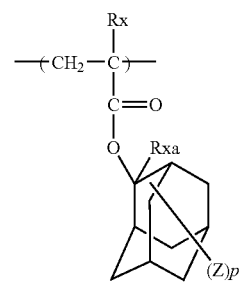

2
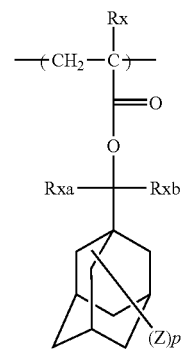

3
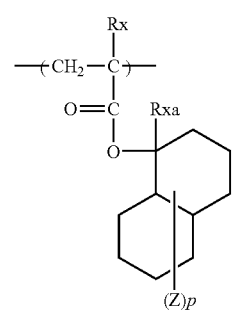

4
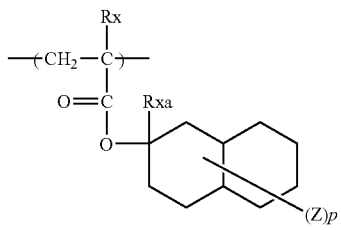

5
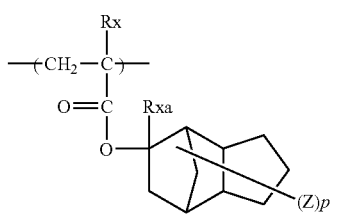

6
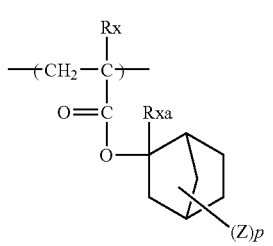

7
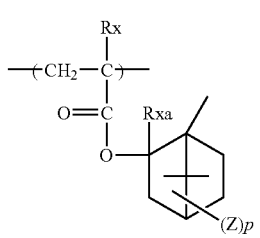

8
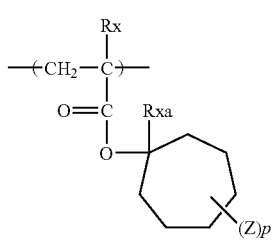

9
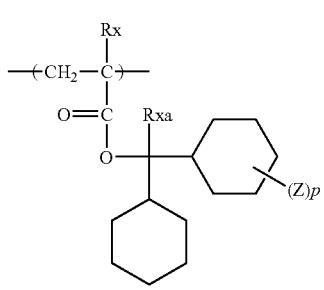

10
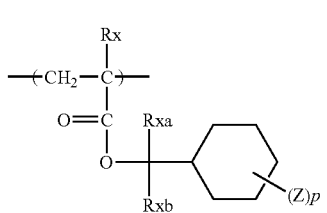

11
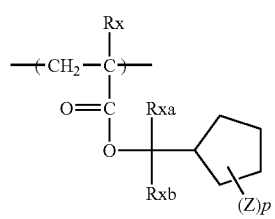
12
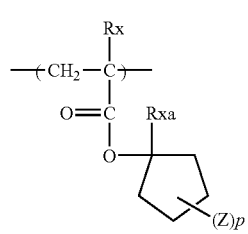
13
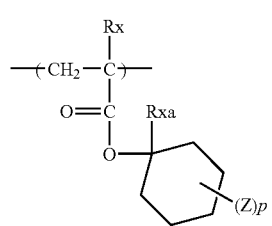
14
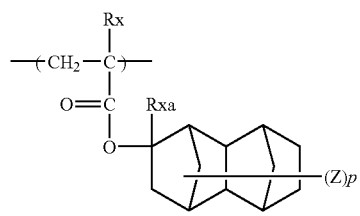
15
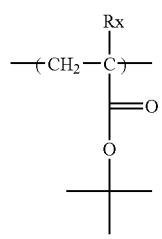
16
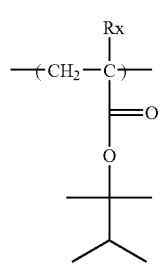
17
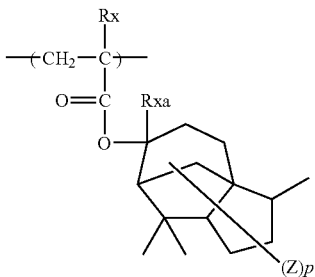
18
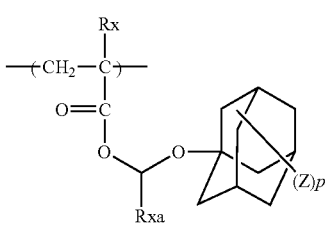
19
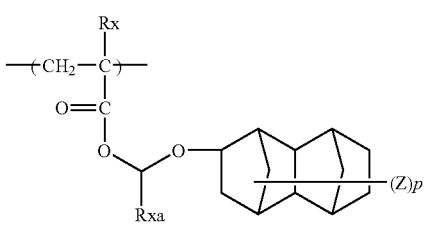
20
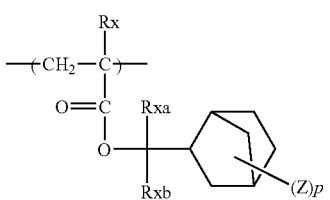
21
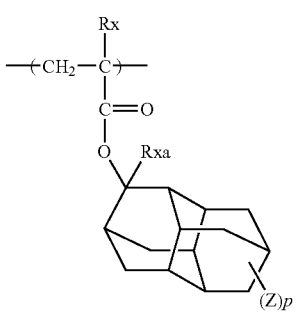
22
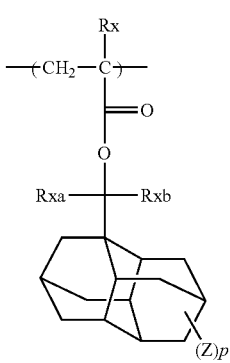

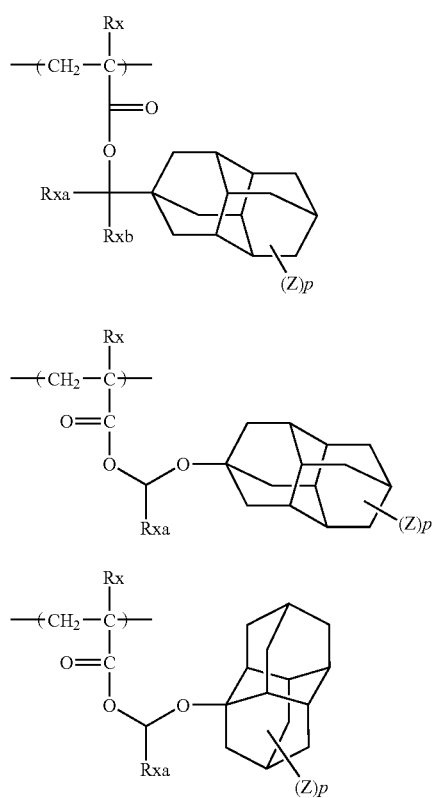
In the following formulae, Xa$_1$ has the same meaning as Rx of the above formulae, and Z and p have the same meaning as those of the above formulae.
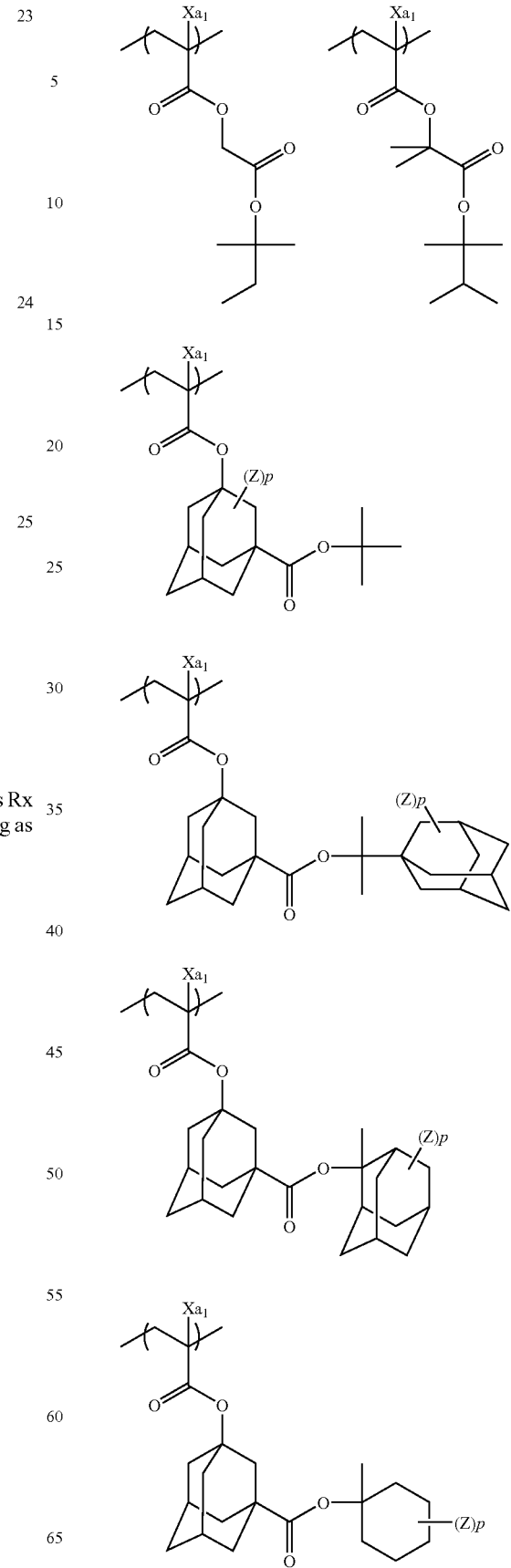

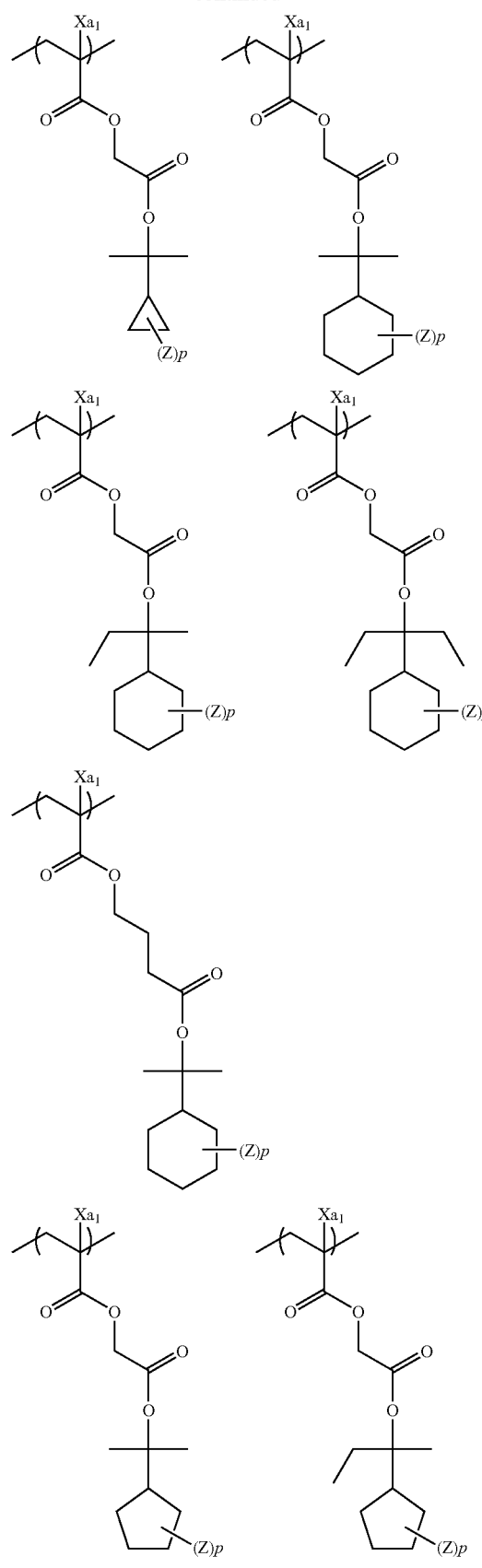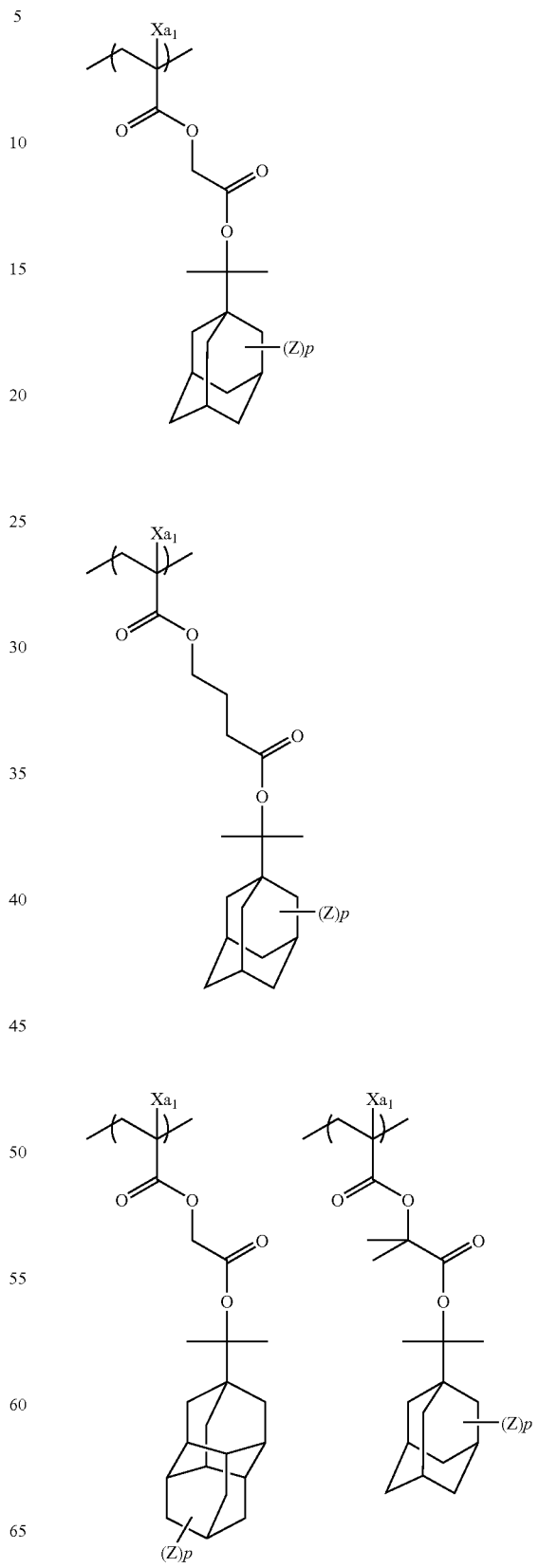

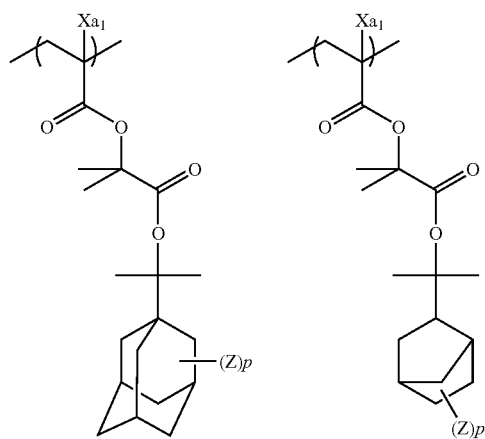
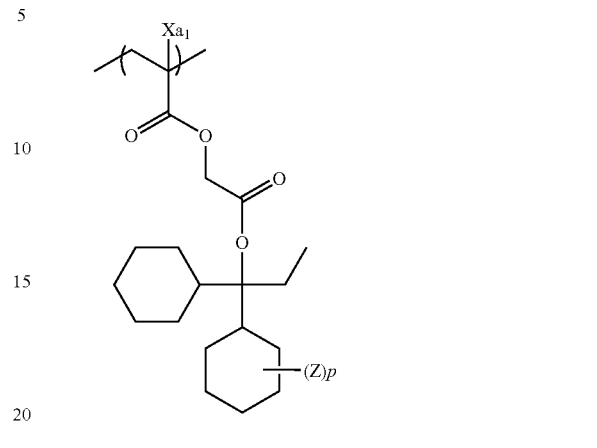
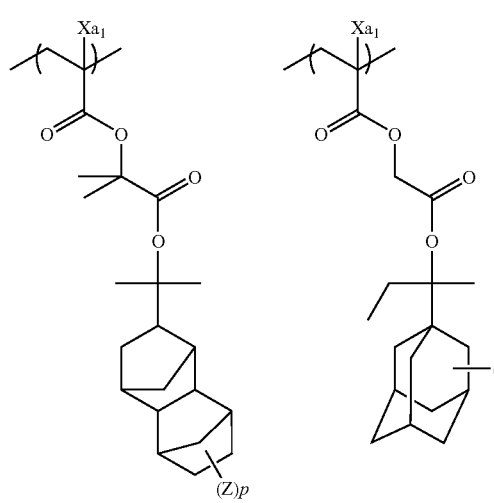
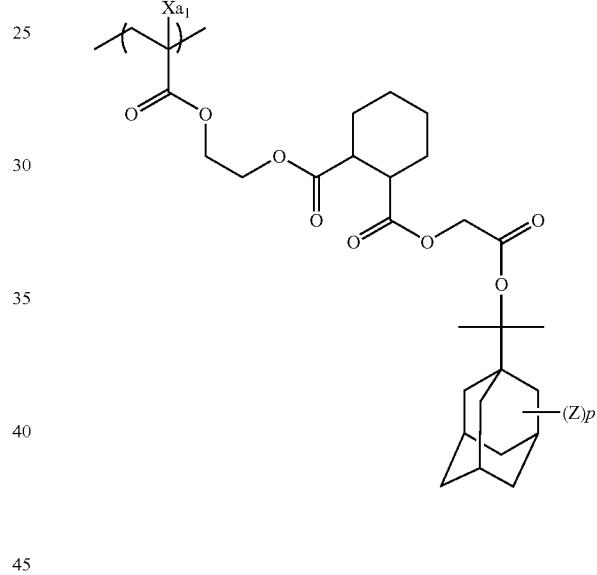
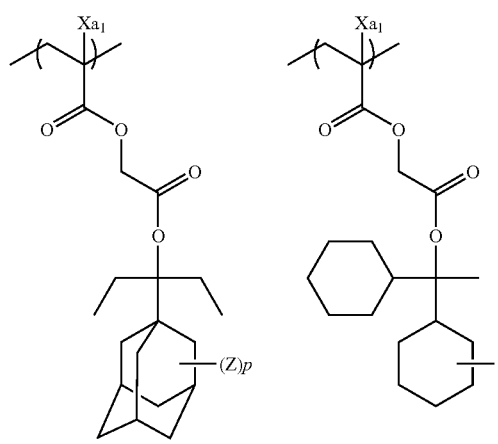
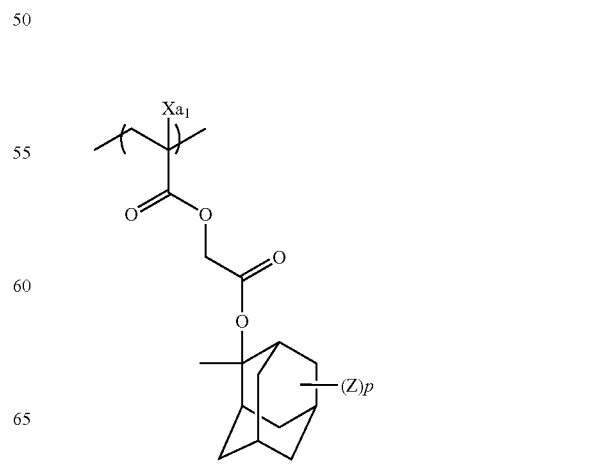

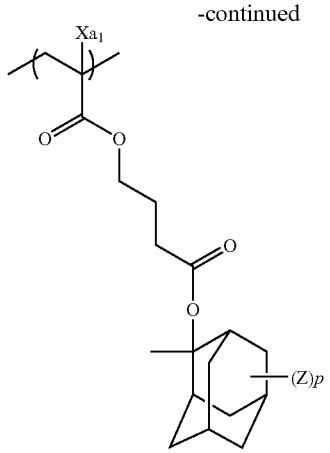
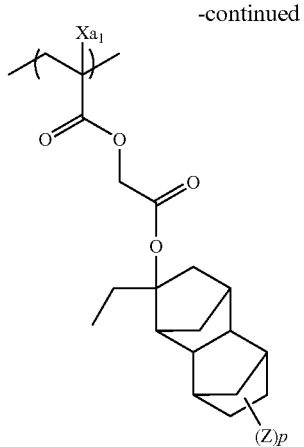
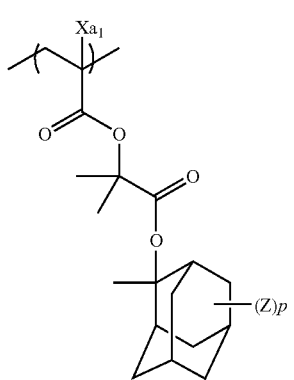
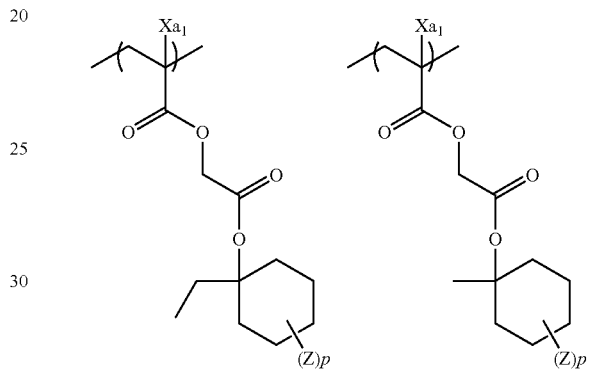
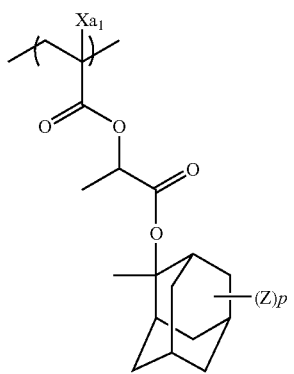
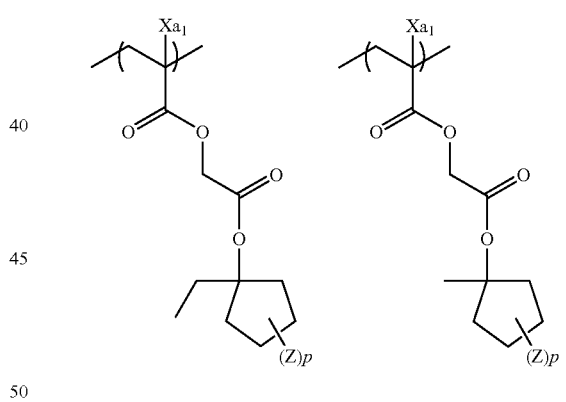
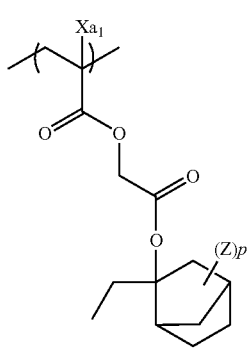
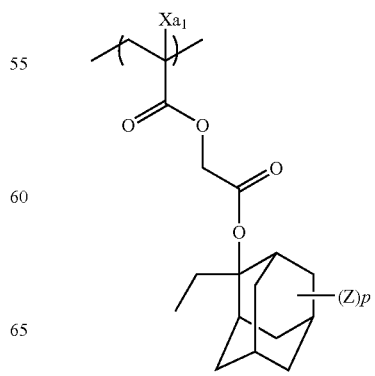

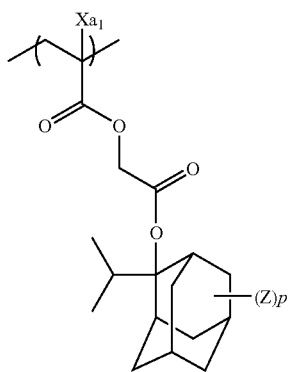
Preferred combinations of the repeating units with acid-decomposable groups are shown below. In the formulae, R represents a hydrogen atom or $CH_3$.
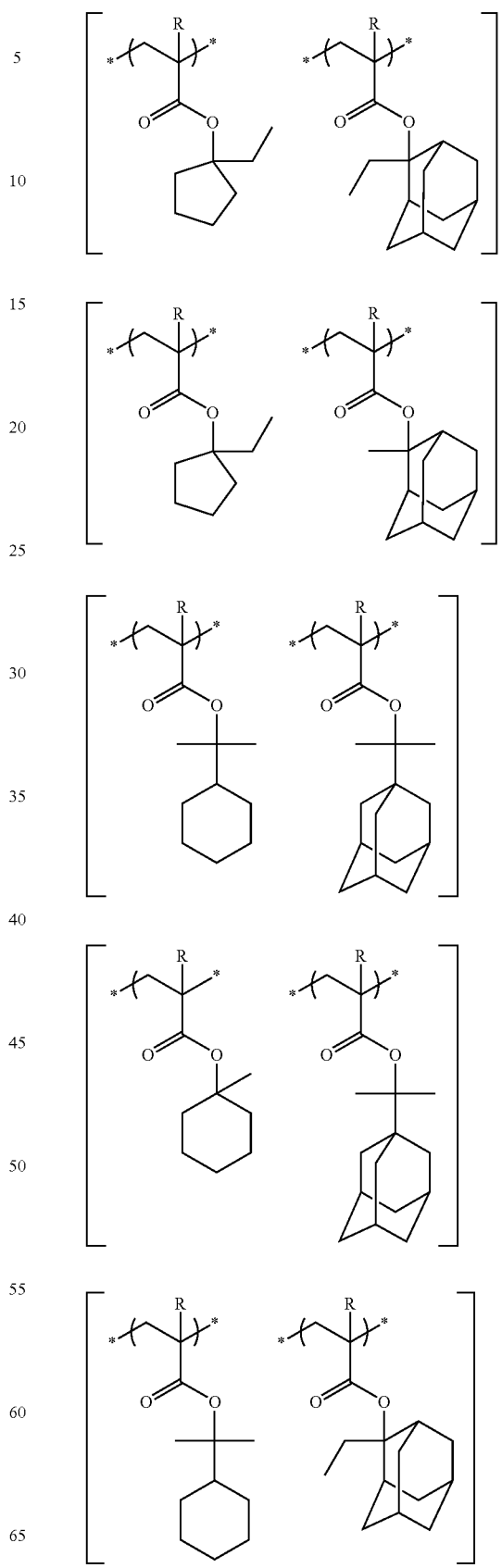

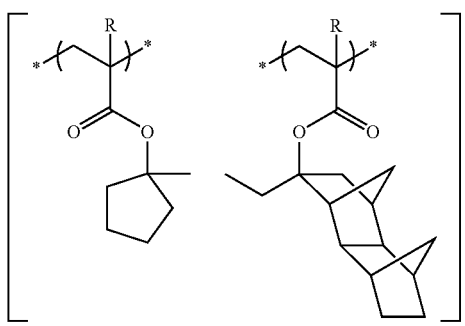

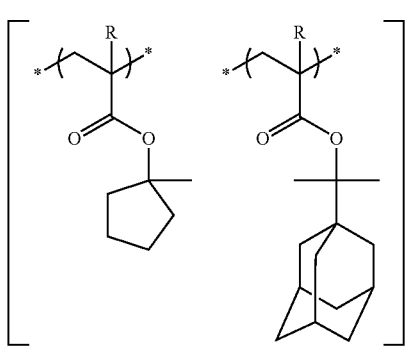

Each of the resin (A) polymers may contain, in the principal chain or a side chain, or both the principal chain and a side chain thereof, a repeating unit having a group from which an alkali-soluble group is generated by alkali hydrolysis.

The alkali-soluble group generated by alkali hydrolysis is as mentioned hereinbefore. As such a repeating unit, there can be mentioned, for example, a repeating unit having a group selected from a lactone group, a primary carboxylic ester group and a carbonic ester group. A repeating unit having a lactone group is especially preferred.

The repeating unit having a lactone group will be described below.

Any lactone groups can be employed as long as a lactone structure is possessed therein. However, lactone structures of a 5 to 7-membered ring are preferred, and in particular, those resulting from condensation of lactone structures of a 5 to 7-membered ring with other cyclic structures effected in a fashion to form a bicyclo structure or spiro structure are preferred. The possession of repeating units having a lactone structure represented by any of the following general formulae (LC1-1) to (LC1-17) is more preferred. The lactone structures may be directly bonded to the principal chain of the resin. Preferred lactone structures are those of the formulae (LC1-1), (LC1-4), (LC1-5), (LC1-6), (LC1-13), (LC1-14) and (LC1-17). The use of these specified lactone structures would ensure improvement in the line edge roughness and development defect.

LC1-1

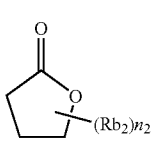

LC1-2

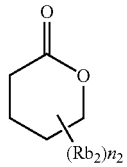

LC1-3

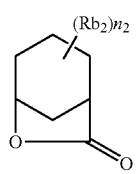

LC1-4

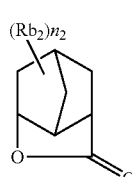

LC1-5

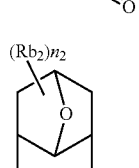

LC1-6

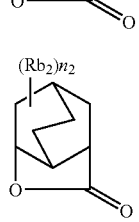

LC1-7

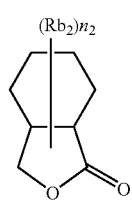

LC1-8

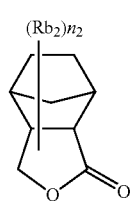

LC1-9

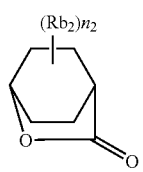

LC1-10

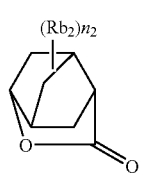

LC1-11

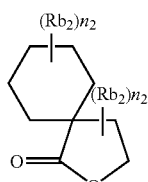

LC1-12

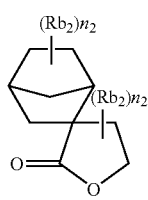

LC1-13

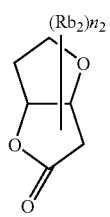

LC1-14

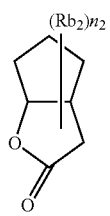

LC1-15

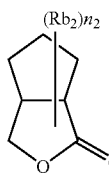

LC1-16

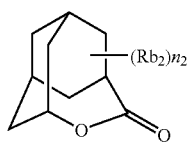

LC1-17

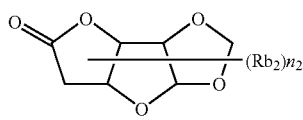

The presence of a substituent ($Rb_2$) on the portion of the lactone structure is optional. As a preferred substituent ($Rb_2$), there can be mentioned an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group or the like. Of these, an alkyl group having 1 to 4 carbon atoms, a cyano group and an acid-decomposable group are more preferred. In the formulae, $n_2$ is an integer of 0 to 4. When $n_2$ is 2 or greater, the plurality of present substituents ($Rb_2$) may be identical to or different from each other. Further, the plurality of present substituents ($Rb_2$) may be bonded with each other to thereby form a ring.

As the repeating units with a lactone structure represented by any of the general formulae (LC1-1) to (LC1-17), there can be mentioned the repeating units represented by the following general formula (AII).

(AII)

In the general formula (AII), $Rb_0$ represents a hydrogen atom, a halogen atom or an alkyl group having 1 to 4 carbon atoms. As a preferred substituent optionally contained in the alkyl group represented by $Rb_0$, there can be mentioned a hydroxyl group or a halogen atom. As the halogen atom represented by $Rb_0$, there can be mentioned a fluorine atom, a chlorine atom, a bromine atom or an iodine atom. The $Rb_0$ is preferably a hydrogen atom, a methyl group, a hydroxymethyl group or a trifluoromethyl group. A hydrogen atom and a methyl group are especially preferred.

Ab represents a single bond, an alkylene group, a bivalent connecting group with an alicyclic hydrocarbon structure of a single ring or multiple rings, an ether group, an ester group, a carbonyl group, or a bivalent connecting group resulting from combination thereof. A single bond and a bivalent connecting group of the formula -$Ab_1$-$CO_2$— are preferred.

$Ab_1$ is a linear or branched alkylene group or a cycloalkylene group of a single ring or multiple rings, being preferably a methylene group, an ethylene group, a cyclohexylene group, an adamantylene group or a norbornylene group.

V represents a group with a structure represented by any of the general formulae (LC1-1) to (LC1-17).

Examples of the repeating units having a lactone group will now be shown, which however in no way limit the scope of the present invention.

In the formulae, Rx represents H, $CH_3$, $CH_2OH$ or $CF_3$.

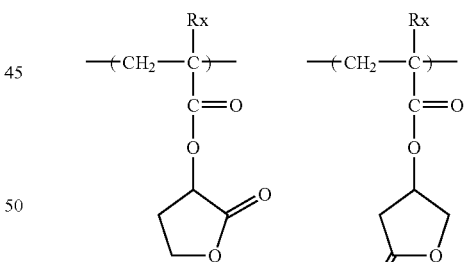

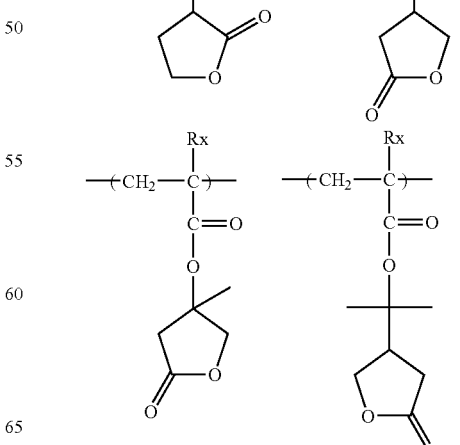

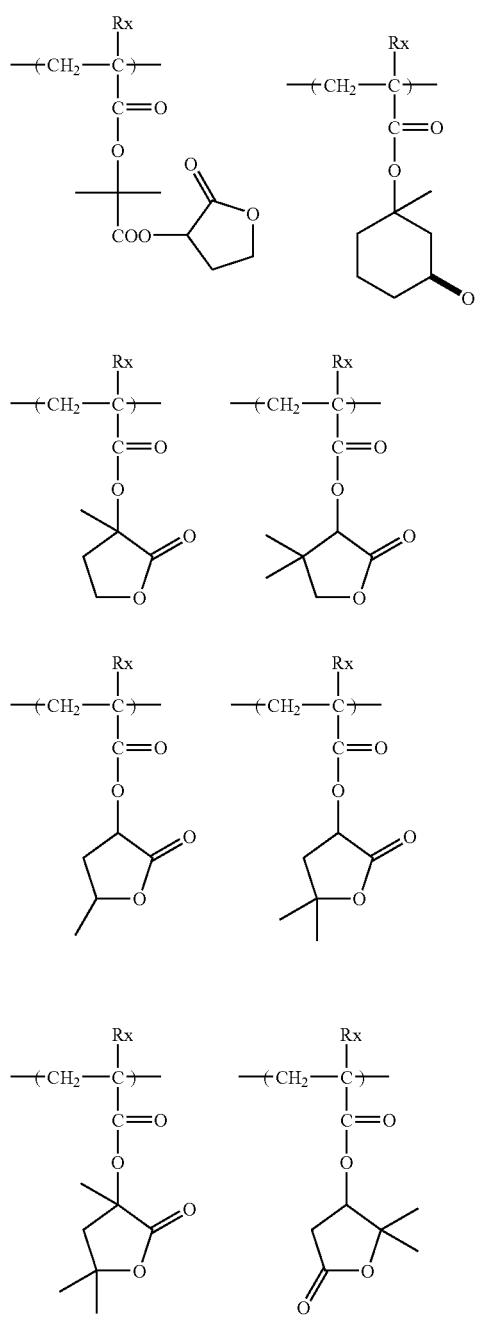
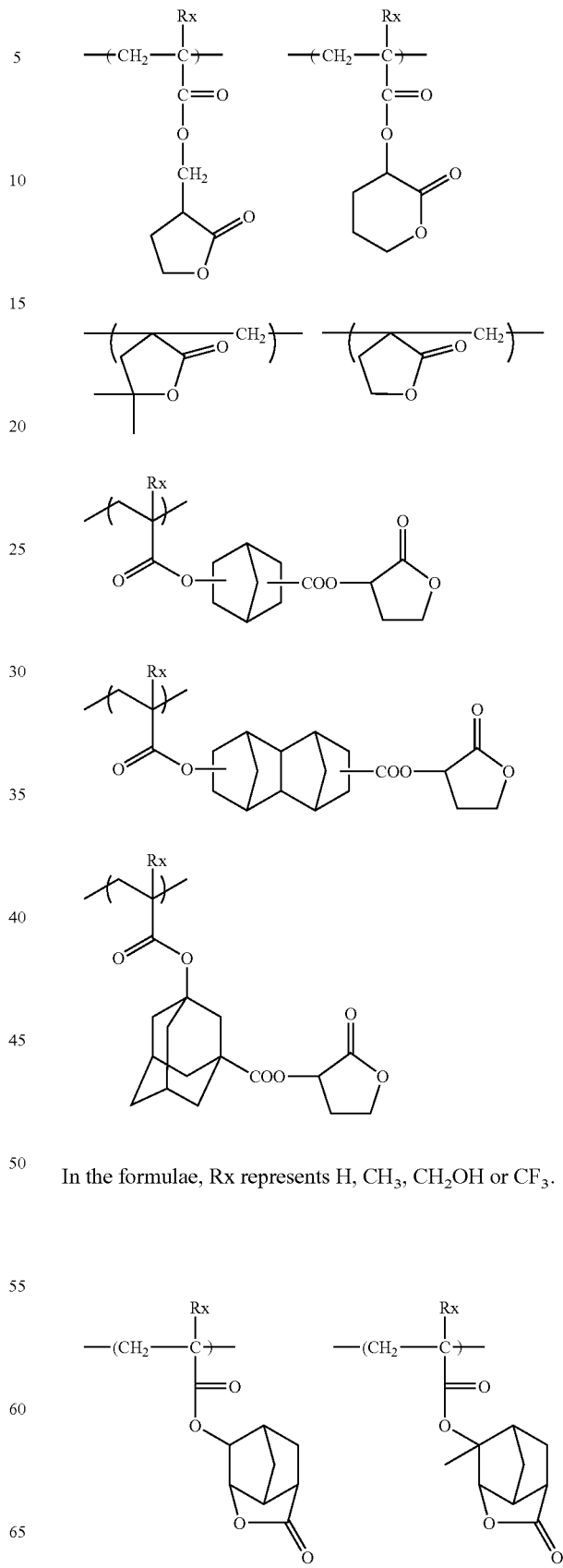
In the formulae, Rx represents H, CH$_3$, CH$_2$OH or CF$_3$.

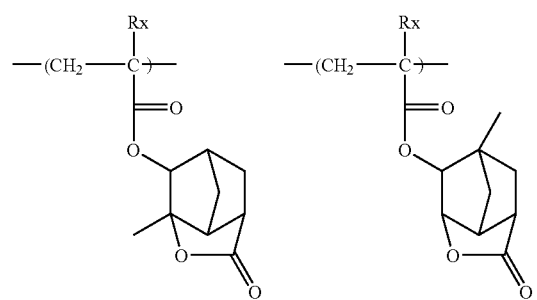
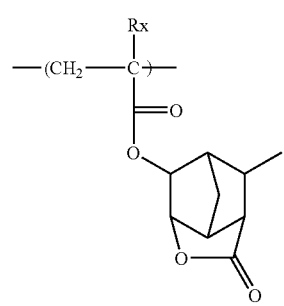
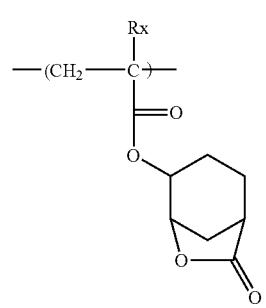
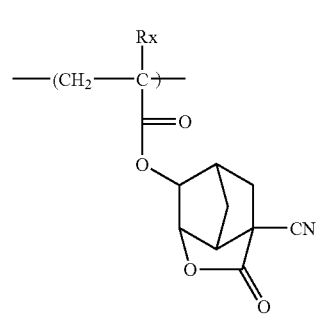
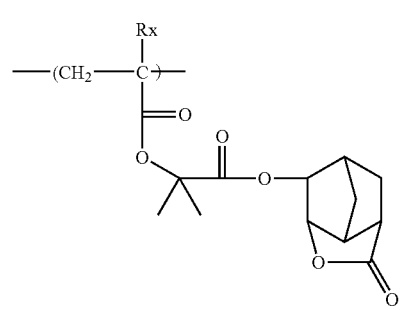
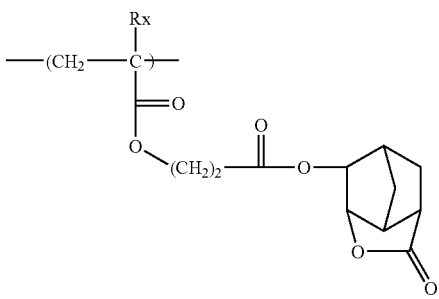
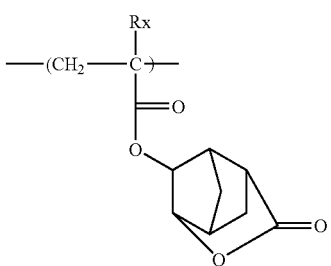
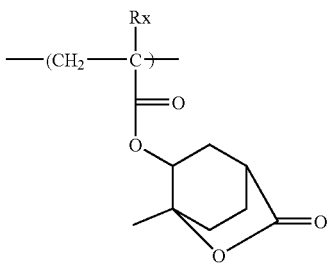
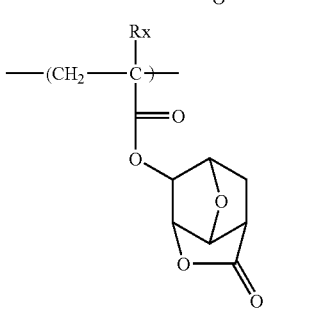
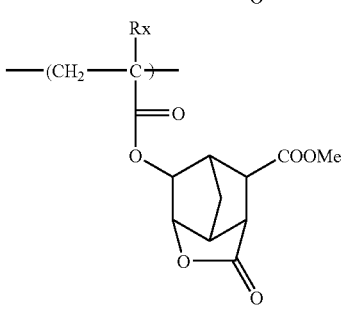
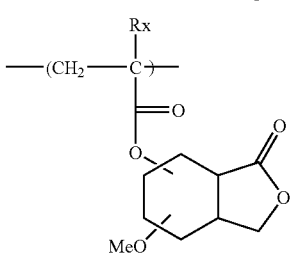

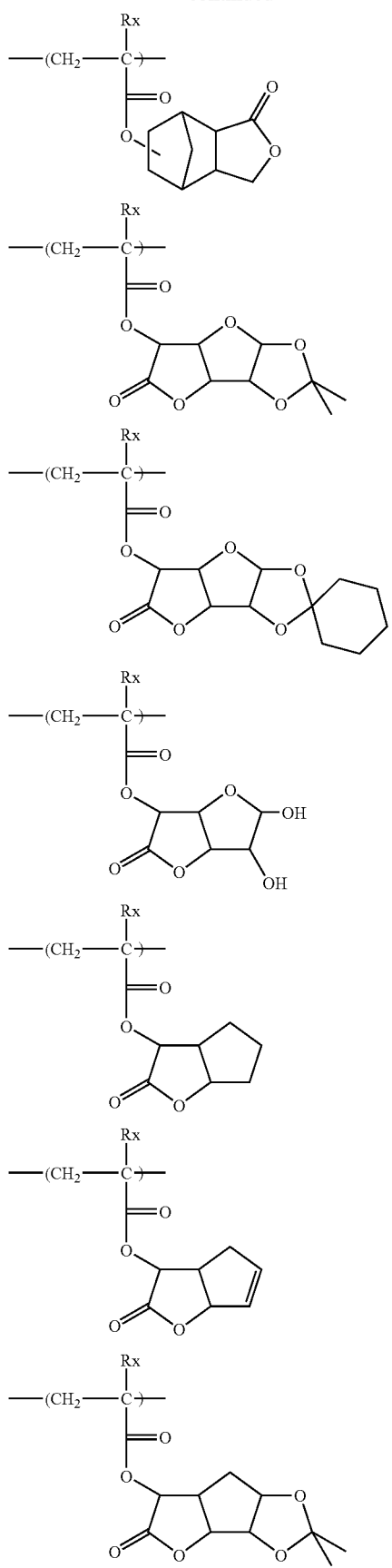
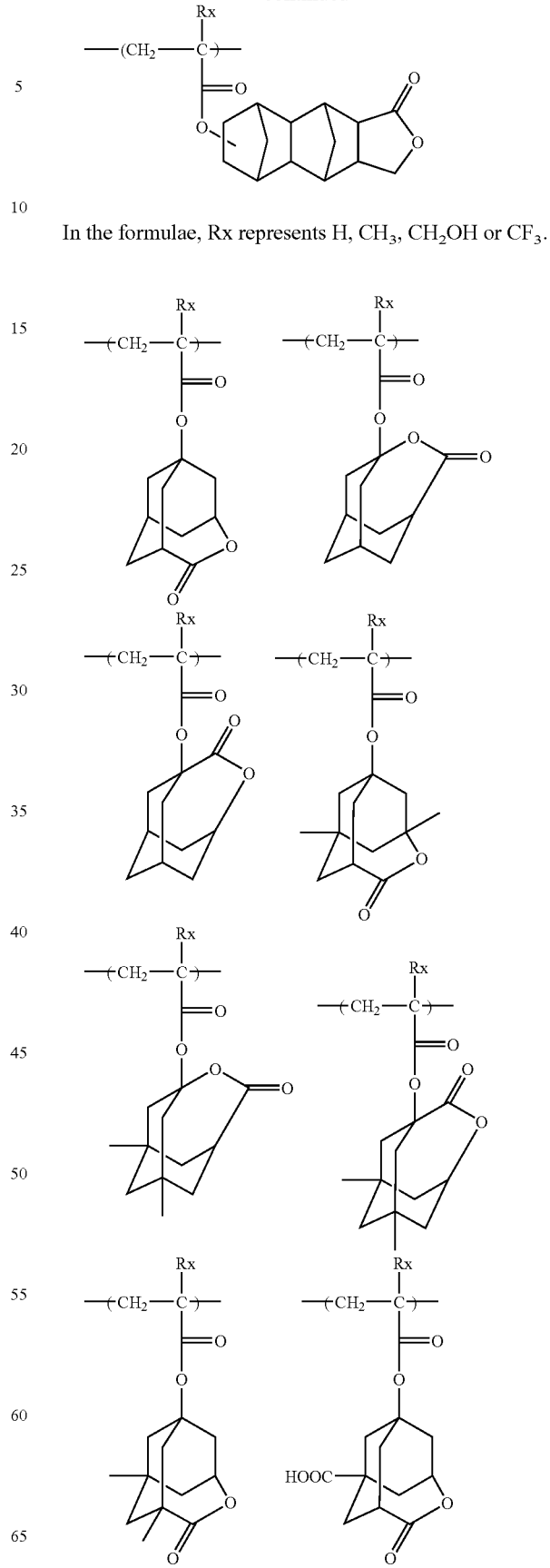
In the formulae, Rx represents H, CH$_3$, CH$_2$OH or CF$_3$.

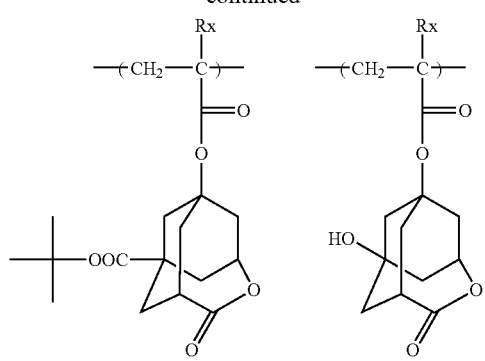
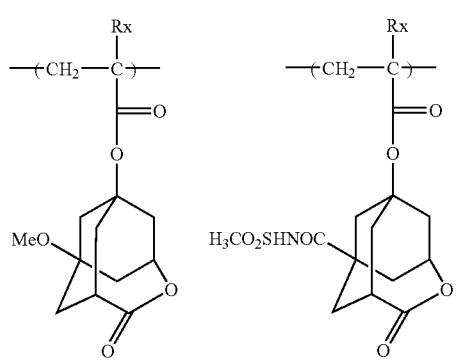
The especially preferred repeating units having a lactone group will be shown below. An improvement in pattern profile and optical density dependence can be attained by selection of the most appropriate lactone group.
In the formulae, Rx represents H, CH$_3$, CH$_2$OH or CF$_3$.
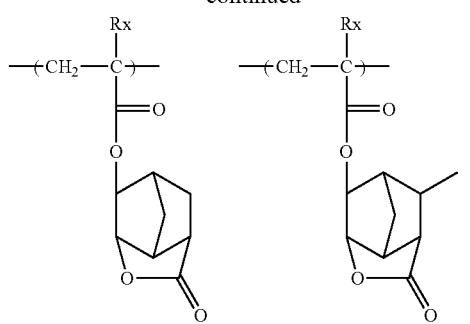
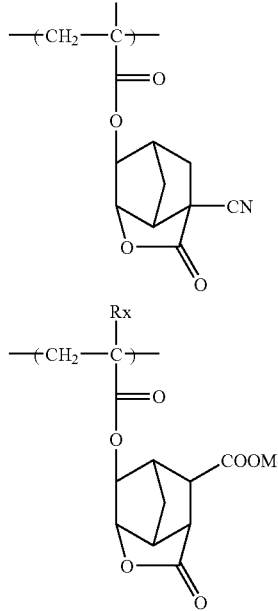
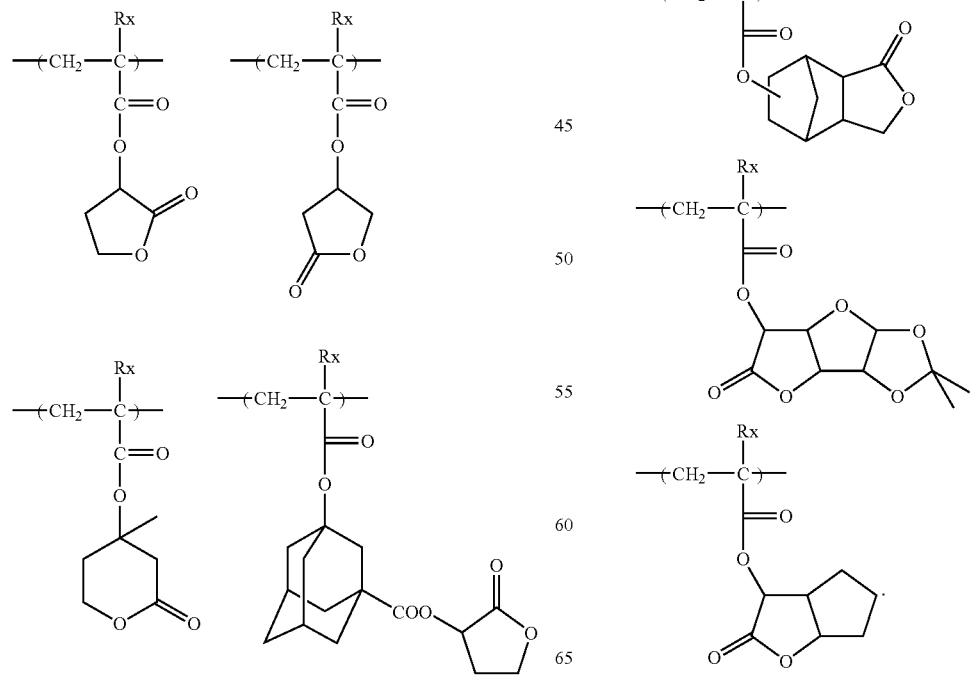

It is preferred for the resin (A) polymers to contain any of the repeating units having a lactone group represented by the following general formula (1).

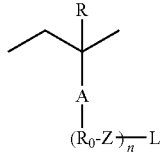
(1)

In the general formula (1),

R represents a hydrogen atom or an optionally substituted alkyl group.

A represents:

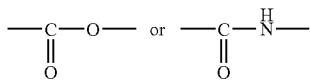

$R_0$, each independently in the presence of two or more groups, represents an optionally substituted alkylene group, an optionally substituted cycloalkylene group or a combination thereof.

Z, each independently in the presence of two or more groups, represents an ether bond, an ester bond, an amido bond, a urethane bond or a urea bond. An ether bond and an ester bond are preferred, and an ester bond is especially preferred.

L represents a substituent with a lactone structure, and n represents the number of repetitions and is an integer of 1 to 5.

A further detailed description will be made with respect to the general formula (1).

The alkyl group represented by R is preferably an alkyl group having 1 to 4 carbon atoms, more preferably a methyl group or an ethyl group and most preferably a methyl group. As substituents on R, there can be mentioned, for example, a halogen atom such as a fluorine atom, a chlorine atom or a bromine atom, a mercapto group, a hydroxyl group, an alkoxy group such as a methoxy group, an ethoxy group, an isopropoxy group, a t-butoxy group or a benzyloxy group, and an acetoxy group such as an acetyl group or a propionyl group.

The group represented by $R_0$ is not particularly limited as long as it is a chain alkylene group or a cycloalkylene group. The chain alkylene group is preferably a chain alkylene group having 1 to 10 carbon atoms, more preferably 1 to 5 carbon atoms, for example, a methylene group, an ethylene group, a propylene group or the like. The cycloalkylene group is preferably a cycloalkylene group having 1 to 20 carbon atoms. As such, there can be mentioned, for example, cyclohexylene, cyclopentylene, norbornylene, adamantylene or the like. The chain alkylene groups are preferred from the viewpoint of the exertion of the effect of the present invention.

The substituent with a lactone structure represented by L is the same as the above-mentioned lactone group and is not limited as long as the lactone structure is contained. As particular examples thereof, there can be mentioned the lactone structures of the general formulae (LC1-1) to (LC1-16).

As especially preferred lactone repeating units, there can be mentioned the repeating units of the following general formula (1-1).

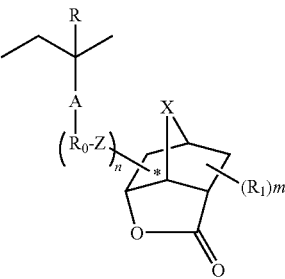
(1-1)

In the general formula (1-1),

R, A, $R_0$, Z and n are as defined above with respect to the general formula (1).

$R_1$, each independently in the presence of two or more groups, represents an optionally substituted alkyl group, an optionally substituted cycloalkyl group, an optionally substituted ester group, a cyano group, a hydroxyl group or an alkoxy group. In the presence of two or more groups, two $R_1$s may be bonded with each other to thereby form a ring.

X represents an alkylene group, an oxygen atom or a sulfur atom, and m is the number of substituents and is an integer of 0 to 5. m is preferably 0 or 1.

A further detailed description will be made with respect to the general formula (1-1).

The preferred examples of the groups represented by R and $R_0$ are the same as mentioned with respect to the general formula (1).

The alkyl group represented by $R_1$ is preferably an alkyl group having 1 to 4 carbon atoms, more preferably a methyl group or an ethyl group and most preferably a methyl group. As the cycloalkyl group, there can be mentioned a cyclopropyl group, a cyclobutyl group, a cyclopentyl group or a cyclohexyl group. As the ester group, there can be mentioned a methoxycarbonyl group, an ethoxycarbonyl group, an n-butoxycarbonyl group, a t-butoxycarbonyl group or the like. As the substituent therefor, there can be mentioned a hydroxyl group, an alkoxy group such as a methoxy group or an ethoxy group, a cyano group, or a halogen atom such as a fluorine atom.

As the alkylene group represented by X, there can be mentioned a methylene group, an ethylene group or the like. X is preferably an oxygen atom or a methylene group.

When m is 1 or greater, the substitution site of at least one $R_1$ is preferably the α-position or β-position of the carbonyl group of the lactone. The substitution at the α-position is especially preferred.

Specific examples of the repeating units having groups with a lactone structure expressed by the general formula (1) will be shown below, which however in no way limit the scope of the present invention.

In the following specific examples, R represents a hydrogen atom, an optionally substituted alkyl group or a halogen atom. Preferably, R represents a hydrogen atom, a methyl group, a hydroxymethyl group or an acetoxymethyl group.

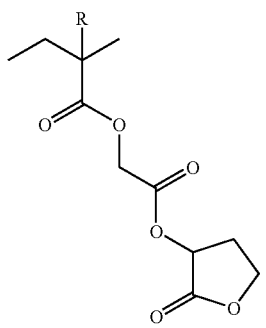
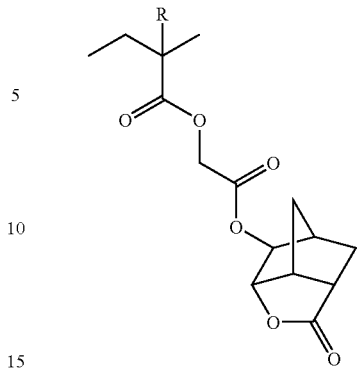
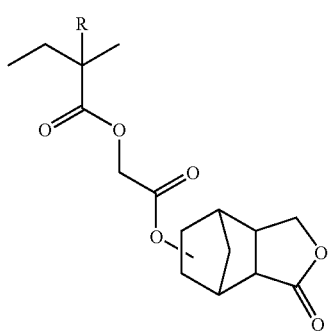
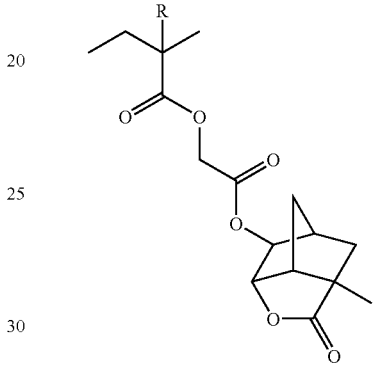
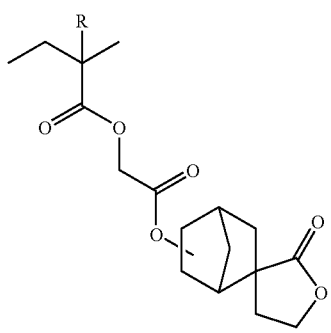
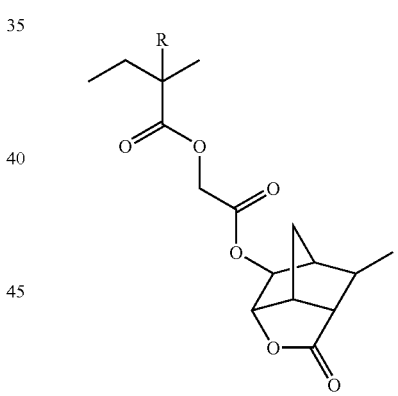
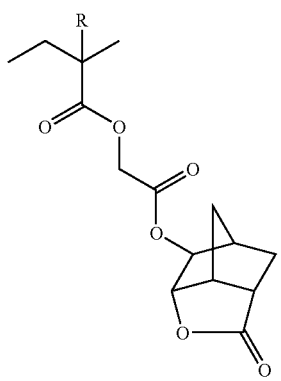
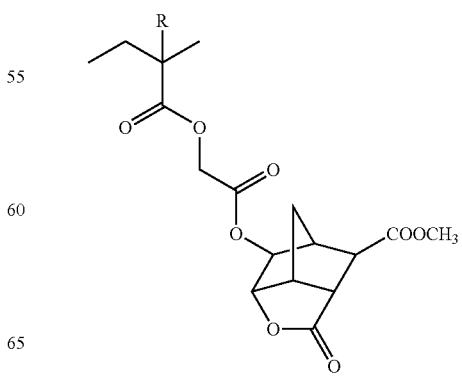
Especially preferred specific examples of the repeating units of the general formula (1-1) are as follows.

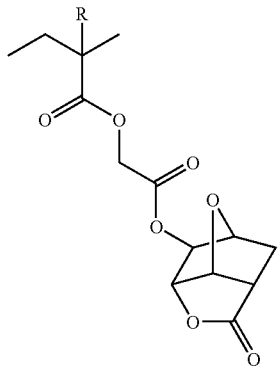
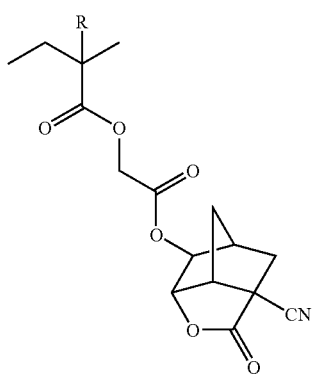
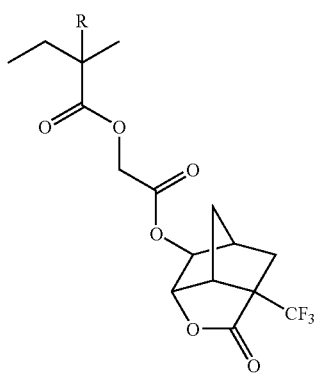
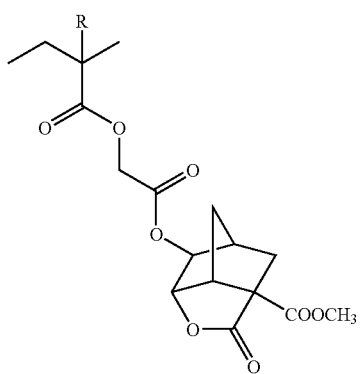
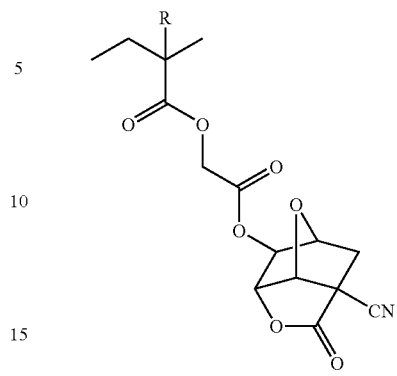
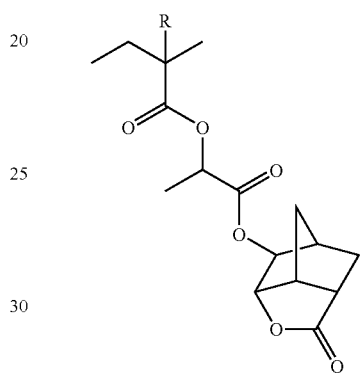
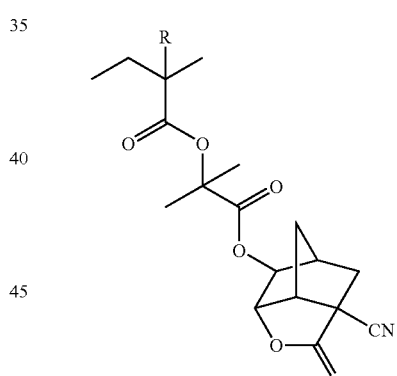
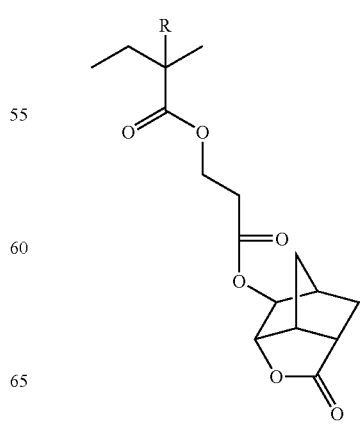

55
-continued
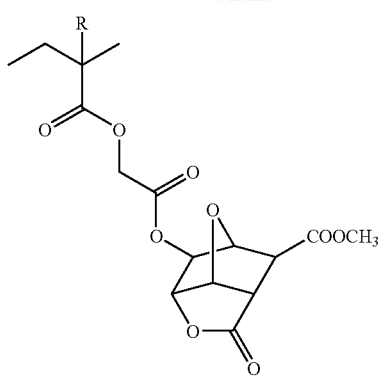
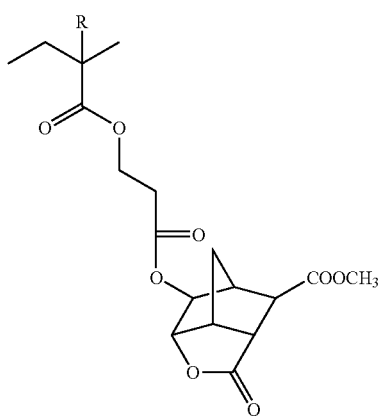
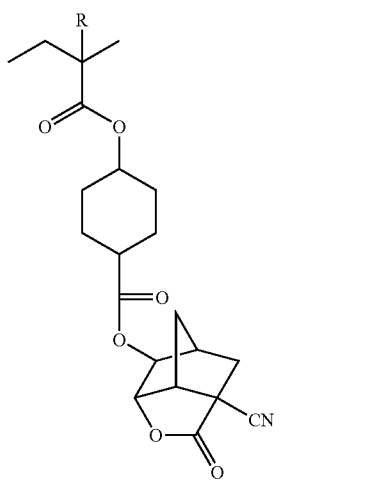
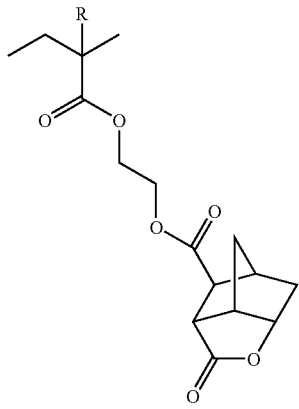
56
-continued
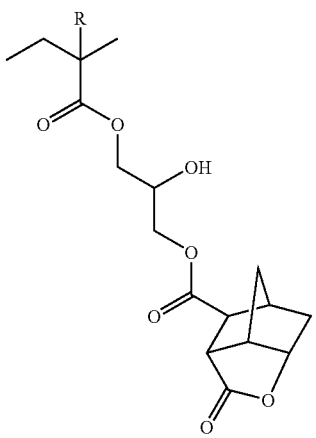
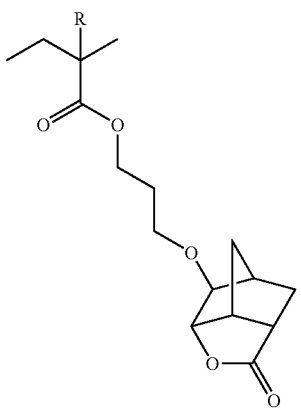
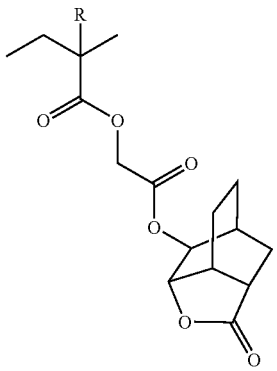

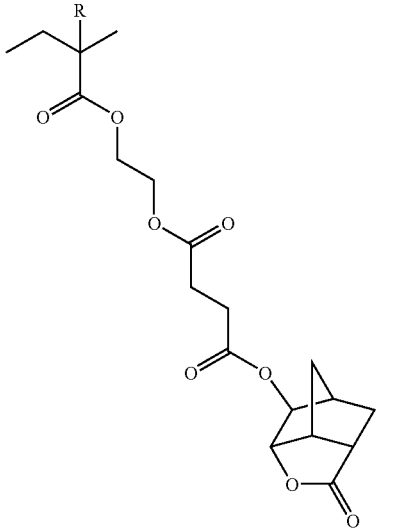

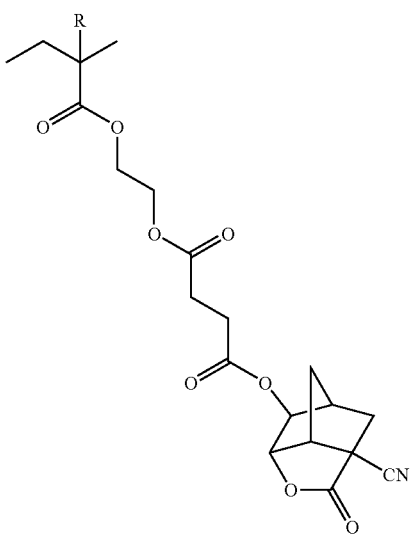

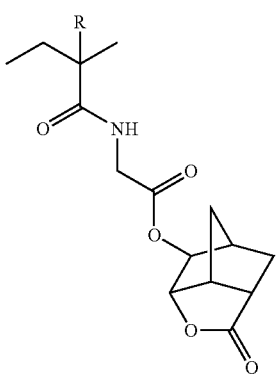

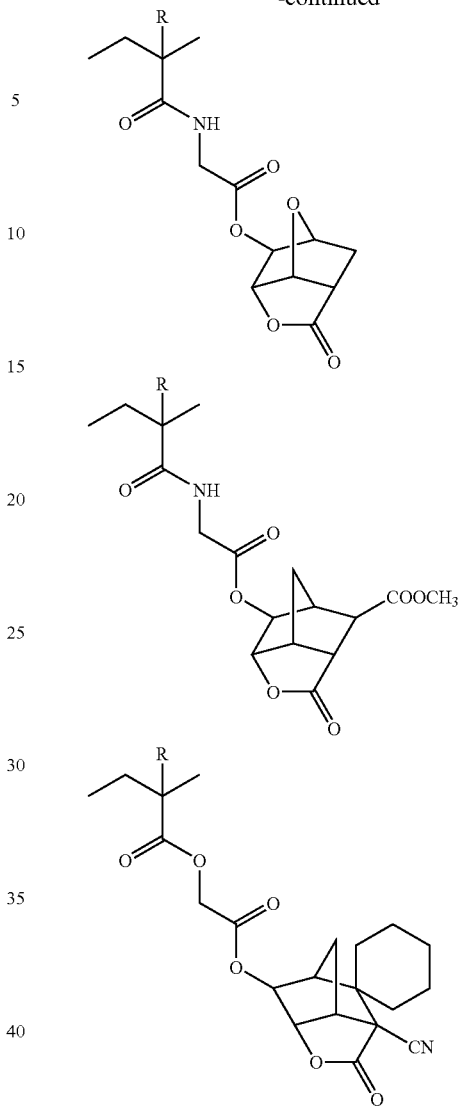

The repeating unit having a lactone group is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity (ee) thereof is preferably 90 or higher, more preferably 95 or higher.

The content of the repeating unit having a lactone group based on all the repeating units of the resin (A) polymer is preferably in the range of 15 to 60 mol %, more preferably 20 to 50 mol % and still more preferably 30 to 50 mol %.

Preferably, the resin (A) polymer contains a repeating unit other than the above repeating units with acid-decomposable groups and the above repeating units with lactone structures, having a hydroxyl group or a cyano group. The containment of this repeating unit would realize enhancements of adhesion to substrate and developer affinity. The repeating unit having a hydroxyl group or a cyano group is preferably a repeating unit having an alicyclic hydrocarbon structure substituted with a hydroxyl group or a cyano group. In the alicyclic hydrocarbon structure substituted with a hydroxyl group or a cyano group, the alicyclic hydrocarbon structure preferably consists of an adamantyl group, a diamantyl group or a norbornane group. As preferred alicyclic hydrocarbon structures substituted with a hydroxyl group or a cyano group, there can be mentioned the partial structures of the following general formulae (VIIa) to (VIId).

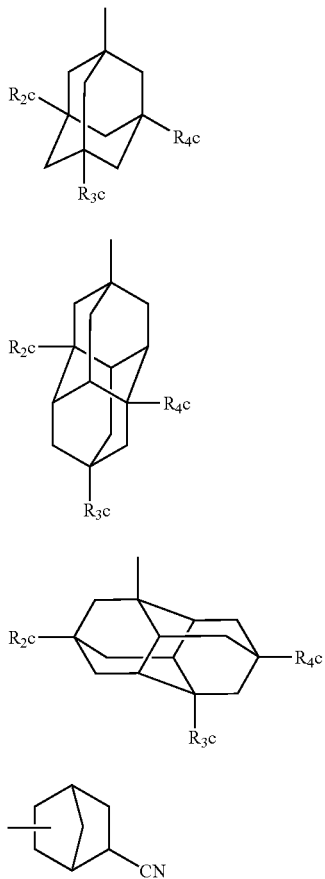

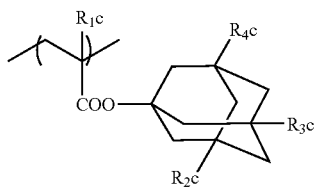

In the general formulae (VIIa) to (VIIc), each of $R_2c$ to $R_4c$ independently represents a hydrogen atom, a hydroxyl group or a cyano group, providing that at least one of the $R_2c$ to $R_4c$ represents a hydroxyl group or a cyano group. Preferably, one or two of the $R_2c$ to $R_4c$ are hydroxyl groups and the remainder is a hydrogen atom. In the general formula (VIIa), more preferably, two of the $R_2c$ to $R_4c$ are hydroxyl groups and the remainder is a hydrogen atom.

As the repeating units having any of the partial structures of the general formulae (VIIa) to (VIId), there can be mentioned those of the following general formulae (AIIa) to (AIId).

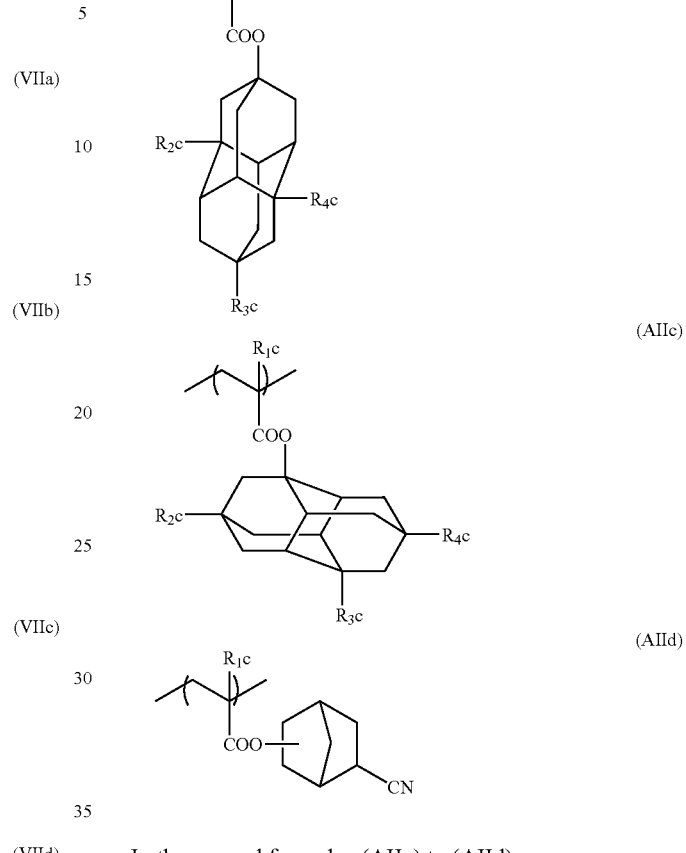

In the general formulae (AIIa) to (AIId), $R_1c$ represents a hydrogen atom, a methyl group, a trifluoromethyl group or a hydroxymethyl group.

$R_2c$ to $R_4c$ have the same meaning as those of the general formulae (VIIa) to (VIIc).

The content of the repeating unit having a hydroxyl group or a cyano group, based on all the repeating units of the resin (A) polymer, is preferably in the range of 5 to 40 mol %, more preferably 5 to 30 mol % and still more preferably 10 to 25 molt (providing that none of the above-mentioned repeating units with acid-decomposable groups having a hydroxyl group or a cyano group is contained).

Specific examples of the repeating units having a hydroxyl group or a cyano group will be shown below, which however in no way limit the scope of the present invention.

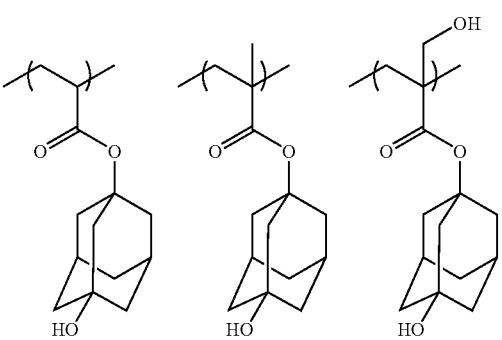

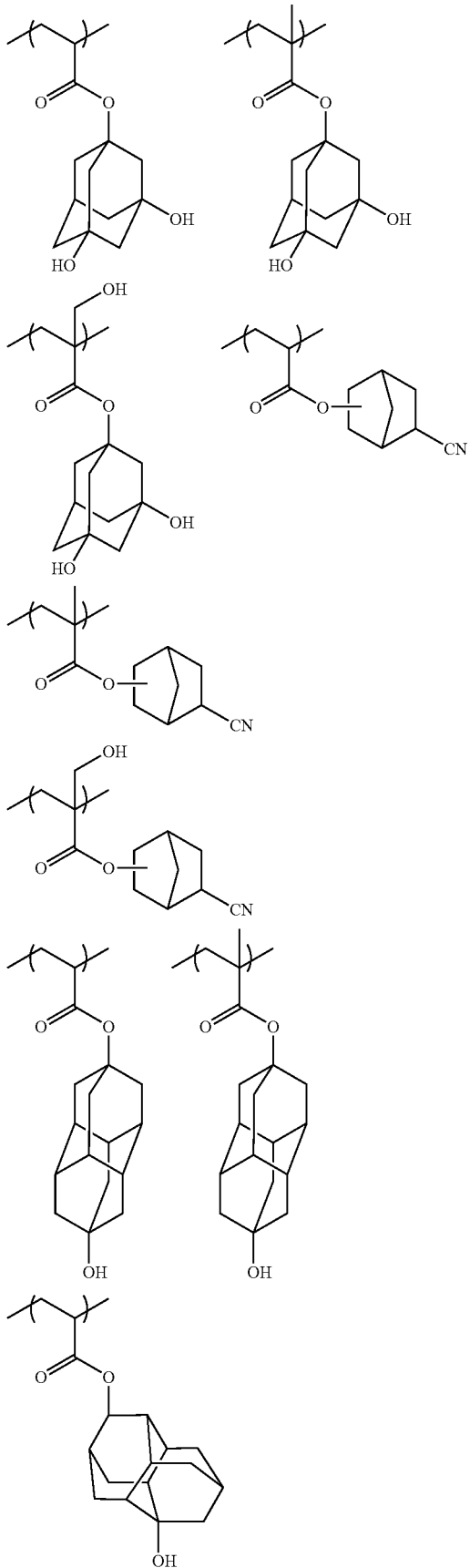
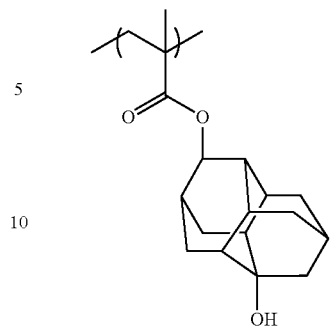

It is preferred for the resin (A) polymer to contain a repeating unit having an alkali-soluble group. As the alkali-soluble group, there can be mentioned a carboxyl group, a sulfonamido group, a sulfonylimido group, a bisulfonylimido group or an aliphatic alcohol substituted at its α-position with an electron-withdrawing group (for example, a hexafluoroisopropanol group). The possession of a repeating unit having a carboxyl group is more preferred. The incorporation of the repeating unit having an alkali-soluble group would increase the resolving power in contact hole usage. The repeating unit having an alkali-soluble group is preferably any of a repeating unit wherein the alkali-soluble group is directly bonded to the principal chain of a resin such as a repeating unit of acrylic acid or methacrylic acid, a repeating unit wherein the alkali-soluble group is bonded via a connecting group to the principal chain of a resin and a repeating unit wherein the alkali-soluble group is introduced in a terminal of a polymer chain by the use of a chain transfer agent or polymerization initiator having the alkali-soluble group in the stage of polymerization. The connecting group may have a cyclohydrocarbon structure of a single ring or multiple rings. The repeating unit of acrylic acid or methacrylic acid is especially preferred.

The content of the repeating unit having an alkali-soluble group based on all the repeating units of the resin (A) polymer is preferably in the range of 0 to 20 mol %, more preferably 3 to 15 mol % and still more preferably 5 to 10 mol %.

Specific examples of the repeating units having an alkali-soluble group will be shown below, which however in no way limit the scope of the present invention.

In the formulae, Rx represents H, $CH_3$, $CF_3$, or $CH_2OH$.

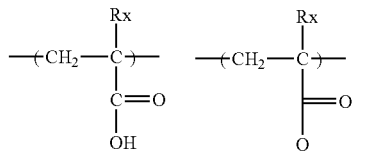
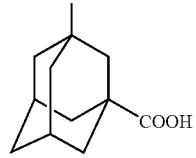

-continued

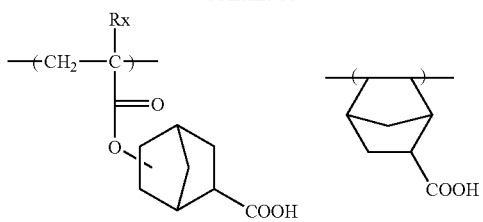
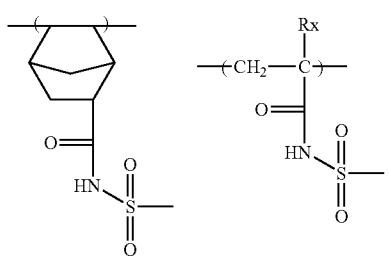
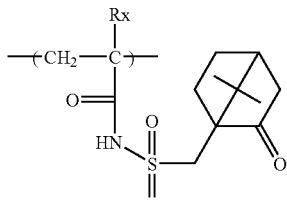
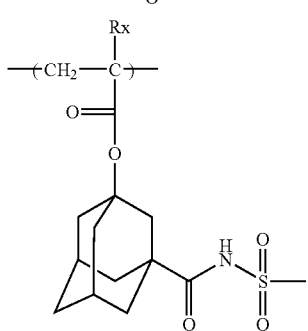
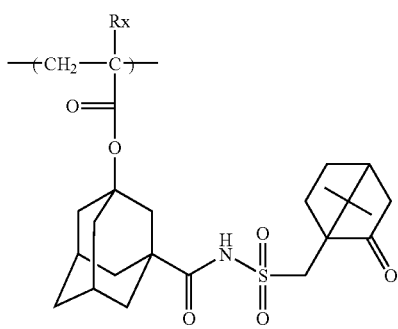
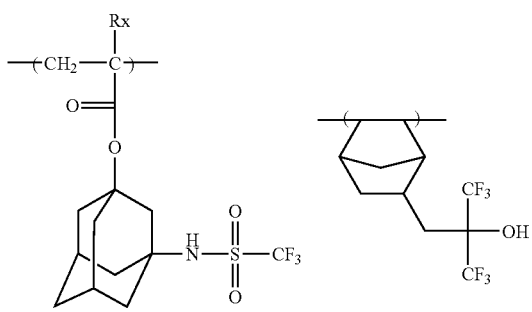

-continued

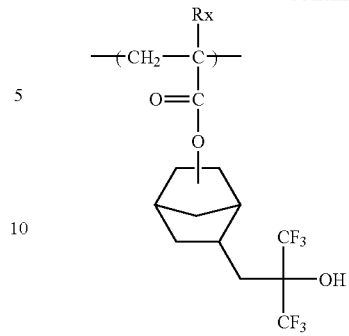
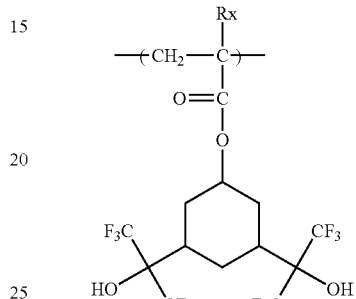

The repeating unit having at least one group selected from among a lactone group, a hydroxyl group, a cyano group and an alkali soluble group is preferably a repeating unit having at least two groups selected from among a lactone group, a hydroxyl group, a cyano group and an alkali soluble group and more preferably a repeating unit having a cyano group and a lactone group. A repeating unit of the structure wherein the above lactone structure (LC1-4) is substituted with a cyano group is especially preferred.

The resin (A) polymer may further contain any of the repeating units of the general formula (III) having neither a hydroxyl group nor a cyano group.

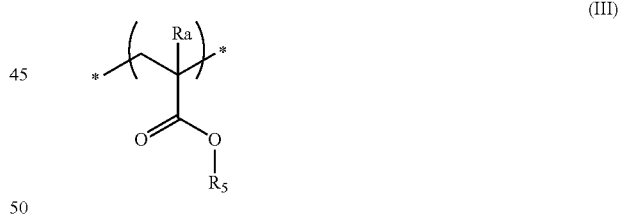

(III)

In the general formula (III), $R_5$ represents a hydrocarbon group having at least one cyclic structure in which neither a hydroxyl group nor a cyano group is contained.

Ra represents a hydrogen atom, an alkyl group or a group of the formula —$CH_2$—O—$Ra_2$ in which $Ra_2$ represents a hydrogen atom, an alkyl group or an acyl group. The particular description for the Ra is the same as that for the Ra of the general formula (I).

The cyclic structures contained in $R_5$ include a monocyclic hydrocarbon group and a polycyclic hydrocarbon group. As the monocyclic hydrocarbon group, there can be mentioned, for example, a cycloalkyl group having 3 to 12 carbon atoms, such as a cyclopentyl group, a cyclohexyl group, a cycloheptyl group or a cyclooctyl group, or a cycloalkenyl group having 3 to 12 carbon atoms, such as a cyclohexenyl group. Preferably, the monocyclic hydrocarbon group is a monocyclic hydrocarbon group having 3 to 7 carbon atoms. A cyclopentyl group and a cyclohexyl group are more preferred.

The polycyclic hydrocarbon groups include ring-assembly hydrocarbon groups and crosslinked-ring hydrocarbon groups. Examples of the ring-assembly hydrocarbon groups include a bicyclohexyl group, a perhydronaphthalene group and the like. As the crosslinked-ring hydrocarbon rings, there can be mentioned, for example, bicyclic hydrocarbon rings, such as pinane, bornane, norpinane, norbornane and bicyclooctane rings (e.g., bicyclo[2.2.2]octane ring or bicyclo[3.2.1]octane ring); tricyclic hydrocarbon rings, such as homobledane, adamantane, tricyclo[5.2.1.0$^{2,6}$]decane and tricyclo[4.3.1.1$^{2,5}$]undecane rings; and tetracyclic hydrocarbon rings, such as tetracyclo[4.4.0.1$^{2,5}$.1$^{7,10}$]dodecane and perhydro-1,4-methano-5,8-methanonaphthalene rings. Further, the crosslinked-ring hydrocarbon rings include condensed-ring hydrocarbon rings, for example, condensed rings resulting from condensation of multiple 5- to 8-membered cycloalkane rings, such as perhydronaphthalene (decalin), perhydroanthracene, perhydrophenanthrene, perhydroacenaphthene, perhydrofluorene, perhydroindene and perhydrophenarene rings.

As preferred crosslinked-ring hydrocarbon rings, there can be mentioned, for example, a norbornyl group, an adamantyl group, a bicyclooctanyl group and a tricyclo[5,2,1,0$^{2,6}$]decanyl group. As more preferred crosslinked-ring hydrocarbon rings, there can be mentioned a norbornyl group and an adamantyl group.

These alicyclic hydrocarbon groups may have substituents. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. The alkyl group may further have a substituent. As the optional further substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

The content of any of the repeating units of the general formula (III) having neither a hydroxyl group nor a cyano group, based on all the repeating units of the resin (A) polymer, is preferably in the range of 0 to 40 mol %, more preferably 0 to 20 mol %.

Specific examples of the repeating units of the general formula (III) will be shown below, which however in no way limit the scope of the present invention.

In the formulae, Ra represents H, $CH_3$, $CH_2OH$, or $CF_3$.

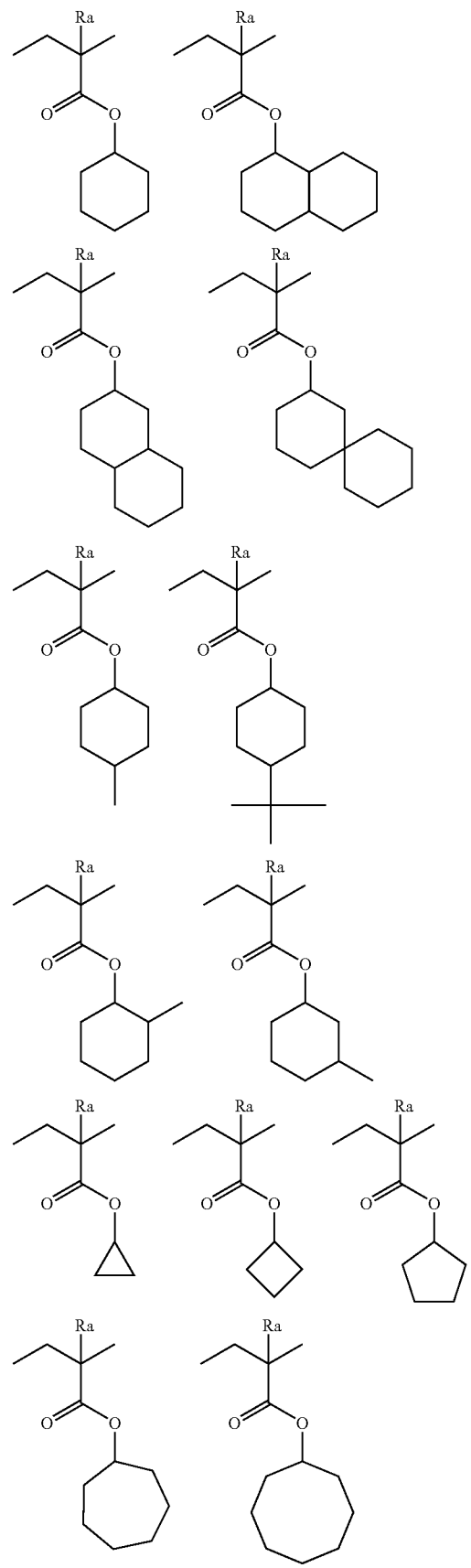

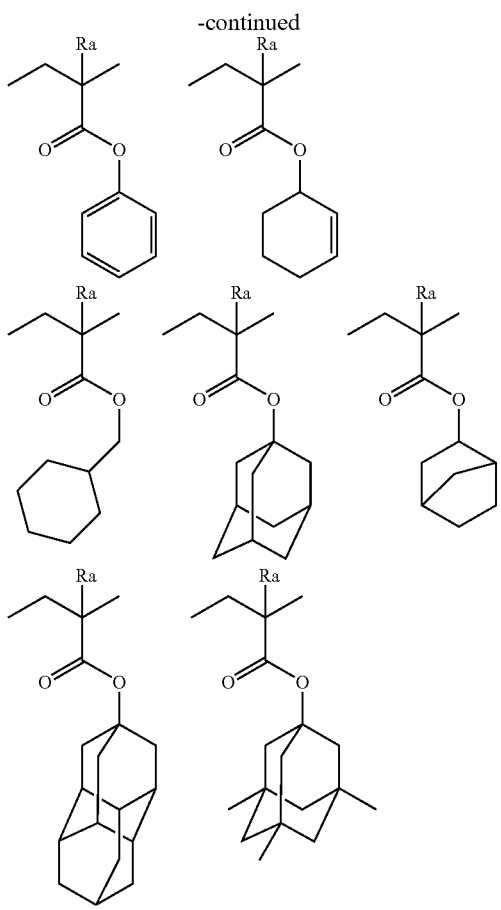

The resin (A) polymer may have, in addition to the foregoing repeating structural units, various repeating structural units for the purpose of regulating the dry etching resistance, standard developer adaptability, substrate adhesion, resist profile and generally required properties of the resist such as resolving power, heat resistance and sensitivity.

As such repeating structural units, there can be mentioned those corresponding to the following monomers, which however are nonlimiting.

The use of such repeating structural units would enable fine regulation of the required properties of the resin (A), especially:

(1) solubility in applied solvents,
(2) film forming easiness (glass transition point),
(3) alkali developability,
(4) film thinning (selections of hydrophilicity/hydrophobicity and alkali-soluble group),
(5) adhesion of unexposed area to substrate,
(6) dry etching resistance, etc.

As appropriate monomers, there can be mentioned, for example, a compound having an unsaturated bond capable of addition polymerization, selected from among acrylic esters, methacrylic esters, acrylamides, methacrylamides, allyl compounds, vinyl ethers, vinyl esters and the like.

In addition, any unsaturated compound capable of addition polymerization that is copolymerizable with monomers corresponding to the above various repeating structural units may be copolymerized therewith.

The molar ratios of individual repeating structural units contained in the resin (A) polymer are appropriately determined from the viewpoint of regulation of not only the dry etching resistance of the resist but also the standard developer adaptability, substrate adhesion, resist profile and generally required properties of the resist such as the resolving power, heat resistance and sensitivity.

When the photosensitive composition of the present invention is one for ArF exposure, it is preferred for the resin (A) polymer to have no aromatic group from the viewpoint of transparency to ArF beams.

In the resin (A) polymer, preferably, all the repeating units consist of (meth)acrylate repeating units. In that instance, use can be made of any of a resin wherein all the repeating units consist of methacrylate repeating units, a resin wherein all the repeating units consist of acrylate repeating units and a resin wherein all the repeating units consist of methacrylate repeating units and acrylate repeating units. However, it is preferred for the acrylate repeating units to account for 50 mol % or less of all the repeating units. It is more preferred to employ a copolymer containing 20 to 50 mol % of (meth)acrylate repeating units having an acid-decomposable group according to the general formula (AI), 20 to 50 mol % of (meth)acrylate repeating units having a lactone group, 5 to 30 mol % of (meth)acrylate repeating units having an alicyclic hydrocarbon structure substituted with a hydroxyl group or a cyano group and 0 to 20 mol % of other (meth)acrylate repeating units.

In the event of exposure of the photosensitive composition of the present invention to KrF excimer laser beams, electron beams, X-rays or high-energy light rays of 50 nm or less wavelength (EUV, etc.), it is preferred for the resin as the component (A) to have not only the repeating units of the general formula (AI) but also hydroxystyrene repeating units. More preferably, the resin (A) has hydroxystyrene repeating units, hydroxystyrene repeating units protected by an acid-decomposable group and acid-decomposable repeating units of a (meth)acrylic acid tertiary alkyl ester, etc.

As preferred repeating units having an acid-decomposable group, there can be mentioned, for example, repeating units derived from t-butoxycarbonyloxystyrene, a 1-alkoxyethoxystyrene and a (meth)acrylic acid tertiary alkyl ester. Repeating units derived from a 2-alkyl-2-adamantyl(meth)acrylate and a dialkyl(1-adamantyl)methyl(meth)acrylate are more preferred.

The resin (A) polymer can be synthesized by conventional techniques (for example, radical polymerization). As general synthetic methods, there can be mentioned, for example, a batch polymerization method in which a monomer species and an initiator are dissolved in a solvent and heated so as to accomplish polymerization and a dropping polymerization method in which a solution of monomer species and initiator is added by dropping to a heated solvent over a period of 1 to 10 hours. The dropping polymerization method is preferred. As a reaction solvent, there can be mentioned, for example, an ether, such as tetrahydrofuran, 1,4-dioxane or diisopropyl ether; a ketone, such as methyl ethyl ketone or methyl isobutyl ketone; an ester solvent, such as ethyl acetate; an amide solvent, such as dimethylformamide or dimethylacetamide; or the latter described solvent capable of dissolving the composition of the present invention, such as propylene glycol monomethyl ether acetate, propylene glycol monomethyl ether or cyclohexanone. It is preferred to perform the polymerization with the use of the same solvent as employed in the photosensitive composition of the present invention. This would inhibit any particle generation during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxyl group is especially preferred. As preferred initiators, there can be mentioned azobisisobutyronitrile, azobisdimethylvaleronitrile, dimethyl 2,2'-azobis(2-methylpropionate) and the like. According to necessity, a supplementation of initiator or divided addition thereof may be effected. After the completion of the reaction, the reaction mixture is poured into a solvent. The desired polymer is recovered by a method for powder or solid recovery, etc. The concentration during the reaction is in the range of 5 to 50 mass %, preferably 10 to 30 mass %. The reaction temperature is generally in the range of 10° to 150° C., preferably 30° to 120° C. and more preferably 600 to 100° C.

The weight average molecular weight of the resin (A) polymer in terms of polystyrene molecular weight as measured by GPC is preferably in the range of 1000 to 200,000, more preferably 2000 to 20,000, still more preferably 3000 to 15,000 and further preferably 3000 to 10,000. The regulation of the weight average molecular weight to 1000 to 200,000 would prevent deteriorations of heat resistance and dry etching resistance and also prevent deterioration of developability and increase of viscosity leading to poor film forming property.

Use is made of the resin whose degree of dispersal (molecular weight distribution) is generally in the range of 1 to 3, preferably 1 to 2.6, more preferably 1 to 2 and most preferably 1.4 to 1.7. The lower the molecular weight distribution, the more excellent the resolving power and resist profile and the smoother the side wall of the resist pattern to thereby attain an excellence in roughness.

The content of the resin (A) in the photosensitive composition of the present invention based on the total solids thereof is preferably in the range of 50 to 99.99 mass %, more preferably 60 to 99.0 mass %.

The content of first polymer in the composition based on the resin (A) is preferably in the range of 3 to 50 mass %, more preferably 5 to 40 mass % and most preferably 7 to 30 mass %. The content of second polymer in the composition based on the resin (A) is preferably in the range of 50 to 97 mass %, more preferably 60 to 95 mass % and most preferably 70 to 93 mass %.

(B) Compound That Generates an Acid When Exposed to Actinic Rays or Radiation

The photosensitive composition of the present invention contains a compound that when exposed to actinic rays or radiation, generates an acid (hereinafter also referred to as "acid generator").

As the acid generator, use can be made of a member appropriately selected from among a photoinitiator for photocationic polymerization, a photoinitiator for photoradical polymerization, a photo-achromatic agent and photo-discoloring agent for dyes, any of publicly known compounds that when exposed to actinic rays or radiation, generate an acid, employed in microresists, etc., and mixtures thereof.

For example, as the acid generator, there can be mentioned a diazonium salt, a phosphonium salt, a sulfonium salt, an iodonium salt, an imide sulfonate, an oxime sulfonate, diazosulfone, disulfone or o-nitrobenzyl sulfonate.

Further, use can be made of compounds obtained by introducing any of the above groups or compounds that when exposed to actinic rays or radiation, generate an acid in a polymer principal chain or side chain, for example, compounds described in U.S. Pat No. 3,849,137, DE 3914407, JP-A's-63-26653, 55-164824, 62-69263, 63-146038, 63-163452, 62-153853, 63-146029, etc.

Furthermore, use can be made of compounds that when exposed to light, generate an acid described in U.S. Pat. No. 3,779,778 and EP 126,712.

As preferred compounds among the acid generators, there can be mentioned those of the following general formulae (ZI), (ZII) and (ZIII).

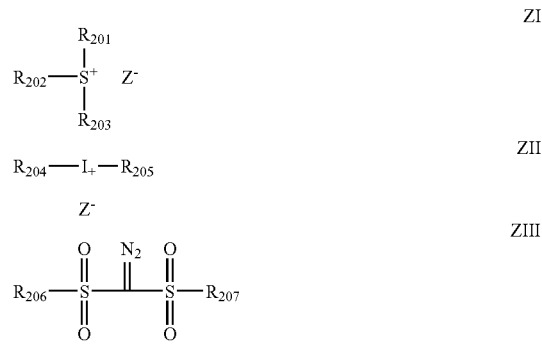

In the above general formula (ZI), each of $R_{201}$, $R_{202}$ and $R_{203}$ independently represents an organic group.

The number of carbon atoms of the organic group represented by $R_{201}$, $R_{202}$ and $R_{203}$ is generally in the range of 1 to 30, preferably 1 to 20.

Two of $R_{201}$ to $R_{203}$ may be bonded with each other to thereby form a ring structure, and the ring within the same may contain an oxygen atom, a sulfur atom, an ester bond, an amido bond or a carbonyl group. As the group formed by bonding of two of $R_{201}$ to $R_{203}$, there can be mentioned an alkylene group (for example, a butylene group or a pentylene group).

$Z^-$ represents a nonnucleophilic anion.

As the nonnucleophilic anion represented by $Z^-$, there can be mentioned, for example, a sulfonate anion, a carboxylate anion, a sulfonylimido anion, a bis(alkylsulfonyl)imido anion, a tris(alkylsulfonyl)methyl anion or the like.

The nonnucleophilic anion means an anion whose capability of inducing a nucleophilic reaction is extremely low and is an anion capable of inhibiting any temporal decomposition by intramolecular nucleophilic reaction. This would realize an enhancement of the temporal stability of the resist.

As the sulfonate anion, there can be mentioned, for example, an aliphatic sulfonate anion, an aromatic sulfonate anion, a camphor sulfonate anion or the like.

As the carboxylate anion, there can be mentioned, for example, an aliphatic carboxylate anion, an aromatic carboxylate anion, an aralkyl carboxylate anion or the like.

The aliphatic moiety of the aliphatic sulfonate anion may be an alkyl group or a cycloalkyl group, being preferably an alkyl group having 1 to 30 carbon atoms or a cycloalkyl group having 3 to 30 carbon atoms. As such, there can be mentioned, for example, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, a boronyl group or the like.

As a preferred aromatic group of the aromatic sulfonate anion, there can be mentioned an aryl group having 6 to 14 carbon atoms, for example, a phenyl group, a tolyl group, a naphthyl group or the like.

The alkyl group, cycloalkyl group and aryl group of the aliphatic sulfonate anion and aromatic sulfonate anion may have a substituent. As the substituent of the alkyl group, cycloalkyl group and aryl group of the aliphatic sulfonate anion and aromatic sulfonate anion, there can be mentioned, for example, a nitro group, a halogen atom (fluorine atom, chlorine atom, bromine atom or iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), a cycloalkylalkyloxyalkyloxy group (preferably having 8 to 20 carbon atoms) or the like. The aryl group or ring structure of these groups may further have an alkyl group (preferably having 1 to 15 carbon atoms) as its substituent.

As the aliphatic moiety of the aliphatic carboxylate anion, there can be mentioned the same alkyl groups and cycloalkyl groups as mentioned with respect to the aliphatic sulfonate anion.

As the aromatic group of the aromatic carboxylate anion, there can be mentioned the same aryl groups as mentioned with respect to the aromatic sulfonate anion.

As a preferred aralkyl group of the aralkyl carboxylate anion, there can be mentioned an aralkyl group having 6 to 12 carbon atoms, for example, a benzyl group, a phenethyl group, a naphthylmethyl group, a naphthylethyl group, a naphthylbutyl group or the like.

The alkyl group, cycloalkyl group, aryl group and aralkyl group of the aliphatic carboxylate anion, aromatic carboxylate anion and aralkyl carboxylate anion may have a substituent. As the substituent of the alkyl group, cycloalkyl group, aryl group and aralkyl group of the aliphatic carboxylate anion, aromatic carboxylate anion and aralkyl carboxylate anion, there can be mentioned, for example, the same halogen atom, alkyl group, cycloalkyl group, alkoxy group, alkylthio group, etc. as mentioned with respect to the aromatic sulfonate anion.

As the sulfonylimido anion, there can be mentioned, for example, a saccharin anion.

The alkyl group of the bis(alkylsulfonyl)imido anion and tris(alkylsulfonyl)methyl anion is preferably an alkyl group having 1 to 5 carbon atoms. As such, there can be mentioned, for example, a methyl group, an ethyl group, a propyl group, an isopropyl group, an n-butyl group, an isobutyl group, a sec-butyl group, a pentyl group, a neopentyl group or the like. As a substituent of these alkyl groups, there can be mentioned a halogen atom, an alkyl group substituted with a halogen atom, an alkoxy group, an alkylthio group, an alkyloxysulfonyl group, an aryloxysulfonyl group, a cycloalkylaryloxysulfonyl group or the like. An alkyl group substituted with a fluorine atom is preferred.

As the other nonnucleophilic anions, there can be mentioned, for example, phosphorus fluoride, boron fluoride, antimony fluoride and the like.

The nonnucleophilic anion represented by $Z^-$ is preferably selected from among an aliphatic sulfonate anion substituted at its α-position of sulfonic acid with a fluorine atom, an aromatic sulfonate anion substituted with a fluorine atom or a group having a fluorine atom, a bis(alkylsulfonyl)imido anion whose alkyl group is substituted with a fluorine atom and a tris(alkylsulfonyl)methide anion whose alkyl group is substituted with a fluorine atom. More preferably, the nonnucleophilic anion is a perfluorinated aliphatic sulfonate anion having 4 to 8 carbon atoms or a benzene sulfonate anion having a fluorine atom. Still more preferably, the nonnucleophilic anion is a nonafluorobutane sulfonate anion, a perfluorooctane sulfonate anion, a pentafluorobenzene sulfonate anion or a 3,5-bis(trifluoromethyl)benzene sulfonate anion.

As the organic groups represented by $R_{201}$, $R_{202}$ and $R_{203}$, there can be mentioned, for example, groups corresponding to the following compounds (ZI-1) to (ZI-4).

Appropriate use may be made of compounds with two or more of the structures of the general formula (ZI). For example, use may be made of compounds having a structure wherein at least one of $R_{201}$ to $R_{203}$ of a compound of the general formula (ZI) is bonded with at least one of $R_{201}$ to $R_{203}$ of another compound of the general formula (ZI).

As preferred (ZI) components, there can be mentioned the following compounds (ZI-1) to (ZI-4).

The compounds (ZI-1) are arylsulfonium compounds of the general formula (ZI) wherein at least one of $R_{201}$ to $R_{203}$ is an aryl group, namely, compounds containing an arylsulfonium as a cation.

In the arylsulfonium compounds, all of the $R_{201}$ to $R_{203}$ may be aryl groups. It is also appropriate that the $R_{201}$ to $R_{203}$ are partially an aryl group and the remainder is an alkyl group or a cycloalkyl group.

As the arylsulfonium compounds, there can be mentioned, for example, a triarylsulfonium compound, a diarylalkylsulfonium compound, an aryldialkylsulfonium compound, a diarylcycloalkylsulfonium compound and an aryldicycloalkylsulfonium compound.

The aryl group of the arylsulfonium compounds is preferably a phenyl group or a naphthyl group, more preferably a phenyl group. The aryl group may be one having a heterocyclic structure containing an oxygen atom, nitrogen atom, sulfur atom or the like. As the aryl group having a heterocyclic structure, there can be mentioned, for example, a pyrrole residue (group formed by loss of one hydrogen atom from pyrrole), a furan residue (group formed by loss of one hydrogen atom from furan), a thiophene residue (group formed by loss of one hydrogen atom from thiophene), an indole residue (group formed by loss of one hydrogen atom from indole), a benzofuran residue (group formed by loss of one hydrogen atom from benzofuran), a benzothiophene residue (group formed by loss of one hydrogen atom from benzothiophene) or the like. When the arylsulfonium compound has two or more aryl groups, the two or more aryl groups may be identical to or different from each other.

The alkyl group or cycloalkyl group contained in the arylsulfonium compound according to necessity is preferably a linear or branched alkyl group having 1 to 15 carbon atoms or a cycloalkyl group having 3 to 15 carbon atoms. As such, there can be mentioned, for example, a methyl group, an ethyl group, a propyl group, an n-butyl group, a sec-butyl group, a t-butyl group, a cyclopropyl group, a cyclobutyl group, a cyclohexyl group or the like.

The aryl group, alkyl group or cycloalkyl group represented by $R_{201}$ to $R_{203}$ may have as its substituent an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxyl group or a phenylthio group. Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. More preferred substituents are an alkyl group having 1 to 4 carbon atoms and an alkoxy group having 1 to 4 carbon atoms. The substituents may be contained in any one of the three $R_{201}$ to $R_{203}$, or alternatively may be contained in all three of $R_{201}$ to $R_{203}$. When $R_{201}$ to $R_{203}$ represent an aryl group, the substituent preferably lies at the p-position of the aryl group.

Now, the compounds (ZI-2) will be described.

The compounds (ZI-2) are compounds of the formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a cycloalkyl group, an allyl group or a vinyl group. More preferred groups are a linear or branched 2-oxoalkyl group, a 2-oxocycloalkyl group and an alkoxycarbonylmethyl group. Especially preferred is a linear or branched 2-oxoalkyl group.

As preferred alkyl groups and cycloalkyl groups represented by $R_{201}$ to $R_{203}$, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group). As more preferred alkyl groups, there can be mentioned a 2-oxoalkyl group and an alkoxycarbonylmethyl group. As more preferred cycloalkyl group, there can be mentioned a 2-oxocycloalkyl group.

The 2-oxoalkyl group may be linear or branched. A group having >C=O at the 2-position of the alkyl group is preferred.

The 2-oxocycloalkyl group is preferably a group having >C=O at the 2-position of the cycloalkyl group.

As preferred alkoxy groups of the alkoxycarbonylmethyl group, there can be mentioned alkoxy groups having 1 to 5 carbon atoms (a methoxy group, an ethoxy group, a propoxy group, a butoxy group and a pentoxy group).

The $R_{201}$ to $R_{203}$ may be further substituted with a halogen atom, an alkoxy group (for example, 1 to 5 carbon atoms), a hydroxyl group, a cyano group or a nitro group.

The compounds (ZI-3) are those represented by the following general formula (ZI-3) which have a phenacylsulfonium salt structure.

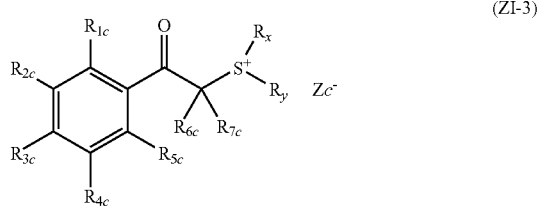

(ZI-3)

In the general formula (ZI-3), each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more of $R_{1c}$ to $R_{5c}$, and $R_{6c}$ and $R_{7c}$, and $R_x$ and $R_y$ may be bonded with each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

$Zc^-$ represents a nonnucleophilic anion. There can be mentioned the same nonnucleophilic anions as mentioned with respect to the $Z^-$ of the general formula (ZI).

The alkyl group represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group). As the cycloalkyl group, there can be mentioned, for example, a cycloalkyl group having 3 to 8 carbon atoms (for example, a cyclopentyl group or a cyclohexyl group).

The alkoxy group represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a cycloalkyl group or a linear, branched or cyclic alkoxy group. More preferably, the sum of carbon atoms of $R_{1c}$ to $R_{5c}$ is in the range of 2 to 15. Accordingly, there can be attained an enhancement of solvent solubility and inhibition of particle generation during storage.

As the alkyl groups and cycloalkyl groups represented by $R_x$ and $R_y$, there can be mentioned the same alkyl groups and cycloalkyl groups as mentioned with respect to $R_{1c}$ to $R_{7c}$. Among them, a 2-oxoalkyl group, a 2-oxocycloalkyl group and an alkoxycarbonylmethyl group are preferred.

As the 2-oxoalkyl group and 2-oxocycloalkyl group, there can be mentioned groups having >C=O at the 2-position of the alkyl group and cycloalkyl group represented by $R_{1c}$ to $R_{7c}$.

Regarding the alkoxy group of the alkoxycarbonylmethyl group, there can be mentioned the same alkoxy groups as mentioned with respect to $R_{1c}$ to $R_{5c}$.

Each of $R_x$ and $R_y$ is preferably an alkyl group or cycloalkyl group having preferably 4 or more carbon atoms. The alkyl group or cycloalkyl group has more preferably 6 or more carbon atoms and still more preferably 8 or more carbon atoms.

Now, the compounds (ZI-4) will be described.

The compounds (ZI-4) are those of general formula (ZI-4) below.

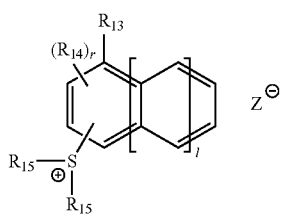

(ZI-4)

In the general formula (ZI-4), $R_{13}$ represents a hydrogen atom, a fluorine atom, a hydroxyl group, an alkyl group, a cycloalkyl group, an alkoxy group or an alkoxycarbonyl group.

$R_{14}$, each independently in the presence of two or more groups, represents an alkyl group, a cycloalkyl group, an alkoxy group, an alkylsulfonyl group or a cycloalkylsulfonyl group.

Each of $R_{15}$s independently represents an alkyl group or a cycloalkyl group, provided that the two $R_{15}$s may be bonded to each other to thereby form a ring.

In the formula, l is an integer of 0 to 2, and r is an integer of 0 to 10.

$Z^-$ represents a nonnucleophilic anion. As such, there can be mentioned any of the same nonnucleophilic anions as mentioned with respect to the $Z^-$ of the general formula (ZI).

In the general formula (ZI-4), the alkyl groups represented by $R_{13}$, $R_{14}$ and $R_{15}$ may be linear or branched and preferably each have 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are preferred.

As the cycloalkyl groups represented by $R_{13}$, $R_{14}$ and $R_{15}$, there can be mentioned cyclopropyl, cyclobutyl, cyclopentyl, cyclohexyl, cycloheptyl, cyclooctyl, cyclododecanyl, cyclopentenyl, cyclohexenyl, cyclooctadienyl and the like. Cyclopropyl, cyclopentyl, cyclohexyl and cyclooctyl are especially preferred.

The alkoxy groups represented by $R_{13}$ and $R_{14}$ may be linear or branched and preferably each have 1 to 10 carbon atoms. As such, there can be mentioned, for example, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferred.

The alkoxycarbonyl group represented by $R_{13}$ may be linear or branched and preferably has 2 to 11 carbon atoms. As such, there can be mentioned, for example, a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are preferred.

The alkylsulfonyl and cycloalkylsulfonyl groups represented by $R_{14}$ may be linear, branched or cyclic and preferably each have 1 to 10 carbon atoms. As such, there can be mentioned, for example, a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group and the like. Of these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group and the like are preferred.

In the formula, l is preferably 0 or 1, more preferably 1, and r is preferably 0 to 2.

Each of the $R_{13}$, $R_{14}$ and $R_{15}$ groups may have a substituent. As such a substituent, there can be mentioned, for example, a halogen atom (e.g., a fluorine atom), a hydroxyl group, a carboxyl group, a cyano group, a nitro group, an alkoxy group, an alkoxyalkyl group, an alkoxycarbonyl group, an alkoxycarbonyloxy group or the like.

As the alkoxy group, there can be mentioned, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group or a cyclohexyloxy group.

As the alkoxyalkyl group, there can be mentioned, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

As the alkoxycarbonyl group, there can be mentioned, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

As the alkoxycarbonyloxy group, there can be mentioned, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of the general formula (ZI-4). The bivalent $R_{15}$s may have substituents. As such substituents, there can be mentioned, for example, a hydroxyl group, a carboxyl group, a cyano group, a nitro group, an alkoxy group, an alkoxyalkyl group, an alkoxycarbonyl group, an alkoxycarbonyloxy group and the like as mentioned above. It is especially preferred for the $R_{15}$ of the general formula (ZI-4) to be a methyl group, an ethyl group, the above-mentioned bivalent group allowing two $R_{15}$s to be bonded to each other so as to form a tetrahydrothiophene ring structure in cooperation with the sulfur atom of the general formula (ZI-4), or the like.

As mentioned above, the alkyl group, cycloalkyl group, alkoxy group and alkoxycarbonyl group represented by $R_{13}$ as well as the alkyl group, cycloalkyl group, alkoxy group, alkylsulfonyl group and cycloalkylsulfonyl group represented by $R_{14}$ may have substituents. Preferred substituents are a hydroxyl group, an alkoxy group, an alkoxycarbonyl group and a halogen atom (especially, a fluorine atom).

Preferred specific examples of the cations of the compounds of the general formula (ZI-4) will be shown below.

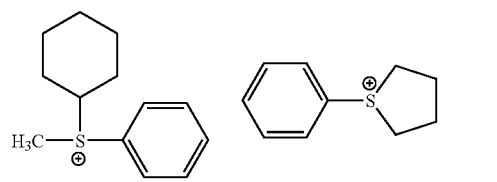

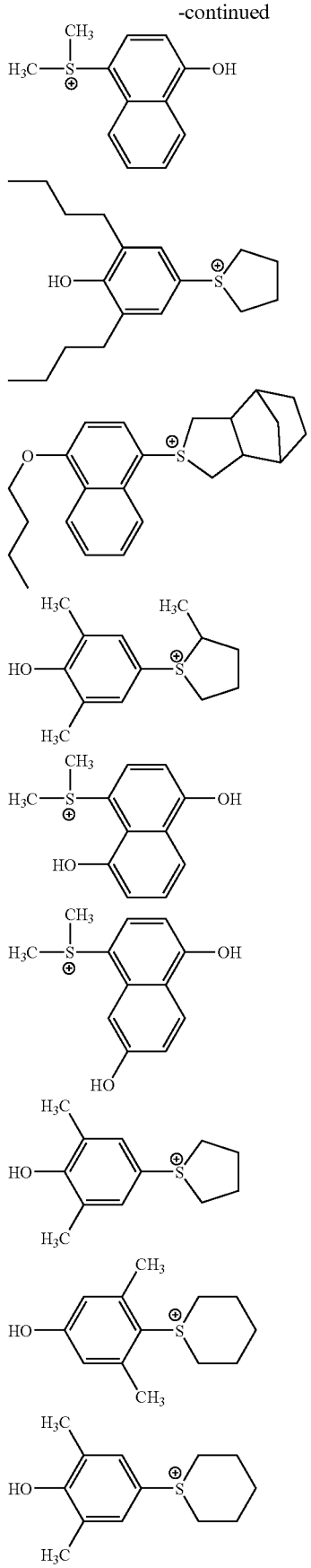

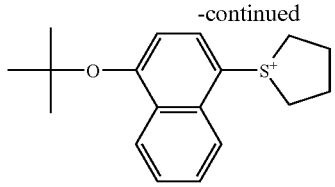

In the general formulae (ZII) and (ZIII), each of $R_{204}$ to $R_{207}$ independently represents an aryl group, an alkyl group or a cycloalkyl group.

The aryl group represented by $R_{204}$ to $R_{207}$ is preferably a phenyl group or a naphthyl group, more preferably a phenyl group. The aryl group represented by $R_{204}$ to $R_{207}$ may be one having a heterocyclic structure containing an oxygen atom, nitrogen atom, sulfur atom or the like. As the aryl group having a heterocyclic structure, there can be mentioned, for example, a pyrrole residue (group formed by loss of one hydrogen atom from pyrrole), a furan residue (group formed by loss of one hydrogen atom from furan), a thiophene residue (group formed by loss of one hydrogen atom from thiophene), an indole residue (group formed by loss of one hydrogen atom from indole), a benzofuran residue (group formed by loss of one hydrogen atom from benzofuran), a benzothiophene residue (group formed by loss of one hydrogen atom from benzothiophene) or the like.

As preferred alkyl groups and cycloalkyl groups represented by $R_{204}$ to $R_{207}$, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group).

The aryl group, alkyl group and cycloalkyl group represented by $R_{204}$ to $R_{207}$ may have a substituent. As a possible substituent on the aryl group, alkyl group and cycloalkyl group represented by $R_{204}$ to $R_{207}$, there can be mentioned, for example, an alkyl group (for example, 1 to 15 carbon atoms), a cycloalkyl group (for example, 3 to 15 carbon atoms), an aryl group (for example, 6 to 15 carbon atoms), an alkoxy group (for example, 1 to 15 carbon atoms), a halogen atom, a hydroxyl group, a phenylthio group or the like.

$Z^-$ represents a nonnucleophilic anion. As such, there can be mentioned the same nonnucleophilic anions as mentioned with respect to the $Z^-$ of the general formula (ZI).

As the acid generators, there can be further mentioned the compounds of the following general formulae (ZIV), (ZV) and (ZVI).

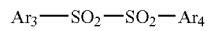

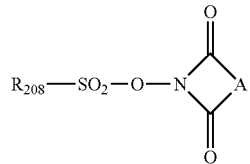

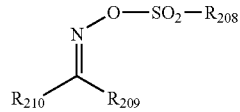

In the general formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Among the acid generators, the compounds of the general formulae (ZI) to (ZIII) are more preferred.

As a preferred acid generator, there can be mentioned a compound that generates an acid having one sulfonate group or imido group. As a more preferred acid generator, there can be mentioned a compound that generates a monovalent perfluoroalkanesulfonic acid, a compound that generates a monovalent aromatic sulfonic acid substituted with a fluorine atom or fluorine-atom-containing group, or a compound that generates a monovalent imidic acid substituted with a fluorine atom or fluorine-atom-containing group. As a still more preferred acid generator, there can be mentioned any of sulfonium salts of fluorinated alkanesulfonic acid, fluorinated benzenesulfonic acid, fluorinated imidic acid and fluorinated methide acid. With respect to practicable acid generators, it is especially preferred for the generated acid to be a fluorinated alkanesulfonic acid, fluorinated benzenesulfonic acid or fluorinated imidic acid of −1 or below pKa. By the use thereof, an enhancement of sensitivity can be attained.

Especially preferred examples of the acid generators are as follows.

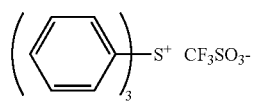

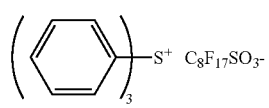

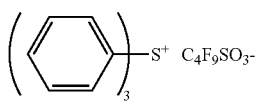

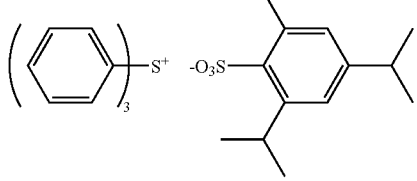

-continued
(z5)
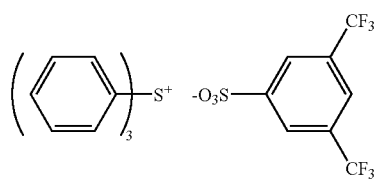
(z6)
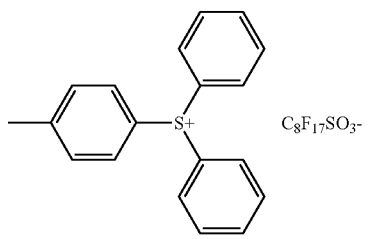
(z7)
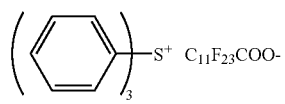
(z8)
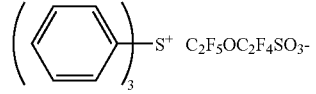
(z9)
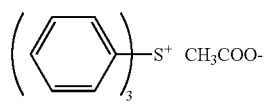
(z10)
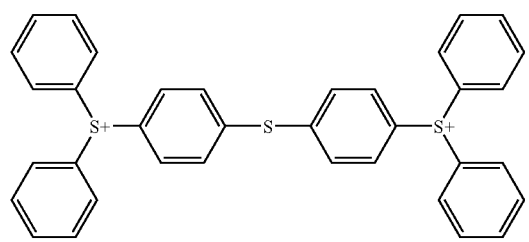
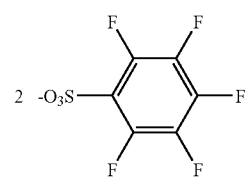
(z11)
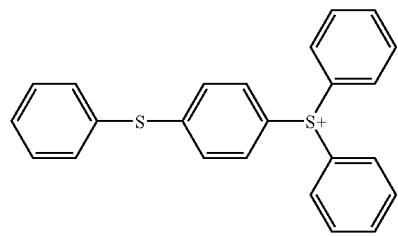
(z12)
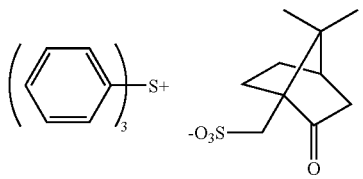
(z13)
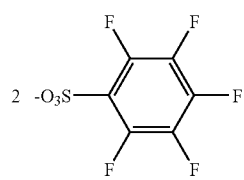
(z14)
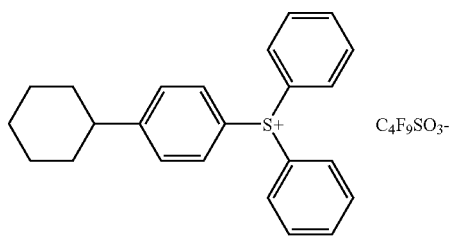
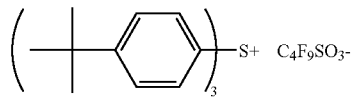
(z15)
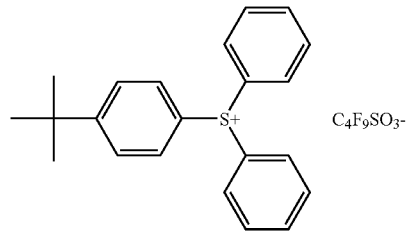
(z16)
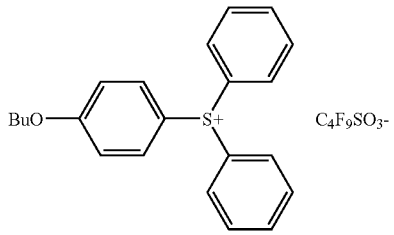

-continued
(z17) 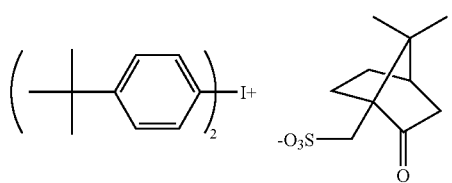 (z18) 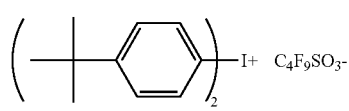
(z19) 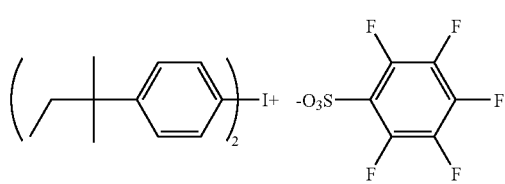 (z20) 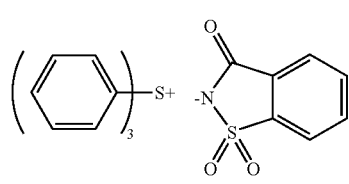
(z21) 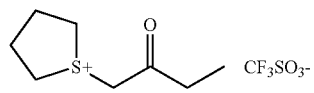 (z22) 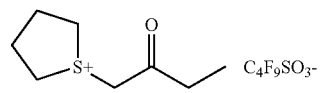
(z23) 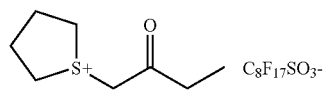 (z24) 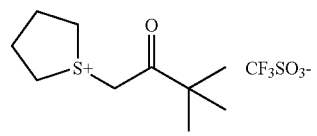
(z25) 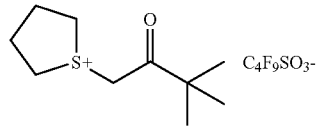 (z26) 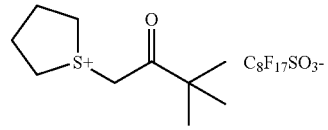
(z27) 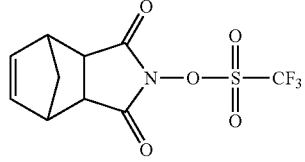 (z28) 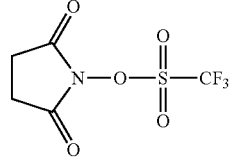
(z29) 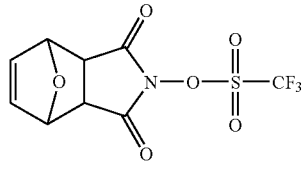 (z30) 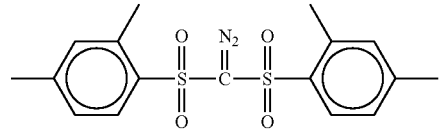
(z31) 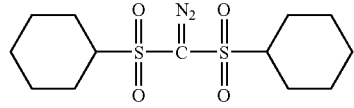 (z32) 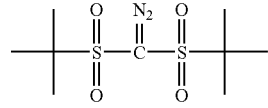
(z33) 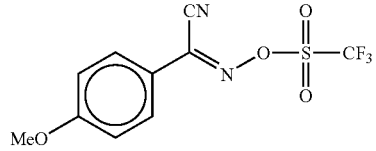
(z34) 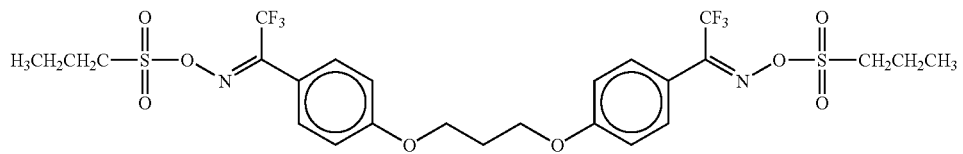

-continued
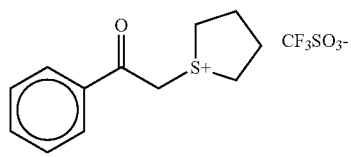
(z35)
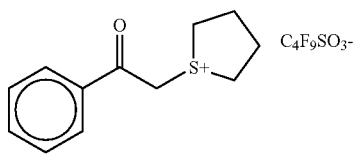
(z36)
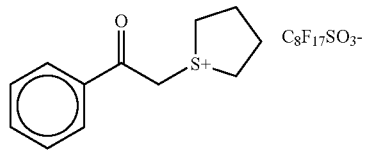
(z37)
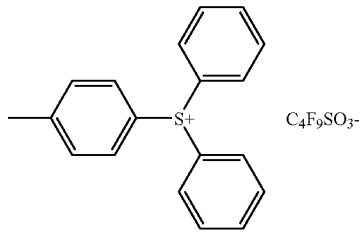
(z38)
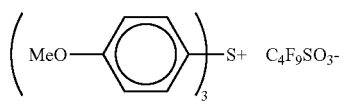
(z39)
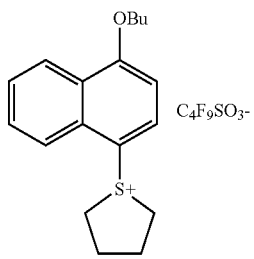
(z40)
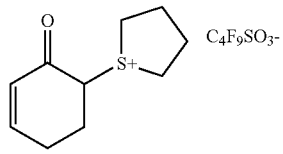
(z41)
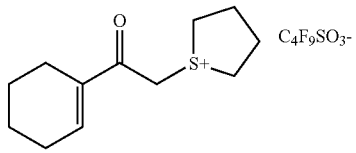
(z42)
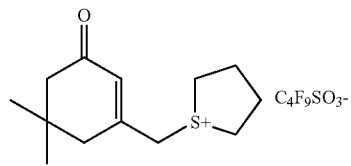
(z43)
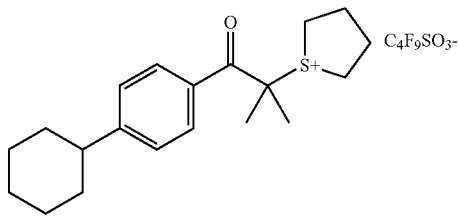
(z44)
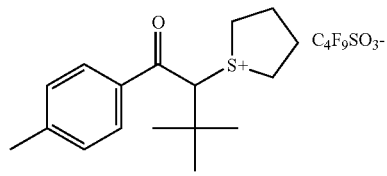
(z45)
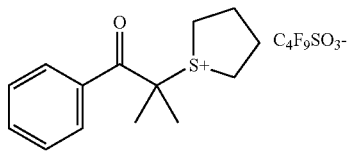
(z46)
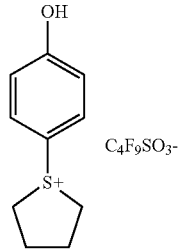
(z47)
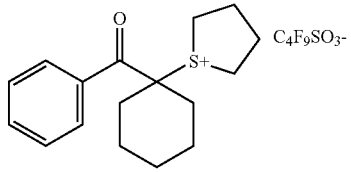
(z48)

-continued
(z49) 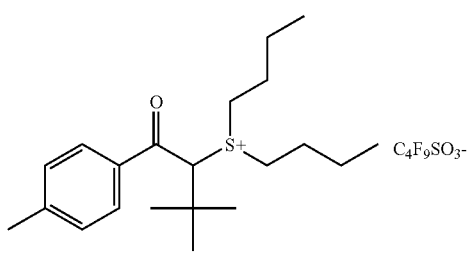
(z50) 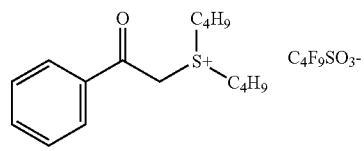
(z51) 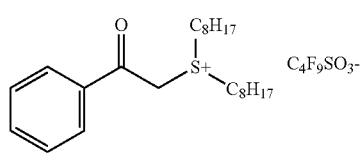
(z52) 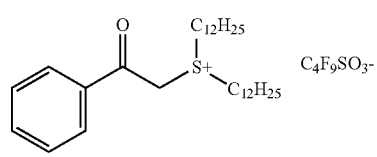
(z53) 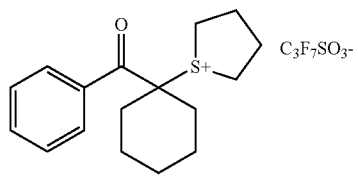
(z54) 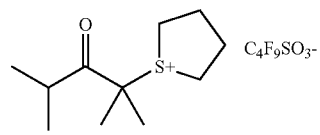
(z55) 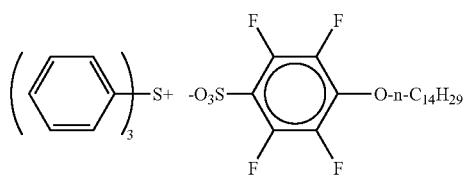
(z56) 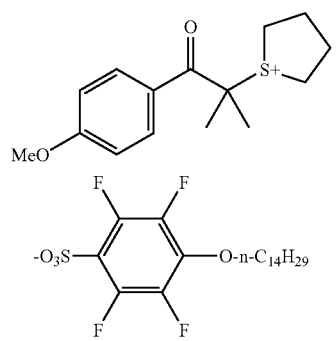
(z57) 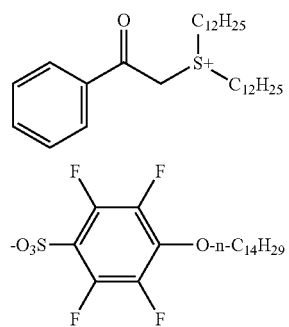
(z58) 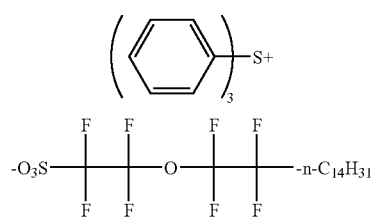
(z59) 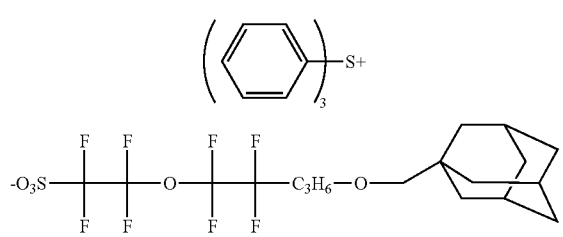
(z60) 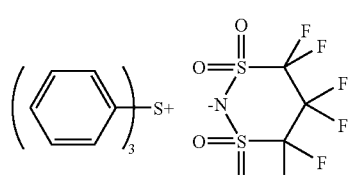

-continued
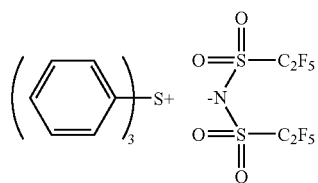
(z61)
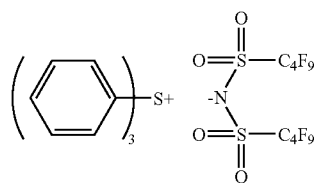
(z62)
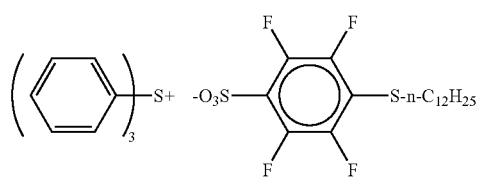
(z63)
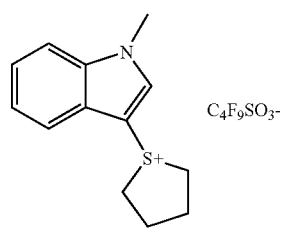
(z64)
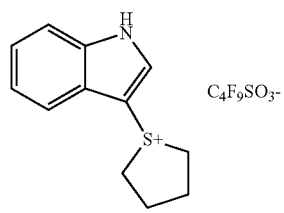
(z65)
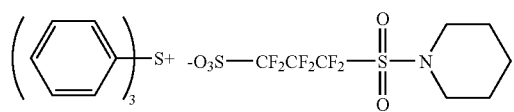
(z66)
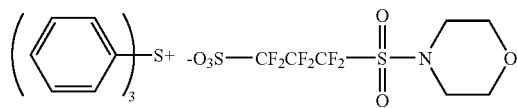
(z67)
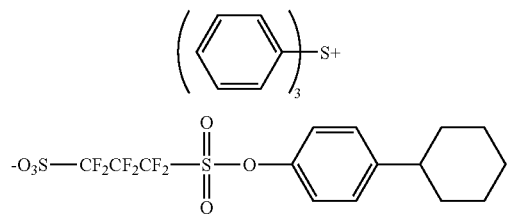
(z68)
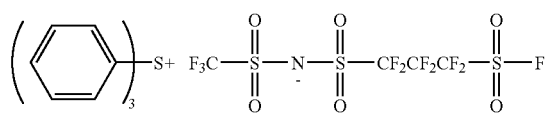
(z69)
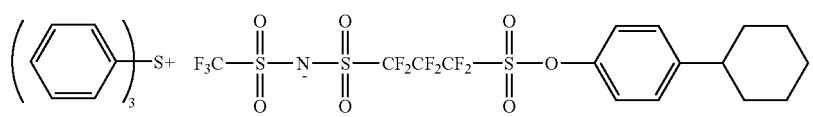
(z70)
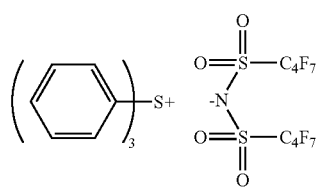
(z71)
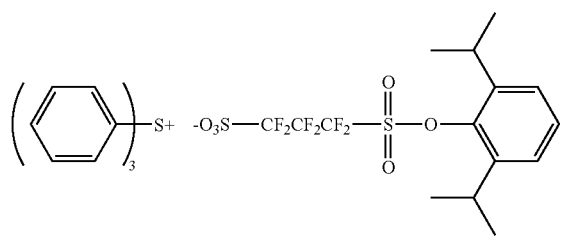
(z72)
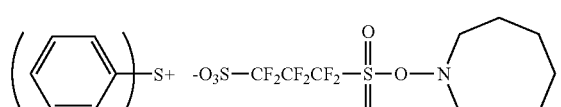
(z73)
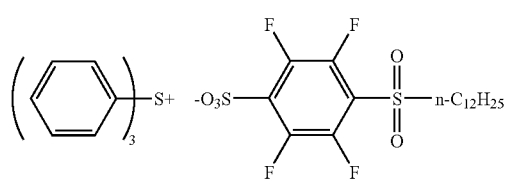
(z74)

-continued
(z75)
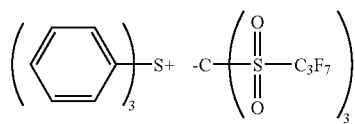
(z76)
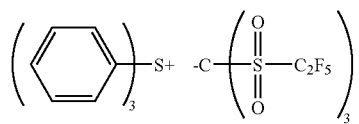
(z77)
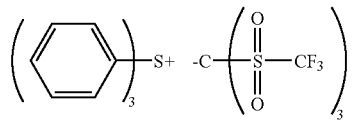
(z78)
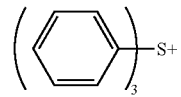
(z79)
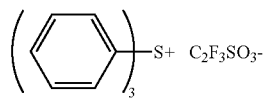
(z80)
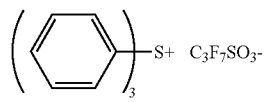
(z81)
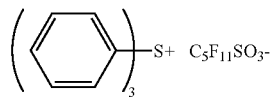
(z82)
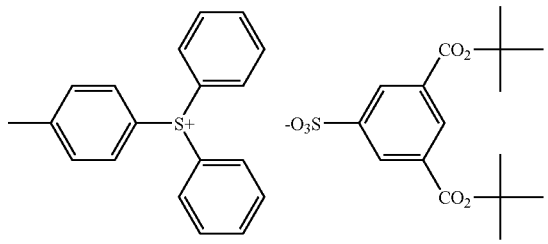
(z83)
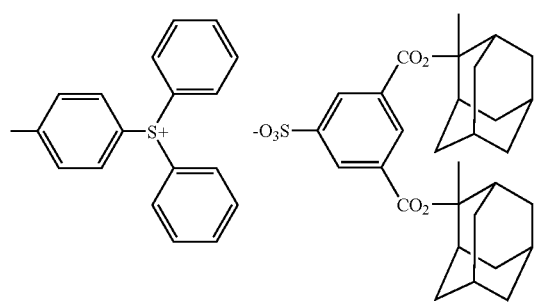
(z84)
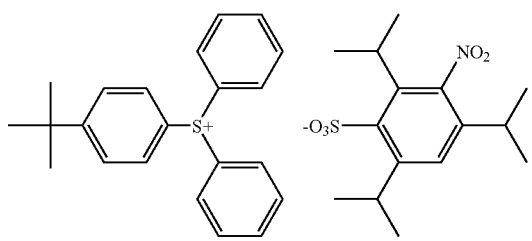

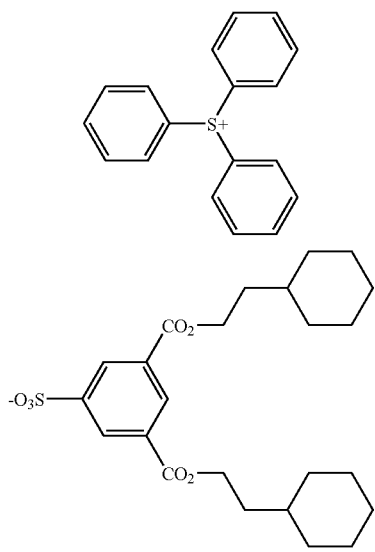

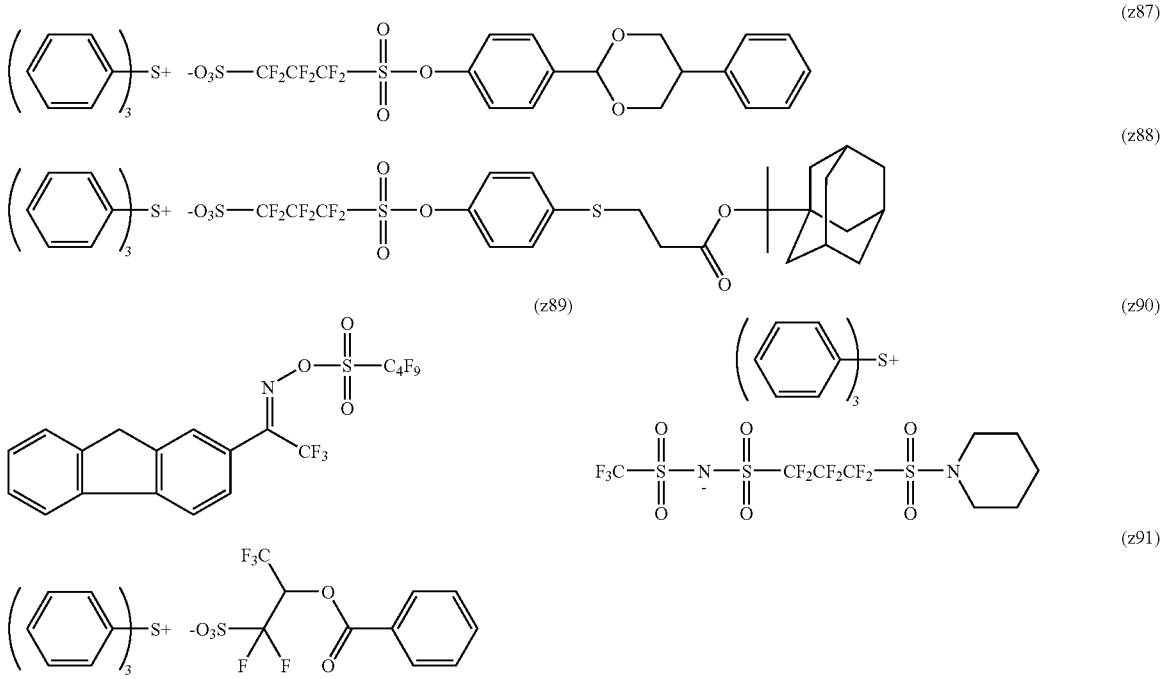

In the present invention, also, the compounds of the following general formula (I) can be appropriately used as the acid generator.

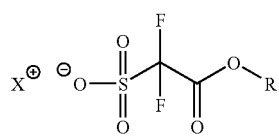
(I)

In the general formula (I),

X⁺ represents an organic counter ion, and R represents a hydrogen atom or an optionally substituted substituent having 1 or more carbon atoms.

R is preferably an organic group having 1 to 40 carbon atoms, more preferably an organic group having 3 to 40 carbon atoms and most preferably any of the organic groups of the following formula (II).

$$-(CH_2)_n\text{-Rc-}(Y)_m \quad (11)$$

In the formula (II),

Rc represents a cyclic organic group of a single ring or multiple rings having 3 to 30 carbon atoms that may contain a cyclic ether, cyclic thioether, cyclic ketone, cyclic carbonate ester, lactone or lactam structure.

Y represents a hydroxyl group, a halogen atom, a cyano group, a carboxyl group, a hydrocarbon group having 1 to 10 carbon atoms, a hydroxyalkyl group having 1 to 10 carbon atoms, an alkoxy group having 1 to 10 carbon atoms, an acyl group having 1 to 10 carbon atoms, an alkoxycarbonyl group having 2 to 10 carbon atoms, an acyloxy group having 2 to 10 carbon atoms, an alkoxyalkyl group having 2 to 10 carbon atoms or a halogenated alkyl group having 1 to 8 carbon atoms.

In the formula, m is an integer of 0 to 6. In the event of multiple Ys, they may be identical to or different from each other.

n is an integer of 0 to 10. The number of carbon atoms constructing each of the groups R expressed by the formula (II) is 40 or less.

As preferred forms of the compounds of the general formula (I), there can be mentioned those of the general formulae ($Z_{SC1}$) and ($Z_{IC1}$).

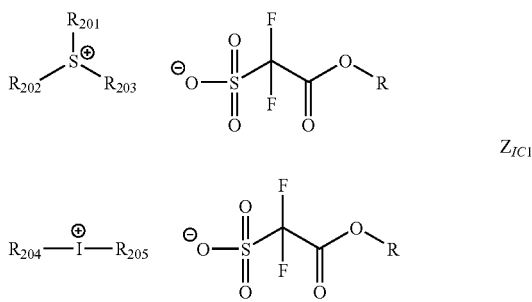

In the general formula $Z_{SC1}$, the definition of R and preferred scope thereof are the same as in the general formula (I).

Each of $R_{201}$, $R_{202}$ and $R_{203}$ independently represents an organic group.

The number of carbon atoms of each of the organic groups represented by $R_{201}$, $R_{202}$ and $R_{203}$ is generally in the range of 1 to 30, preferably 1 to 20.

Two of $R_{201}$ to $R_{203}$ may be bonded with each other to thereby form a ring structure, and the ring within the same may contain an oxygen atom, a sulfur atom, an ester bond, an amido bond or a carbonyl group. As the group formed by bonding of two of $R_{201}$ to $R_{203}$, there can be mentioned an alkylene group (for example, a butylene group or a pentylene group).

As organic groups represented by $R_{201}$, $R_{202}$ and $R_{203}$, there can be mentioned, for example, groups corresponding to the following compounds ($Z_{SC1}$-1), ($Z_{SC1}$-2) and ($Z_{SC1}$-3).

Appropriate use may be made of compounds with two or more of the structures of the general formula ($Z_{SC1}$). For example, use may be made of compounds having a structure wherein at least one of $R_{201}$ to $R_{203}$ of a compound of the general formula ($Z_{SC1}$) is bonded with at least one of $R_{201}$ to $R_{203}$ of another compound of the general formula ($Z_{SC1}$).

As preferred ($Z_{SC1}$) components, there can be mentioned the following compounds ($Z_{SC1}$-1), ($Z_{SC1}$-2) and ($Z_{SC1}$-3).

The compounds ($Z_{SC1}$-1) are arylsulfonium compounds of the general formula ($Z_{SC1}$) wherein at least one of $R_{201}$ to $R_{203}$ is an aryl group, namely, compounds containing an arylsulfonium as a cation. The definition of R and preferred scope thereof are the same as in the general formula (I).

In the arylsulfonium compounds, all of the $R_{201}$ to $R_{203}$ may be aryl groups. It is also appropriate if the $R_{201}$ to $R_{203}$ are partially an aryl group and the remainder is an alkyl group or a cycloalkyl group.

As the arylsulfonium compounds, there can be mentioned, for example, a triarylsulfonium compound, a diarylalkylsulfonium compound, an aryldialkylsulfonium compound, a diarylcycloalkylsulfonium compound and an aryldicycloalkylsulfonium compound.

The aryl group of the arylsulfonium compounds is preferably a phenyl group or a naphthyl group, more preferably a phenyl group. The aryl group may be one having a heterocyclic structure containing an oxygen atom, a nitrogen atom, a sulfur atom or the like. As the aryl group having a heterocyclic structure, there can be mentioned, for example, a pyrrole residue (group formed by loss of one hydrogen atom from pyrrole), a furan residue (group formed by loss of one hydrogen atom from furan), a thiophene residue (group formed by loss of one hydrogen atom from thiophene), an indole residue (group formed by loss of one hydrogen atom from indole), a benzofuran residue (group formed by loss of one hydrogen atom from benzofuran), a benzothiophene residue (group formed by loss of one hydrogen atom from benzothiophene) or the like. When the arylsulfonium compound has two or more aryl groups, the two or more aryl groups may be identical to or different from each other.

The alkyl group or cycloalkyl group contained in the arylsulfonium compound according to necessity is preferably a linear or branched alkyl group having 1 to 15 carbon atoms or a cycloalkyl group having 3 to 15 carbon atoms. As such, there can be mentioned, for example, a methyl group, an ethyl group, a propyl group, an n-butyl group, a sec-butyl group, a t-butyl group, a cyclopropyl group, a cyclobutyl group, a cyclohexyl group or the like.

The aryl group, alkyl group or cycloalkyl group represented by $R_{201}$ to $R_{203}$ may have as its substituent an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxyl group or a phenylthio group. Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. More preferred substituents are an alkyl group having 1 to 4 carbon atoms and an alkoxy group having 1 to 4 carbon atoms. The substituents may be contained in any one of the three $R_{201}$ to $R_{203}$, or alternatively may be contained in all three of $R_{201}$ to $R_{203}$. When $R_{201}$ to $R_{203}$ represent an aryl group, the substituent preferably lies at the p-position of the aryl group.

Now, the compounds ($Z_{SC1}$-2) will be described.

The compounds ($Z_{SC1}$-2) are compounds of the formula ($Z_{SC1}$) wherein each of $R_{201}$ to $R_{203}$ independently represents an organic group having no aromatic ring. The aromatic rings include an aromatic ring having a heteroatom. The definition of R and preferred scope thereof are the same as in the general formula (I).

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a cycloalkyl group, an allyl group or a vinyl group. More preferred groups are a linear or branched 2-oxoalkyl group, a 2-oxocycloalkyl group and an alkoxycarbonylmethyl group. Especially preferred is a linear or branched 2-oxoalkyl group.

As preferred alkyl groups and cycloalkyl groups represented by $R_{201}$ to $R_{203}$, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group). As more preferred alkyl groups, there can be mentioned a 2-oxoalkyl group and an alkoxycarbonylmethyl group. As a more preferred cycloalkyl group, there can be mentioned a 2-oxocycloalkyl group.

The 2-oxoalkyl group may be linear or branched. A group having >C=O at the 2-position of the alkyl group is preferred.

The 2-oxocycloalkyl group is preferably a group having >C=O at the 2-position of the cycloalkyl group.

As preferred alkoxy groups of the alkoxycarbonylmethyl group, there can be mentioned alkoxy groups having 1 to 5 carbon atoms (a methoxy group, an ethoxy group, a propoxy group, a butoxy group and a pentoxy group).

The $R_{201}$ to $R_{203}$ may be further substituted with a halogen atom, an alkoxy group (for example, 1 to 5 carbon atoms), a hydroxyl group, a cyano group or a nitro group.

The compounds ($Z_{SC1}$-3) are those represented by the following general formula ($Z_{SC1}$-3) which have a phenacylsulfonium salt structure.

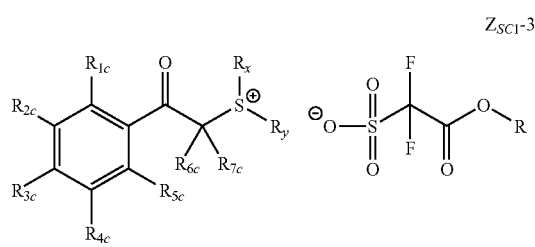

$Z_{SC1}$-3

In the general formula ($Z_{SC1}$-3), the definition of R and preferred scope thereof are the same as in the general formula (I).

Each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more of $R_{1c}$ to $R_{5c}$, and $R_{6c}$ and $R_{7c}$, and $R_x$ and $R_y$ may be bonded with each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

The alkyl group represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group). As the cycloalkyl group, there can be mentioned, for example, a cycloalkyl group having 3 to 8 carbon atoms (for example, a cyclopentyl group or a cyclohexyl group).

The alkoxy group represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a cycloalkyl group or a linear, branched or cyclic alkoxy group. More preferably, the sum of carbon atoms of $R_{1c}$ to $R_{5c}$ is in the range of 2 to 15. Accordingly, there can be attained an enhancement of solvent solubility and inhibition of particle generation during storage.

As the alkyl groups and cycloalkyl groups represented by $R_x$ and $R_y$, there can be mentioned the same alkyl groups and cycloalkyl groups as mentioned with respect to $R_{1c}$ to $R_{7c}$. Among them, a 2-oxoalkyl group, a 2-oxocycloalkyl group and an alkoxycarbonylmethyl group are preferred.

As the 2-oxoalkyl group and 2-oxocycloalkyl group, there can be mentioned groups having >C=O at the 2-position of the alkyl group and cycloalkyl group represented by $R_{1c}$ to $R_{7c}$.

Regarding the alkoxy group of the alkoxycarbonylmethyl group, there can be mentioned the same alkoxy groups as mentioned with respect to $R_{1c}$ to $R_{5c}$.

Each of $R_x$ and $R_y$ is preferably an alkyl group or cycloalkyl group having preferably 4 or more carbon atoms. The alkyl group or cycloalkyl group has more preferably 6 or more carbon atoms and still more preferably 8 or more carbon atoms.

The general formula ($Z_{IC1}$) will be described below.

In the general formula ($Z_{IC1}$), the definition of R and preferred scope thereof are the same as in the general formula (I).

Each of $R_{204}$ and $R_{205}$ independently represents an aryl group, an alkyl group or a cycloalkyl group.

The aryl group represented by $R_{204}$ and $R_{205}$ is preferably a phenyl group or a naphthyl group, more preferably a phenyl group. The aryl group represented by $R_{204}$ and $R_{205}$ may be one having a heterocyclic structure containing an oxygen atom, a nitrogen atom, a sulfur atom or the like. As the aryl group having a heterocyclic structure, there can be mentioned, for example, a pyrrole residue (group formed by loss of one hydrogen atom from pyrrole), a furan residue (group formed by loss of one hydrogen atom from furan), a thiophene residue (group formed by loss of one hydrogen atom from thiophene), an indole residue (group formed by loss of one hydrogen atom from indole), a benzofuran residue (group formed by loss of one hydrogen atom from benzofuran), a benzothiophene residue (group formed by loss of one hydrogen atom from benzothiophene) or the like.

The alkyl group or cycloalkyl group represented by $R_{204}$ and $R_{205}$ is preferably a linear or branched alkyl group having 1 to 10 carbon atoms (for example, a methyl group, an ethyl group, a propyl group, a butyl group or a pentyl group) or a cycloalkyl group having 3 to 10 carbon atoms (a cyclopentyl group, a cyclohexyl group or a norbornyl group).

The aryl group, alkyl group or cycloalkyl group represented by $R_{204}$ and $R_{205}$ may have a substituent. As the substituent optionally contained in the aryl group, alkyl group or cycloalkyl group represented by $R_{204}$ and $R_{205}$, there can be mentioned, for example, an alkyl group (for example, 1 to 15 carbon atoms), a cycloalkyl group (for example, 3 to 15 carbon atoms), an aryl group (for example, 6 to 15 carbon atoms), an alkoxy group (for example, 1 to 15 carbon atoms), a halogen atom, a hydroxyl group, a phenylthio group or the like.

Specific examples of the compounds of the general formula (I) are shown below.
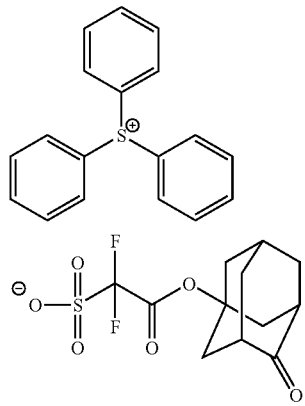
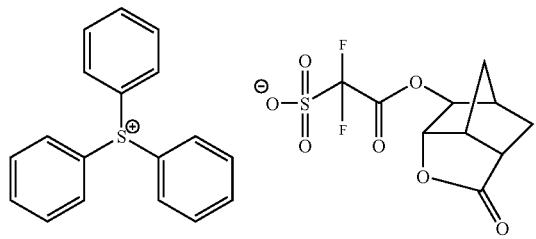
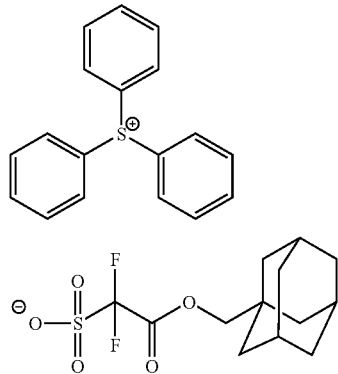
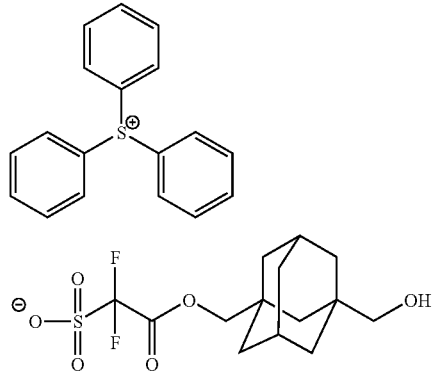
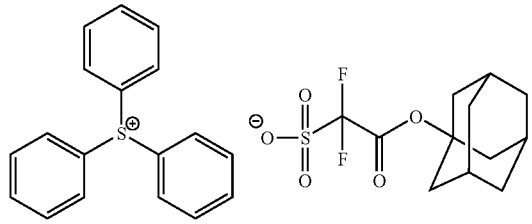
-continued
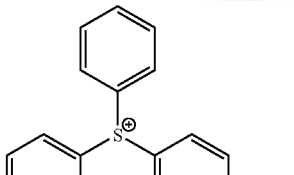
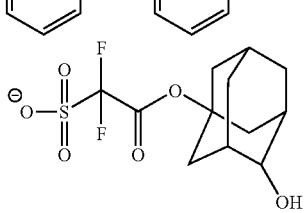
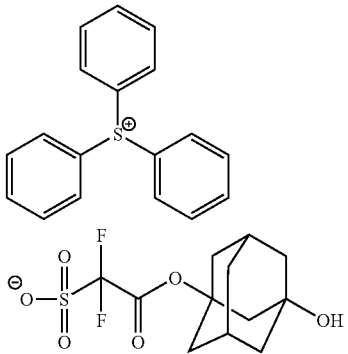
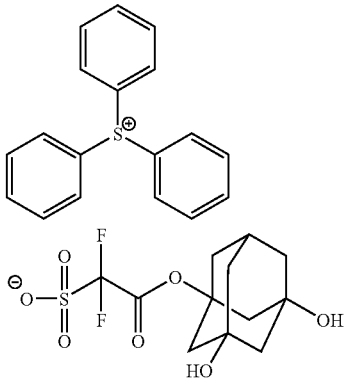
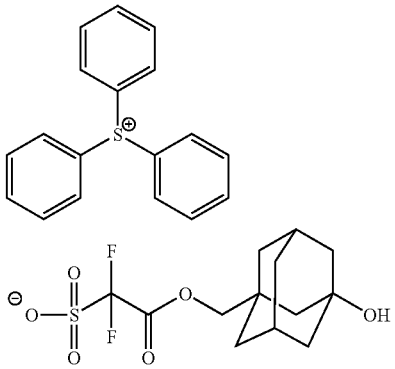
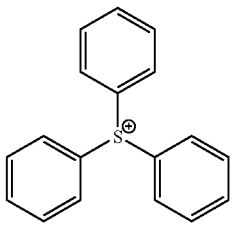

| 101 -continued | 102 -continued |
|---|---|
| 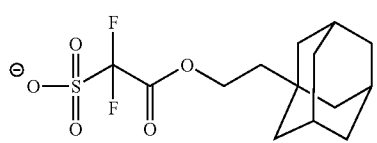 | 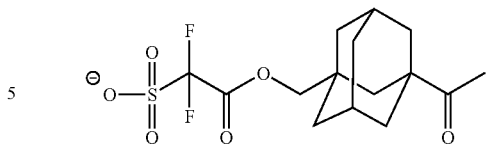 |
| 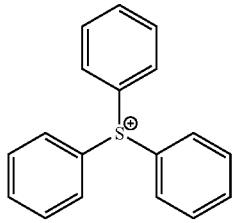 | 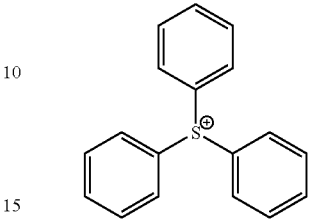 |
| 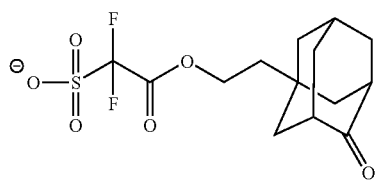 | 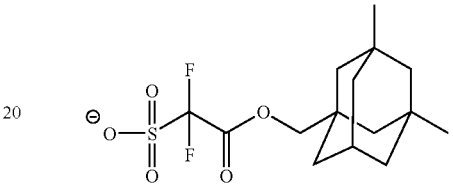 |
| 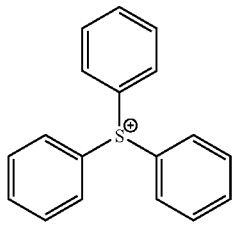 | 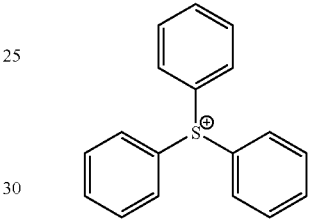 |
| 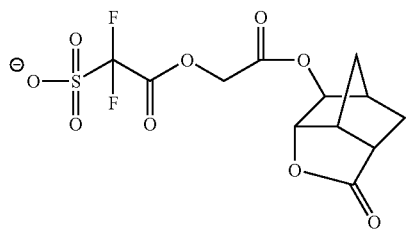 | 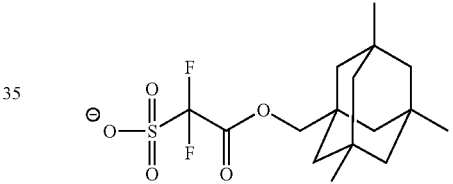 |
| 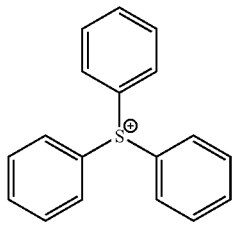 | 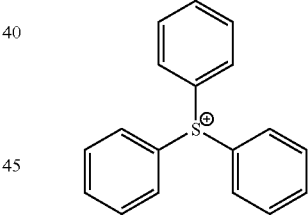 |
| 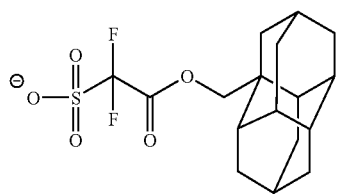 | 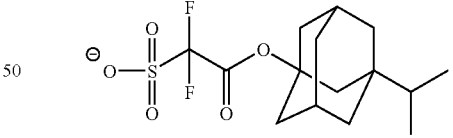 |
| 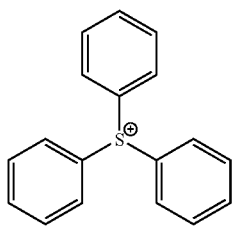 | 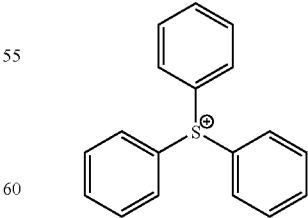 |
| | 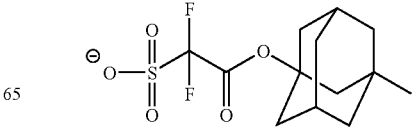 |

103
-continued
104
-continued
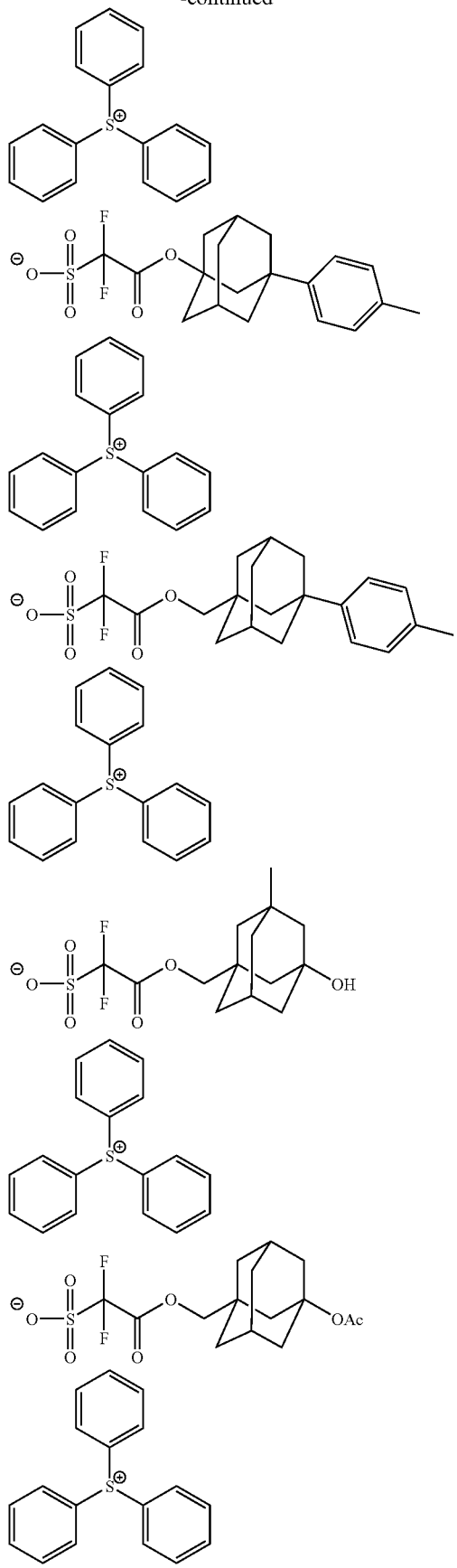
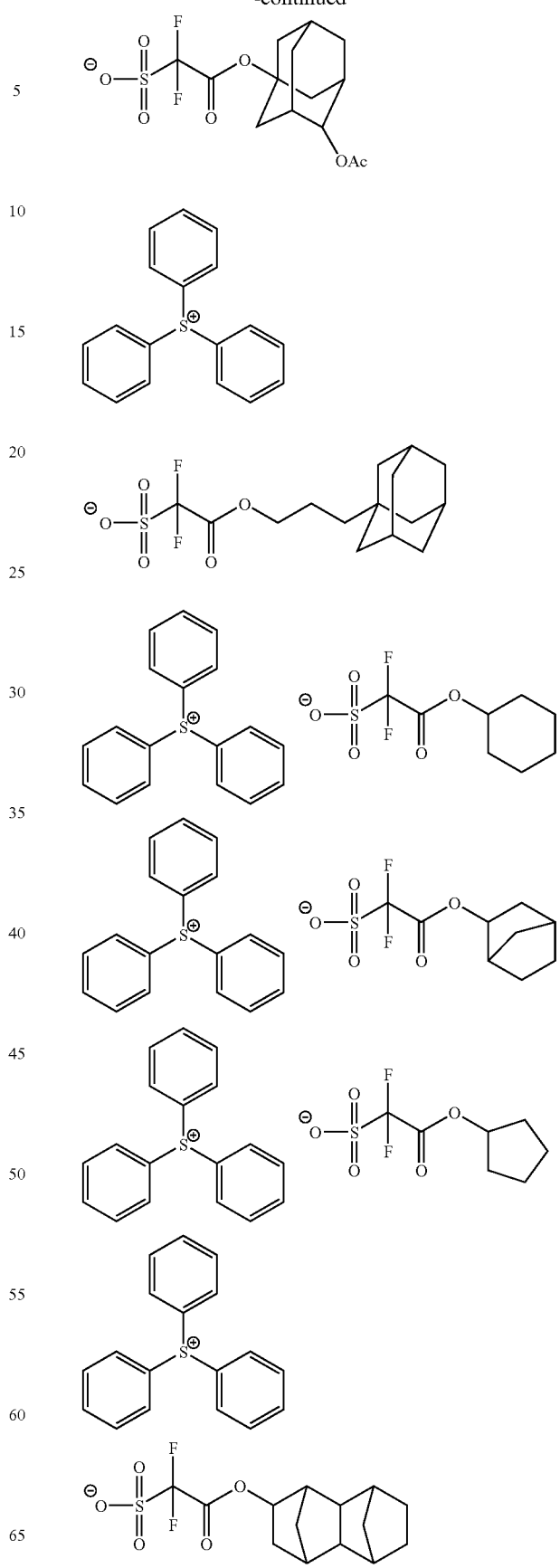

105
-continued
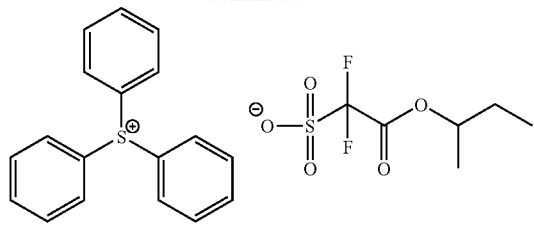
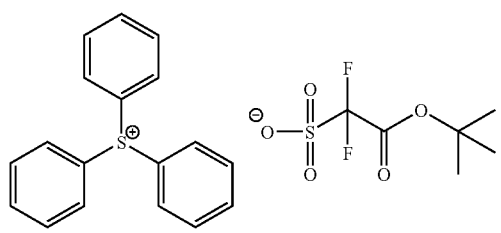
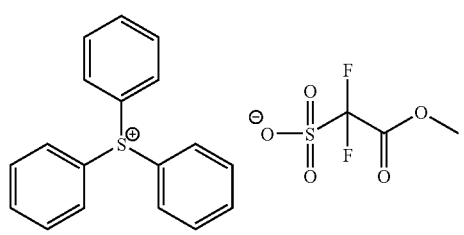
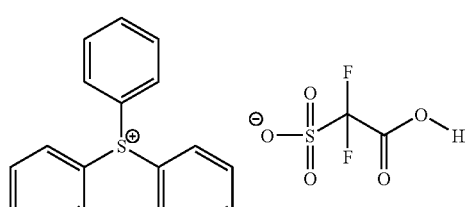
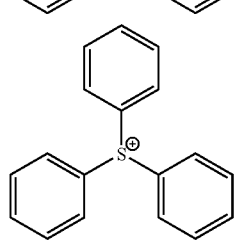
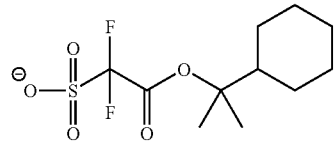
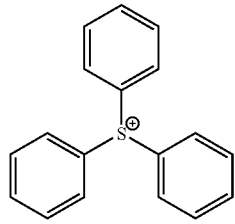
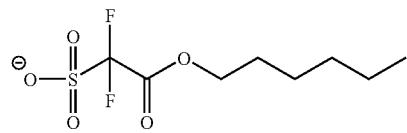
106
-continued
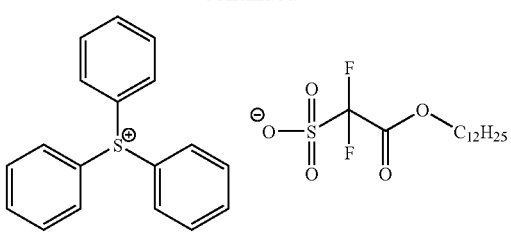
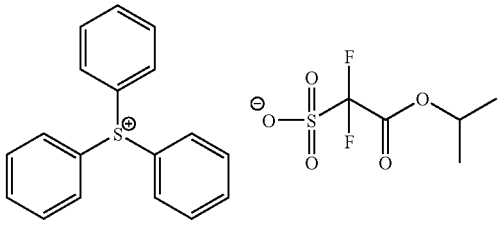
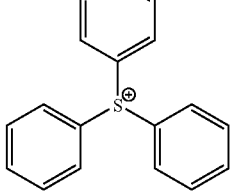
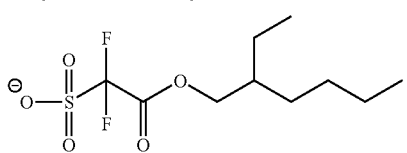
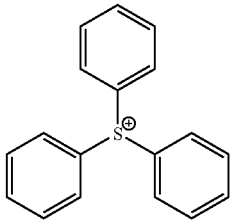
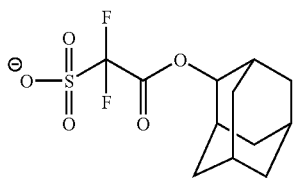
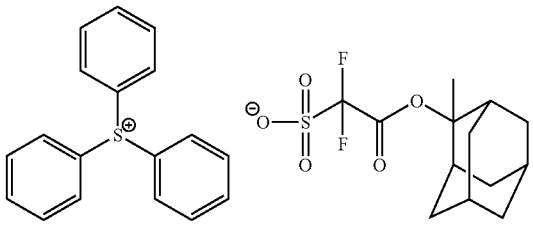
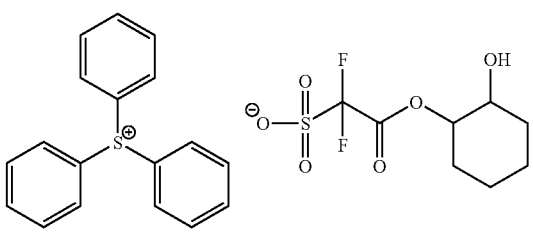

107
-continued
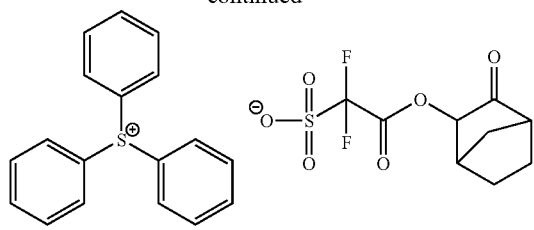
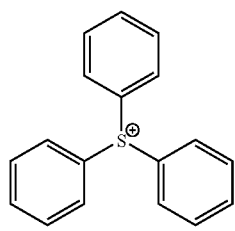
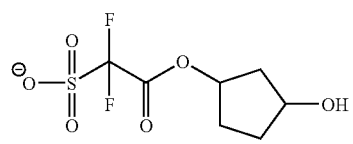
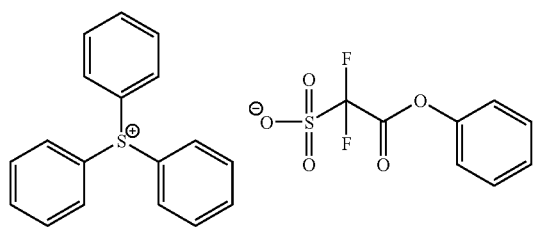
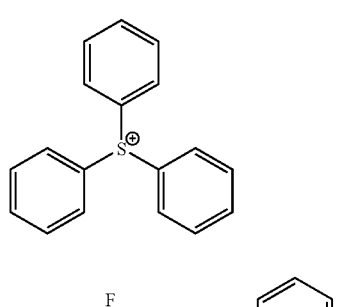
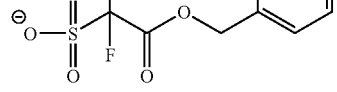
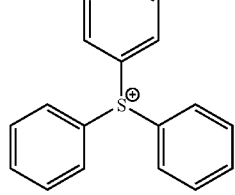
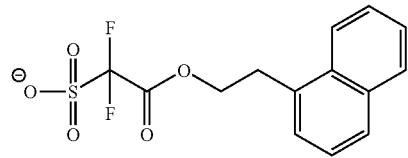
108
-continued
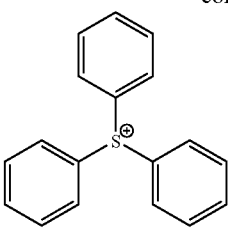
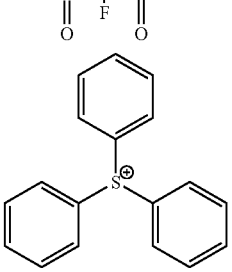
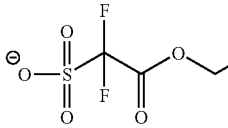
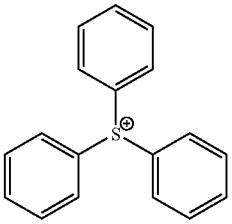
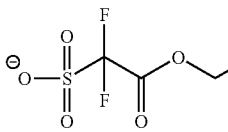
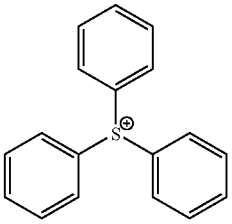
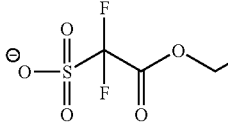
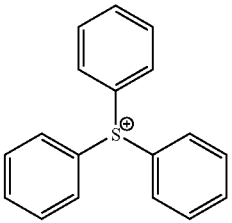

109
-continued
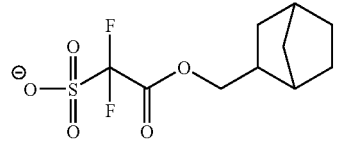
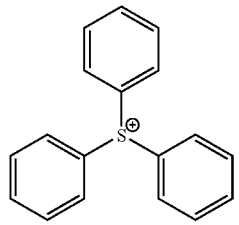
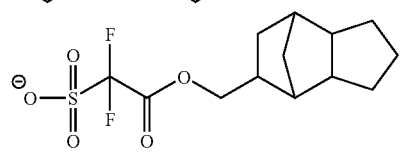
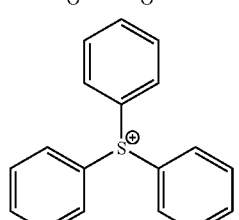
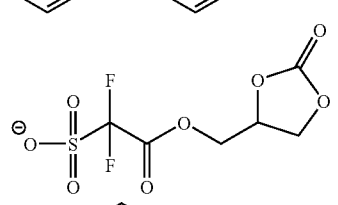
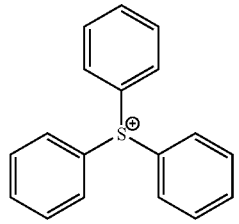
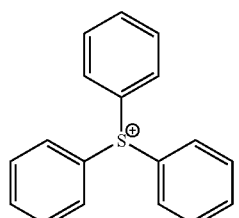
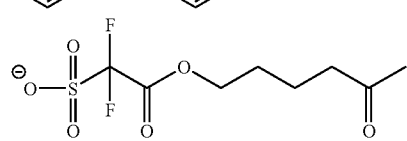
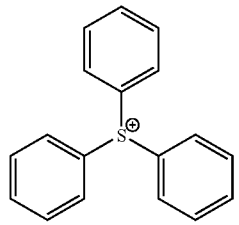
110
-continued
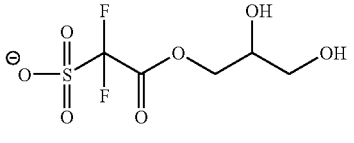
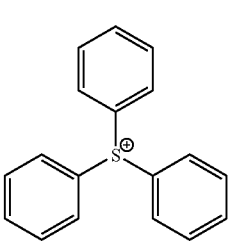
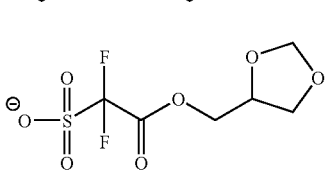
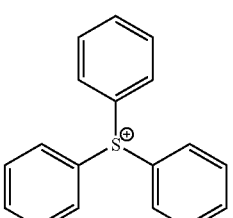
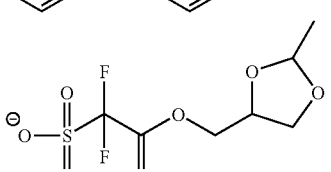
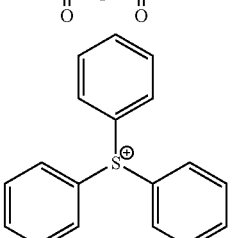
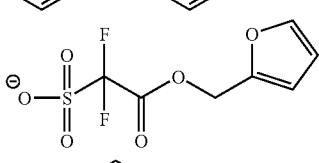
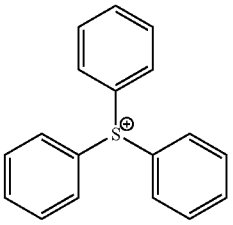
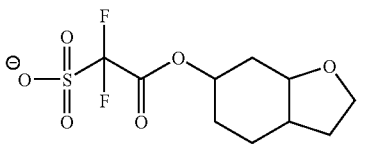

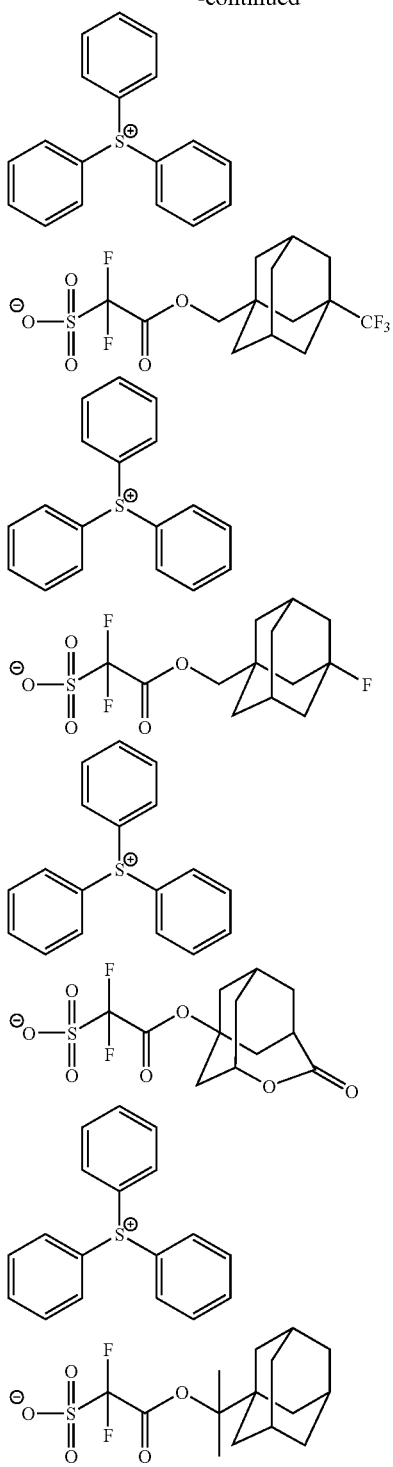

The acid generators can be used either individually or in combination.

The content of the acid generators is preferably in the range of 0.1 to 20 mass %, more preferably 0.5 to 15 mass % and still more preferably 1 to 10 mass % based on the total solids of the photosensitive composition.

3. Solvent

The resist composition of the present invention may contain a solvent. The solvent is not limited as long as it can be used in the preparation of a positive resist composition through dissolution of the above-mentioned components. As the solvent, there can be mentioned, for example, an organic solvent, such as an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate or an alkyl pyruvate.

As preferred alkylene glycol monoalkyl ether carboxylates, there can be mentioned, for example, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

As preferred alkylene glycol monoalkyl ethers, there can be mentioned, for example, propylene glycol monomethyl ether, propylene glycol monoethyl ether, propylene glycol monopropyl ether, propylene glycol monobutyl ether, ethylene glycol monomethyl ether and ethylene glycol monoethyl ether.

As preferred alkyl lactates, there can be mentioned, for example, methyl lactate, ethyl lactate, propyl lactate and butyl lactate.

As preferred alkyl alkoxypropionates, there can be mentioned, for example, ethyl 3-ethoxypropionate, methyl 3-methoxypropionate, methyl 3-ethoxypropionate and ethyl 3-methoxypropionate.

As preferred cyclolactones, there can be mentioned, for example, β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

As preferred optionally cyclized monoketone compounds, there can be mentioned, for example, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

As preferred alkylene carbonates, there can be mentioned, for example, propylene carbonate, vinylene carbonate, ethylene carbonate and butylene carbonate.

As preferred alkyl alkoxyacetates, there can be mentioned, for example, acetic acid 2-methoxyethyl ester, acetic acid 2-ethoxyethyl ester, acetic acid 2-(2-ethoxyethoxy)ethyl ester, acetic acid 3-methoxy-3-methylbutyl ester and acetic acid 1-methoxy-2-propyl ester.

As preferred alkyl pyruvates, there can be mentioned, for example, methyl pyruvate, ethyl pyruvate and propyl pyruvate.

As a preferably employable solvent, there can be mentioned a solvent having a boiling point of 130° C. or above measured at ordinary temperature under ordinary pressure. For example, there can be mentioned cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, acetic acid 2-ethoxyethyl ester, acetic acid 2-(2-ethoxyethoxy)ethyl ester or propylene carbonate.

In the present invention, these solvents may be used either individually or in combination.

In the present invention, a mixed solvent consisting of a mixture of a solvent having a hydroxyl group in its structure and a solvent having no hydroxyl group may be used as the organic solvent.

As the solvent having a hydroxyl group, there can be mentioned, for example, ethylene glycol, ethylene glycol monomethyl ether, ethylene glycol monoethyl ether, propylene glycol, propylene glycol monomethyl ether, propylene glycol monoethyl ether, ethyl lactate or the like. Of these, propylene glycol monomethyl ether and ethyl lactate are especially preferred.

As the solvent having no hydroxyl group, there can be mentioned, for example, propylene glycol monomethyl ether acetate, ethyl ethoxypropionate, 2-heptanone, γ-butyrolactone, cyclohexanone, butyl acetate, N-methylpyrrolidone, N,N-dimethylacetamide, dimethyl sulfoxide or the like. Of these, propylene glycol monomethyl ether acetate, ethyl ethoxypropionate, 2-heptanone, γ-butyrolactone, cyclohexanone and butyl acetate are especially preferred. Propylene glycol monomethyl ether acetate, ethyl ethoxypropionate and 2-heptanone are most preferred.

The mixing ratio (mass) of a solvent having a hydroxyl group and a solvent having no hydroxyl group is in the range of 1/99 to 99/1, preferably 10/90 to 90/10 and more preferably 20/80 to 60/40. The mixed solvent containing 50 mass % or more of a solvent having no hydroxyl group is especially preferred from the viewpoint of uniform applicability.

It is preferred for the solvent to be a mixed solvent consisting of two or more solvents containing propylene glycol monomethyl ether acetate.

4. Basic Compound

The photosensitive composition of the present invention preferably contains a basic compound so as to decrease any performance alteration over time from exposure to heating.

As preferred basic compounds, there can be mentioned the compounds having the structures of the following formulae (A) to (E).

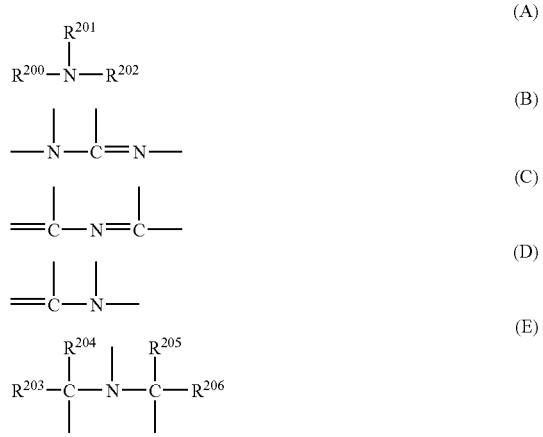

In the general formulae (A) and (E),
$R^{200}$, $R^{201}$ and $R^{202}$ may be identical to or different from each other and each represent a hydrogen atom, an alkyl group (preferably having 1 to 20 carbon atoms), a cycloalkyl group (preferably having 3 to 20 carbon atoms) or an aryl group (having 6 to 20 carbon atoms). $R^{201}$ and $R^{202}$ may be bonded with each other to thereby form a ring.

$R^{203}$, $R^{204}$, $R^{205}$ and $R^{206}$ may be identical to or different from each other and each represent an alkyl group having 1 to 20 carbon atoms.

With respect to the above alkyl group, as a preferred substituted alkyl group, there can be mentioned an aminoalkyl group having 1 to 20 carbon atoms, a hydroxyalkyl group having 1 to 20 carbon atoms or a cyanoalkyl group having 1 to 20 carbon atoms.

More preferably, in these general formulae (A) and (E) the alkyl group is unsubstituted.

As preferred compounds, there can be mentioned guanidine, aminopyrrolidine, pyrazole, pyrazoline, piperazine, aminomorpholine, aminoalkylmorpholine, piperidine and the like. Further, as preferred compounds, there can be mentioned compounds with an imidazole structure, a diazabicyclo structure, an onium hydroxide structure, an onium carboxylate structure, a trialkylamine structure, an aniline structure or a pyridine structure, alkylamine derivatives having a hydroxyl group and/or an ether bond, aniline derivatives having a hydroxyl group and/or an ether bond and the like.

As the compounds with an imidazole structure, there can be mentioned imidazole, 2,4,5-triphenylimidazole, benzimidazole, 2-phenylbenzoimidazole and the like. As the compounds with a diazabicyclo structure, there can be mentioned 1,4-diazabicyclo[2,2,2]octane, 1,5-diazabicyclo[4,3,0]non-5-ene, 1,8-diazabicyclo[5,4,0]undec-7-ene and the like. As the compounds with an onium hydroxide structure, there can be mentioned tetrabutylammonium hydroxide, triarylsulfonium hydroxide, phenacylsulfonium hydroxide, and sulfonium hydroxides having a 2-oxoalkyl group such as triphenylsulfonium hydroxide, tris(t-butylphenyl)sulfonium hydroxide, bis(t-butylphenyl)iodonium hydroxide, phenacylthiophenium hydroxide, 2-oxopropylthiophenium hydroxide and the like. As the compounds with an onium carboxylate structure, there can be mentioned those having a carboxylate at the anion moiety of the compounds with an onium hydroxide structure, for example, acetate, adamantane-1-carboxylate, perfluoroalkyl carboxylate and the like. As the compounds with a trialkylamine structure, there can be mentioned tri(n-butyl)amine, tri(n-octyl)amine and the like. As the aniline compounds, there can be mentioned 2,6-diisopropylaniline, N,N-dimethylaniline, N,N-dibutylaniline, N,N-dihexylaniline and the like. As the alkylamine derivatives having a hydroxyl group and/or an ether bond, there can be mentioned ethanolamine, diethanolamine, triethanolamine, N-phenyldiethanolamine, tris(methoxyethoxyethyl) amine and the like. As the aniline derivatives having a hydroxyl group and/or an ether bond, there can be mentioned N,N-bis(hydroxyethyl)aniline and the like.

As preferred basic compounds, there can be further mentioned an amine compound having a phenoxy group, an ammonium salt compound having a phenoxy group, an amine compound having a sulfonic ester group and an ammonium salt compound having a sulfonic ester group.

As the amine compound, use can be made of primary, secondary and tertiary amine compounds. An amine compound having its at least one alkyl group bonded to the nitrogen atom thereof is preferred. Among the amine compounds, a tertiary amine compound is more preferred. In the amine compounds, as long as at least one alkyl group (preferably having 1 to 20 carbon atoms) is bonded to the nitrogen atom, a cycloalkyl group (preferably having 3 to 20 carbon atoms) or an aryl group (preferably having 6 to 12 carbon atoms)

besides the alkyl group may be bonded to the nitrogen atom. In the amine compounds, it is preferred for the alkyl chain to contain an oxygen atom so as to form an oxyalkylene group. The number of oxyalkylene groups in each molecule is one or more, preferably 3 to 9 and more preferably 4 to 6. The oxyalkylene group is preferably an oxyethylene group ($-CH_2CH_2O-$) or an oxypropylene group ($-CH(CH_3)CH_2O-$ or $-CH_2CH_2CH_2O-$), more preferably an oxyethylene group.

As the ammonium salt compound, use can be made of primary, secondary, tertiary and quaternary ammonium salt compounds. An ammonium salt compound having its at least one alkyl group bonded to the nitrogen atom thereof is preferred. Of the ammonium salt compounds, as long as at least one alkyl group (preferably having 1 to 20 carbon atoms) is bonded to the nitrogen atom, a cycloalkyl group (preferably having 3 to 20 carbon atoms) or an aryl group (preferably having 6 to 12 carbon atoms) besides the alkyl group may be bonded to the nitrogen atom. Of the ammonium salt compounds, it is preferred for the alkyl chain to contain an oxygen atom so as to form an oxyalkylene group. The number of oxyalkylene groups in each molecule is one or more, preferably 3 to 9 and still more preferably 4 to 6. The oxyalkylene group is preferably an oxyethylene group ($-CH_2CH_2O-$) or an oxypropylene group ($-CH(CH_3)CH_2O-$ or $-CH_2CH_2CH_2O-$), more preferably an oxyethylene group.

As the anion of the ammonium salt compounds, there can be mentioned a halide, a sulfonate, a borate, a phosphate or the like. Of these, a halide and a sulfonate are preferred. Among halides, chloride, bromide and iodide are especially preferred. Among sulfonates, an organic sulfonate having 1 to 20 carbon atoms is especially preferred. As the organic sulfonate, there can be mentioned an aryl sulfonate and an alkyl sulfonate having 1 to 20 carbon atoms. The alkyl group of the alkyl sulfonate may have a substituent. As the substituent, there can be mentioned, for example, fluorine, chlorine, bromine, an alkoxy group, an acyl group, an aryl group or the like. As specific examples of the alkyl sulfonates, there can be mentioned methane sulfonate, ethane sulfonate, butane sulfonate, hexane sulfonate, octane sulfonate, benzyl sulfonate, trifluoromethane sulfonate, pentafluoroethane sulfonate, nonafluorobutane sulfonate and the like. As the aryl group of the aryl sulfonate, there can be mentioned a benzene ring, a naphthalene ring or an anthracene ring. The benzene ring, naphthalene ring or anthracene ring may have a substituent. As preferred substituents, there can be mentioned a linear or branched alkyl group having 1 to 6 carbon atoms and a cycloalkyl group having 3 to 6 carbon atoms. As specific examples of the linear or branched alkyl groups and cycloalkyl groups, there can be mentioned methyl, ethyl, n-propyl, isopropyl, n-butyl, i-butyl, t-butyl, n-hexyl, cyclohexyl and the like. As other substituents, there can be mentioned an alkoxy group having 1 to 6 carbon atoms, a halogen atom, cyano, nitro, an acyl group, an acyloxy group and the like.

The amine compound having a phenoxy group and ammonium salt compound having a phenoxy group are those having a phenoxy group at the end of the alkyl group of the amine compound or ammonium salt compound opposed to the nitrogen atom. The phenoxy group may have a substituent. As the substituent of the phenoxy group, there can be mentioned, for example, an alkyl group, an alkoxy group, a halogen atom, a cyano group, a nitro group, a carboxyl group, a carboxylic ester group, a sulfonic ester group, an aryl group, an aralkyl group, an acyloxy group, an aryloxy group or the like. The substitution position of the substituent may be any of 2- to 6-positions. The number of substituents is optional within the range of 1 to 5.

It is preferred that at least one oxyalkylene group exist between the phenoxy group and the nitrogen atom. The number of oxyalkylene groups in each molecule is one or more, preferably 3 to 9 and more preferably 4 to 6. The oxyalkylene group is preferably an oxyethylene group ($-CH_2CH_2O-$) or an oxypropylene group ($-CH(CH_3)CH_2O-$ or $-CH_2CH_2CH_2O-$), more preferably an oxyethylene group.

The sulfonic ester group of the amine compound having a sulfonic ester group or ammonium salt compound having a sulfonic ester group may be any of an alkylsulfonic ester, a cycloalkylsulfonic ester and an arylsulfonic ester. In the alkylsulfonic ester, the alkyl group preferably has 1 to 20 carbon atoms. In the cycloalkylsulfonic ester, the cycloalkyl group preferably has 3 to 20 carbon atoms. In the arylsulfonic ester, the aryl group preferably has 6 to 12 carbon atoms. The alkylsulfonic ester, cycloalkylsulfonic ester and arylsulfonic ester may have substituents. As preferred substituents, there can be mentioned a halogen atom, a cyano group, a nitro group, a carboxyl group, a carboxylic ester group and a sulfonic ester group.

It is preferred that at least one oxyalkylene group exist between the sulfonic ester group and the nitrogen atom. The number of oxyalkylene groups in each molecule is one or more, preferably 3 to 9 and more preferably 4 to 6. The oxyalkylene group is preferably an oxyethylene group ($-CH_2CH_2O-$) or an oxypropylene group ($-CH(CH_3)CH_2O-$ or $-CH_2CH_2CH_2O-$), more preferably an oxyethylene group.

These basic compounds are used either individually or in combination.

The amount of basic compound used is generally in the range of 0.001 to 10 mass %, preferably 0.01 to 5 mass % based on the solid contents of the resist composition.

With respect to the ratio of the acid generator to basic compound used in the composition, preferably, the acid generator/basic compound (molar ratio)=2.5 to 300. The reason for this is that the molar ratio is preferred to be 2.5 or higher from the viewpoint of sensitivity and resolving power. The molar ratio is preferred to be 300 or below from the viewpoint of the inhibition of any resolving power deterioration due to thickening of resist pattern over time from exposure to heating treatment. The acid generator/basic compound (molar ratio) is more preferably in the range of 5.0 to 200, still more preferably 7.0 to 150.

5. Other Additives

[Surfactant]

The resist composition of the present invention preferably further contains a surfactant, and more preferably contains any one, or two or more members, of fluorinated and/or siliconized surfactants (fluorinated surfactant, siliconized surfactant and surfactant containing both fluorine and silicon atoms).

The resist composition of the present invention when containing the above surfactant would, in the use of an exposure light source of 250 nm or below, especially 220 nm or below, realize favorable sensitivity and resolving power and produce a resist pattern with less adhesion and development defects.

As the fluorinated and/or siliconized surfactants, there can be mentioned, for example, those described in JP-A's-62-36663, 61-226746, 61-226745, 62-170950, 63-34540, 7-230165, 8-62834, 9-54432, 9-5988 and 2002-277862 and U.S. Pat. Nos. 5,405,720, 5,360,692, 5,529,881, 5,296,330, 5,436,098, 5,576,143, 5,294,511 and 5,824,451. Any of the following commercially available surfactants can be used as is.

As useful commercially available surfactants, there can be mentioned, for example, fluorinated surfactants/siliconized surfactants, such as Eftop EF301 and EF303 (produced by Shin-Akita Kasei Co., Ltd.), Florad FC 430, 431 and 4430 (produced by Sumitomo 3M Ltd.), Megafac F171, F173, F176, F189, F113, F110, F177, F120 and R08 (produced by Dainippon Ink & Chemicals, Inc.), Surflon S-382, SC101, 102, 103, 104, 105 and 106 (produced by Asahi Glass Co., Ltd.), Troy Sol S-366 (produced by Troy Chemical Co., Ltd.), GF-300 and GF-150 (produced by TOAGOSEI CO., LTD.), Sarfron S-393 (produced by SEIMI CHEMICAL CO., LTD.), Eftop EF121, EF122A, EF122B, RF122C, EF125M, EF135M, EF351, EF352, EF801, EF802 and EF601 (produced by JEMCO INC.), PF636, PF656, PF6320 and PF6520 (produced by OMNOVA), and FTX-204G, 208G, 218G, 230G, 204D, 208D, 212D, 218D and 222D (produced by NEOS). Further, polysiloxane polymer KP-341 (produced by Shin-Etsu Chemical Co., Ltd.) can be employed as the siliconized surfactant.

As the surfactant, besides the above publicly known surfactants, use can be made of a surfactant based on a polymer having a fluorinated aliphatic group derived from a fluorinated aliphatic compound, produced by a telomerization technique (also called a telomer process) or an oligomerization technique (also called an oligomer process). The fluorinated aliphatic compound can be synthesized by the process described in JP-A-2002-90991.

The polymer having a fluorinated aliphatic group is preferably a copolymer from a monomer having a fluorinated aliphatic group and a poly(oxyalkylene)acrylate and/or poly(oxyalkylene)methacrylate, which copolymer may have an irregular distribution or may result from block copolymerization. As the poly(oxyalkylene) group, there can be mentioned a poly(oxyethylene) group, a poly(oxypropylene) group, a poly(oxybutylene) group or the like. Further, use can be made of a unit having alkylene groups of different chain lengths in a single chain, such as poly(oxyethylene-oxypropylene-oxyethylene block concatenation) or poly(oxyethylene-oxypropylene block concatenation). Moreover, the copolymer from a monomer having a fluorinated aliphatic group and a poly(oxyalkylene)acrylate (or methacrylate) is not limited to two-monomer copolymers and may be a three or more monomer copolymer obtained by simultaneous copolymerization of two or more different monomers having a fluorinated aliphatic group, two or more different poly(oxyalkylene)acrylates (or methacrylates), etc.

For example, as a commercially available surfactant, there can be mentioned Megafac F178, F-470, F-473, F-475, F-476 or F-472 (produced by Dainippon Ink & Chemicals, Inc.). Further, there can be mentioned a copolymer from an acrylate (or methacrylate) having a $C_6F_{13}$ group and a poly(oxyalkylene)acrylate (or methacrylate), a copolymer from an acrylate (or methacrylate) having a $C_3F_7$ group, poly(oxyethylene)acrylate (or methacrylate) and poly(oxypropylene)acrylate (or methacrylate), or the like.

In the present invention, surfactants other than the fluorinated and/or siliconized surfactants can also be employed. In particular, there can be mentioned, for example, nonionic surfactants including a polyoxyethylene alkyl ether such as polyoxyethylene lauryl ether, polyoxyethylene stearyl ether, polyoxyethylene cetyl ether or polyoxyethylene oleyl ether, a polyoxyethylene alkylaryl ether such as polyoxyethylene octylphenol ether or polyoxyethylene nonylphenol ether, a polyoxyethylene-polyoxypropylene block copolymer, a sorbitan fatty acid ester such as sorbitan monolaurate, sorbitan monopalmitate, sorbitan monostearate, sorbitan monooleate, sorbitan trioleate or sorbitan tristearate, a polyoxyethylene sorbitan fatty acid ester such as polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate, or the like.

These surfactants may be used either individually or in combination.

The amount of surfactant used is preferably in the range of 0 to 2 mass %, more preferably 0.0001 to 2 mass %, and most preferably 0.0005 to 1 mass % based on the total mass of the resist composition (excluding the solvent).

[Development Accelerator]

The resist composition of the present invention may further contain a compound capable of increasing the solubility thereof in a developer. For example, a phenolic compound of 1000 or less molecular weight, a carboxylated alicyclic or aliphatic compound or the like can be contained.

The above phenolic compound of 1000 or less molecular weight can be easily synthesized by persons of ordinary skill in the art to which the present invention pertains while consulting the processes described in, for example, JP-As 4-122938 and 2-28531, U.S. Pat. No. 4,916,210 and EP 219294.

As the carboxylated alicyclic or aliphatic compound, there can be mentioned, for example, a carboxylic acid derivative of steroid structure such as cholic acid, deoxycholic acid or lithocholic acid, an adamantanecarboxylic acid derivative, adamantanedicarboxylic acid, cyclohexanecarboxylic acid, cyclohexanedicarboxylic acid or the like. These are however nonlimiting.

Method of Forming Pattern

From the viewpoint of enhancement of resolving power, it is preferred for the positive resist composition of the present invention to be used with a film thickness of 30 to 250 nm. More preferably, the positive resist composition is used with a film thickness of 30 to 200 nm. This film thickness can be attained by setting the solid content of the positive resist composition within an appropriate range so as to cause the composition to have an appropriate viscosity, thereby improving the applicability and film forming property.

The total solid content of the positive resist composition is generally in the range of 1 to 10 mass %, preferably 1 to 8.0 mass % and more preferably 1.0 to 6.0 mass %.

The positive resist composition of the present invention is used in such a manner that the above components are dissolved in a given organic solvent, preferably the above mixed solvent, and filtered and applied onto a given support in the following manner. The filter medium for the filtration preferably consists of a polytetrafluoroethylene, polyethylene or nylon having a pore size of 0.1 μm or less, especially 0.05 μm or less and more especially 0.03 μm or less.

For example, the positive resist composition is applied onto a substrate, such as one for use in the production of precision integrated circuit elements (e.g., silicon/silicon dioxide coating), by appropriate application means, such as a spinner or coater, and dried to thereby form a resist film. In a preferred drying method, the solvent is evaporated by heating (pre-bake [PB]).

The obtained resist film is exposed through a given mask to actinic rays or radiation. The exposed resist film is developed and rinsed. Preferably, before the development, the exposed resist film is baked (post-exposure bake [PEB]). After the rinse, preferably, the film is further heated (post-bake).

The PB temperature is generally in the range of 50 to 200° C., preferably 60 to 150° C., more preferably 70 to 130° C. and most preferably 80 to 100° C. When the temperature is too low, unfavorably, a deterioration of lithographic performance by an excessive solvent remaining in the resist film might become a problem. When the temperature is too high, unfavorably, decompositions of the resist polymer and acid generator might become a problem. The PB duration is generally in the range of 10 to 300 seconds, preferably 20 to 200 seconds and more preferably 30 to 100 seconds. When the duration is too short, unfavorably, it would be difficult to realize the drying effect. When the duration is too long, unfavorably, the productivity would lower.

The PEB temperature is generally in the range of 50 to 200° C., preferably 60 to 150° C. and more preferably 70 to 130° C. When the temperature is too low, the progress of deprotection reaction by an acid catalyst being unsatisfactory so as to cause a sensitivity deterioration might become a problem. When the temperature is too high, the diffusion of acid catalyst being excessive so as to cause a resolving power deterioration might become a problem. The PEB duration is generally in the range of 10 to 300 seconds, preferably 20 to 200 seconds and more preferably 30 to 100 seconds. When the duration is too short, unfavorably, a problem by in-plane nonuniformity of heat might occur. When the duration is too long, unfavorably, the productivity would lower.

The post-bake temperature is generally in the range of 50 to 200° C., preferably 75 to 175° C. and more preferably 100 to 150° C. When the temperature is too low, the possibility of a rinse liquid residue would be a concern. When the temperature is too high, the pyrolysis of resist pattern might be a problem.

The post-bake duration is generally in the range of 10 to 300 seconds, preferably 20 to 200 seconds and more preferably 30 to 100 seconds. When the duration is too short, unfavorably, the possibility of a rinse liquid residue would be a concern. When the duration is too long, unfavorably, the productivity would lower.

A desirable pattern can be formed by the above-described process.

As the actinic rays or radiation, there can be mentioned infrared rays, visible light, ultraviolet rays, far ultraviolet rays, X-rays, electron beams or the like. Among them, preferred use is made of far ultraviolet rays of especially 250 nm or less, more especially 220 nm or less and still more especially 1 to 200 nm wavelength, such as a KrF excimer laser (248 nm), an ArF excimer laser (193 nm) and an $F_2$ excimer laser (157 nm), as well as X-rays, electron beams and the like. More preferred use is made of an ArF excimer laser, an $F_2$ excimer laser, EUV (13 nm) and electron beams.

Prior to the formation of a resist film, the substrate may be coated with an antireflection film.

As the antireflection film, use can be made of not only an inorganic film of titanium, titanium oxide, titanium nitride, chromium oxide, carbon, amorphous silicon or the like but also an organic film composed of a light absorber and a polymer material. Also, as the organic antireflection film, use can be made of commercially available organic antireflection films, such as the DUV30 Series and DUV40 Series produced by Brewer Science Inc. and AR-2, AR-3 and AR-5 produced by Shipley Co., Ltd.

In the development step, an alkali developer is used as follows. As the alkali developer for a positive resist composition, use can be made of any of alkaline aqueous solutions of an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide or tetraethylammonium hydroxide, a cycloamine such as pyrrole or piperidine, or the like.

Before the use of the above alkali developer, appropriate amounts of an alcohol and a surfactant may be added thereto.

The alkali concentration of the alkali developer is generally in the range of 0.1 to 20 mass %.

The pH value of the alkali developer is generally in the range of 10.0 to 15.0.

Before the use of the above alkaline aqueous solution, appropriate amounts of an alcohol and a surfactant may be added thereto.

Pure water can be used as the rinse liquid. Before the use, an appropriate amount of surfactant may be added thereto.

The development operation or rinse operation may be followed by the operation for removing any developer or rinse liquid adhering onto the pattern by the use of a supercritical fluid.

At the time of irradiation with actinic rays or radiation, exposure (liquid immersion exposure) may be carried out after filling the interstice between resist film and lens with a liquid (liquid immersion medium, liquid for liquid immersion) of refractive index higher than that of air. This would bring about an enhancement of resolving power. Any liquid with a refractive index higher than that of air can be employed as the liquid immersion medium. Preferably, pure water is employed.

The liquid for liquid immersion for use in the liquid immersion exposure will now be described.

The liquid for liquid immersion preferably consists of a liquid being transparent in exposure wavelength whose temperature coefficient of refractive index is as low as possible so as to ensure minimization of any distortion of optical image projected on the resist film. Especially in the use of an ArF excimer laser (wavelength: 193 nm) as an exposure light source, however, it is more preferred to use water from not only the above viewpoints but also the viewpoints of easy procurement and easy handling.

Further, from the viewpoint of refractive index increase, use can be made of a medium of 1.5 or higher refractive index. Such a medium may be an aqueous solution or an organic solvent.

In the use of water as a liquid for liquid immersion, a slight proportion of additive (liquid) that would not dissolve the resist film on a wafer and would be negligible with respect to its influence on an optical coat for an under surface of lens element may be added in order to not only decrease the surface tension of water but also increase a surface activating power. The additive is preferably an aliphatic alcohol with a refractive index approximately equal to that of water, for example, methyl alcohol, ethyl alcohol, isopropyl alcohol or the like. The addition of an alcohol with a refractive index approximately equal to that of water is advantageous in that even when the alcohol component is evaporated from water to thereby cause a change of content concentration, the change of refractive index of the liquid as a whole can be minimized. On the other hand, when a substance being opaque in 193 nm rays or an impurity whose refractive index is greatly different from that of water is mixed therein, the mixing would invite a distortion of optical image projected on the resist film. Accordingly, it is preferred to use distilled water as the liquid immersion water. Furthermore, use may be made of pure water having been filtered through an ion exchange filter or the like.

Desirably, the electrical resistance of the water is 18.3 MΩcm or higher, and the TOC (organic matter concentration) thereof is 20 ppb or below. Prior deaeration of the water is desired.

Raising the refractive index of the liquid for liquid immersion would enable an enhancement of lithography performance. From this viewpoint, an additive suitable for refractive index increase may be added to the water, or heavy water ($D_2O$) may be used in place of water.

In the exposure of the resist film of the photosensitive resist composition of the present invention via the liquid immersion medium, a hydrophobic resin (HR) may be further added according to necessity. This would bring about uneven localization of the hydrophobic resin (HR) on the surface layer of the resist film. When the liquid immersion medium is water, there would be attained an improvement of receding contact angle on the surface of the resist film with reference to water upon formation of the resist film, and accordingly an enhancement of the liquid immersion water tracking property. Although the hydrophobic resin (HR) is not particularly limited as long as an improvement of receding contact angle on the surface is realized by the addition thereof, it is preferred to employ a resin having at least either a fluorine atom or a silicon atom. The receding contact angle of the resist film is preferably in the range of 60° to 90°, more preferably 70° or higher. The amount of resin added can be appropriately regulated so that the receding contact angle of the resist film falls within the above range. However, the addition amount is preferably in the range of 0.1 to 10 mass %, more preferably 0.1 to 5 mass % based on the total solids of the positive resist composition. Although the hydrophobic resin (HR) is unevenly localized on the interface as aforementioned, differing from the surfactant, the hydrophobic resin does not necessarily have to have a hydrophilic group in its molecule and does not need to contribute toward uniform mixing of polar/nonpolar substances.

The receding contact angle refers to a contact angle determined when the contact line at a droplet-substrate interface draws back. It is generally known that the receding contact angle is useful in the simulation of droplet mobility in a dynamic condition. In a simple definition, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

In the operation of liquid immersion exposure, it is needed for the liquid for liquid immersion to move on a wafer while tracking the movement of an exposure head involving high-speed scanning on the wafer and thus forming an exposure pattern. Therefore, the contact angle of the liquid for liquid immersion with respect to the resist film in dynamic condition is important, and it is required for the resist to be capable of tracking the high-speed scanning of the exposure head without leaving any droplets.

The fluorine atom or silicon atom of the hydrophobic resin (HR) may be present in the principal chain of the resin or may be a substituent on the side chain thereof.

The hydrophobic resin (HR) is preferably a resin having an alkyl group containing a fluorine atom, a cycloalkyl group containing a fluorine atom or an aryl group containing a fluorine atom as a partial structure containing a fluorine atom.

The alkyl group containing a fluorine atom (preferably having 1 to 10 carbon atoms, more preferably 1 to 4 carbon atoms) is a linear or branched alkyl group having at least one hydrogen atom thereof substituted with a fluorine atom. Further, other substituents may be possessed.

The cycloalkyl group containing a fluorine atom is a cycloalkyl group of a single ring or multiple rings having at least one hydrogen atom thereof substituted with a fluorine atom. Further, other substituents may be contained.

As the aryl group containing a fluorine atom, there can be mentioned one having at least one hydrogen atom of an aryl group, such as a phenyl or naphthyl group, substituted with a fluorine atom. Further, other substituents may be contained.

As preferred alkyl groups containing a fluorine atom, cycloalkyl groups containing a fluorine atom and aryl groups containing a fluorine atom, there can be mentioned groups of the following general formulae (F2) to (F4), which however in no way limit the scope of the present invention.

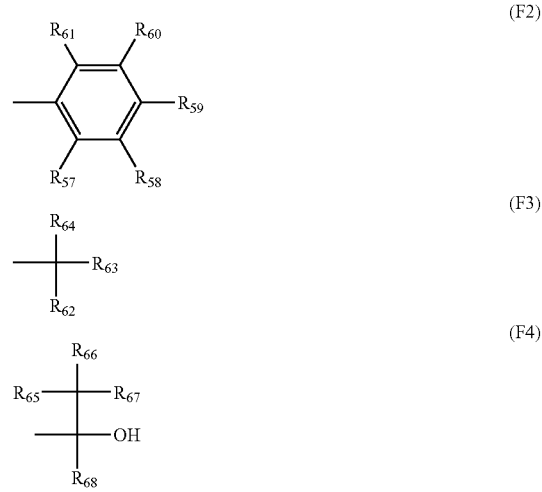

In the general formulae (F2) to (F4), each of $R_{57}$ to $R_{68}$ independently represents a hydrogen atom, a fluorine atom or an alkyl group, provided that at least one of each of $R_{57}$-$R_{61}$, $R_{62}$-$R_{64}$ and $R_{65}$-$R_{68}$ represents a fluorine atom or an alkyl group (preferably having 1 to 4 carbon atoms) having at least one hydrogen atom thereof substituted with a fluorine atom. It is preferred that all of $R_{57}$-$R_{61}$ and $R_{65}$-$R_{67}$ represent fluorine atoms. Each of $R_{62}$, $R_{63}$ and $R_{68}$ preferably represents an alkyl group (especially having 1 to 4 carbon atoms) having at least one hydrogen atom thereof substituted with a fluorine atom, more preferably a perfluoroalkyl group having 1 to 4 carbon atoms. $R_{62}$ and $R_{63}$ may be bonded with each other to thereby form a ring.

Specific examples of the groups of the general formula (F2) include a p-fluorophenyl group, a pentafluorophenyl group, a 3,5-di(trifluoromethyl)phenyl group and the like.

Specific examples of the groups of the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of the general formula (F4) include —C(CF$_3$)$_2$OH, —C(C$_2$F$_5$)$_2$OH, —C(CF$_3$)(CF$_3$)OH, —CH(CF$_3$)OH and the like. —C(CF$_3$)$_2$OH is preferred.

Specific examples of the repeating units having a fluorine atom will be shown below, which however in no way limit the scope of the present invention.

In the specific examples, X$_1$ represents a hydrogen atom, —CH$_3$, —F or —CF$_3$.

X$_2$ represents —F or —CF$_3$.

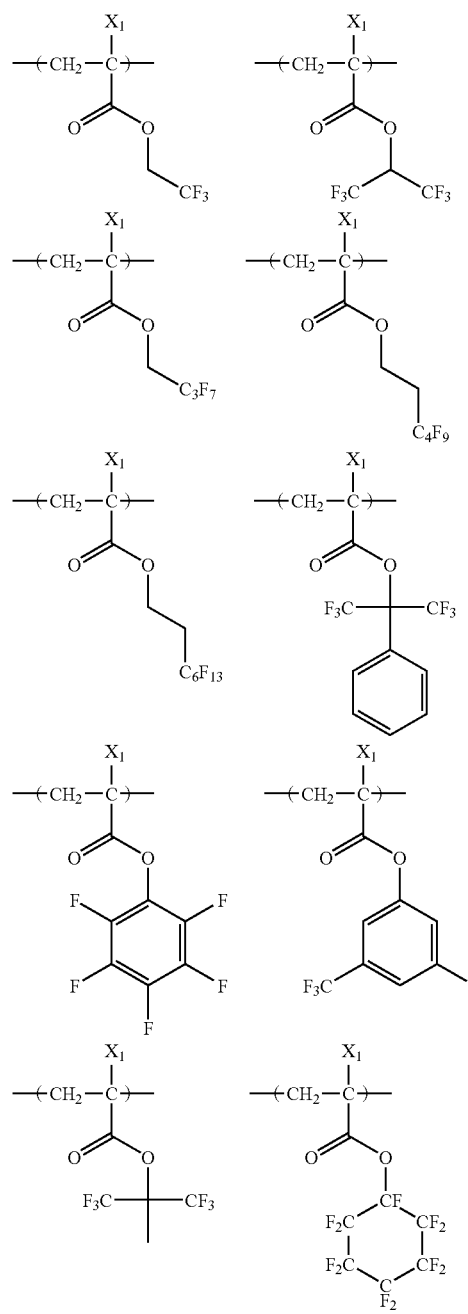
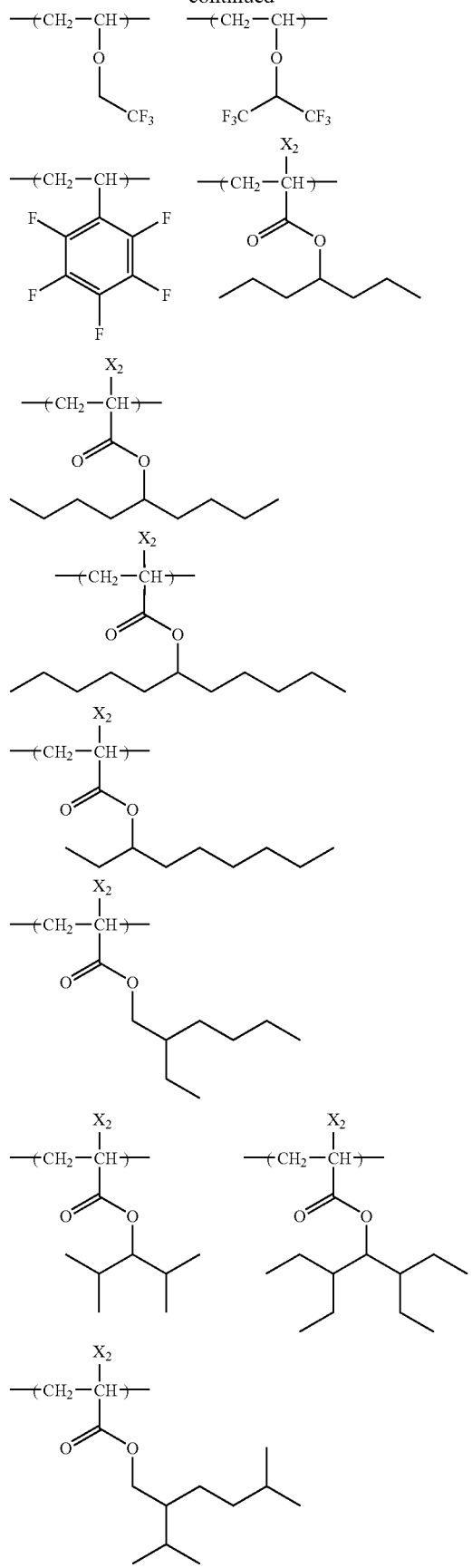

-continued

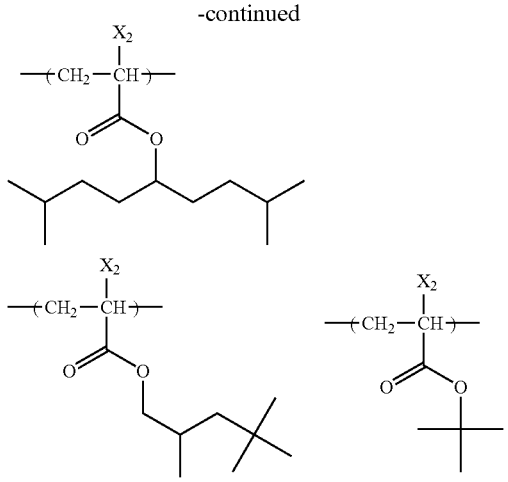

The hydrophobic resin (HR) is preferably a resin having an alkylsilyl structure (preferably a trialkylsilyl group) or a cyclosiloxane structure as a partial structure having a silicon atom.

As the alkylsilyl structure or cyclosiloxane structure, there can be mentioned, for example, any of the groups of the following general formulae (CS-1) to (CS-3) or the like.

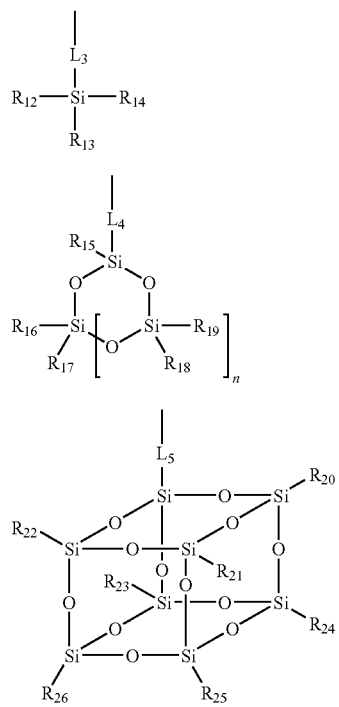

In the general formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a bivalent connecting group. As the bivalent connecting group, there can be mentioned any one or a combination of two or more groups selected from the group consisting of an alkylene group, a phenylene group, an ether group, a thioether group, a carbonyl group, an ester group, an amido group, a urethane group and a urea group.

n is an integer of 1 to 5.

Specific examples of the repeating units having the groups of the general formulae (CS-1) to (CS-3) will be shown below, which however in no way limit the scope of the present invention.

In the specific examples, $X_1$ represents a hydrogen atom, —$CH_3$, —F or —$CF_3$.

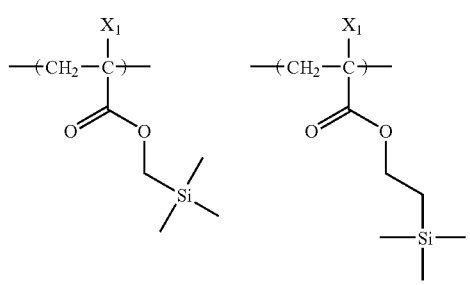

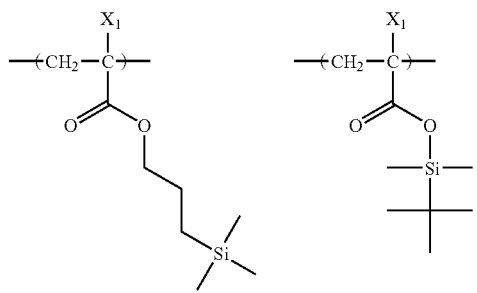

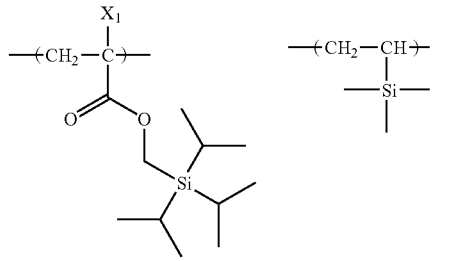

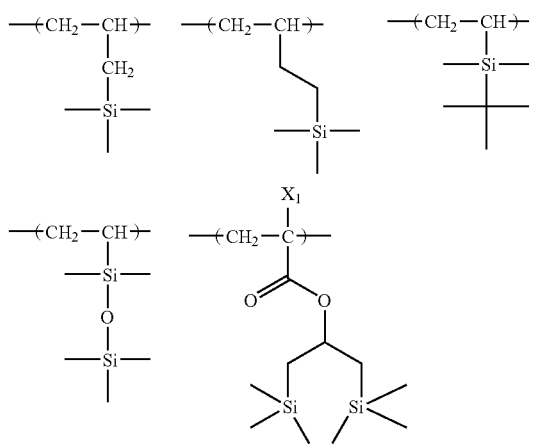

-continued

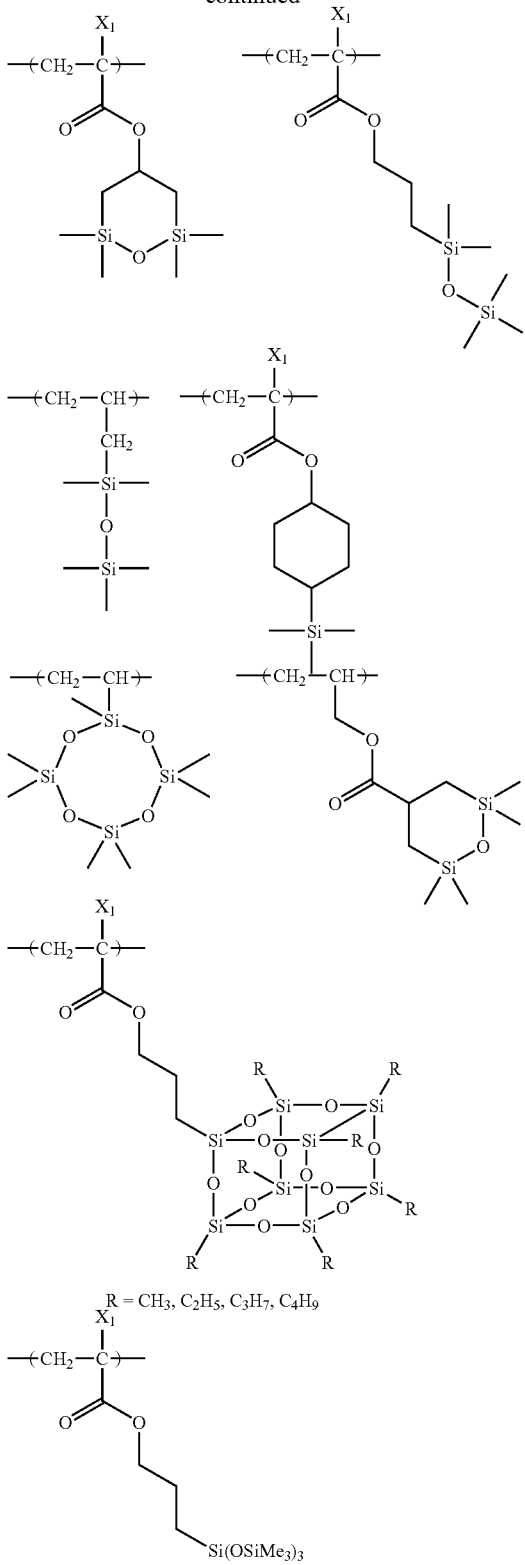

Moreover, the hydrophobic resin (HR) may have at least one group selected from among the following groups (x) to (z):

(x) an alkali soluble group,
(y) a group that is decomposed by the action of an alkali developer, resulting in an increase of solubility in the alkali developer, and
(z) a group that is decomposed by the action of an acid.

As the alkali soluble group (x), there can be mentioned a phenolic hydroxyl group, a carboxylate group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali soluble groups, there can be mentioned a fluoroalcohol group (preferably hexafluoroisopropanol), a sulfonimido group and a bis(carbonyl)methylene group.

As the repeating unit having an alkali soluble group (x), preferred use is made of any of a repeating unit resulting from direct bonding of an alkali soluble group to the principal chain of a resin like a repeating unit of acrylic acid or methacrylic acid, a repeating unit resulting from bonding, via a connecting group, of an alkali soluble group to the principal chain of a resin and a repeating unit resulting from polymerization with the use of a chain transfer agent or polymerization initiator having an alkali soluble group to thereby introduce the same in a polymer chain terminal.

The content of repeating units having an alkali soluble group (x) is preferably in the range of 1 to 50 mol %, more preferably 3 to 35 mol % and still more preferably 5 to 20 mol % based on all the repeating units of the polymer.

Specific examples of the repeating units having an alkali soluble group (x) will be shown below, which however in no way limit the scope of the present invention.

In the formulae, Rx represents H, $CH_3$, $CF_3$ or $CH_2OH$.

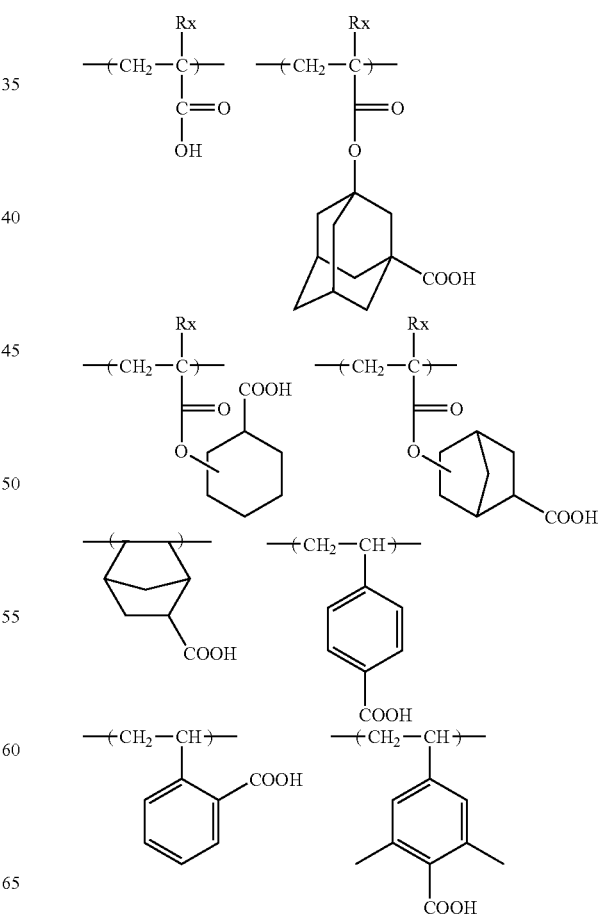

-continued
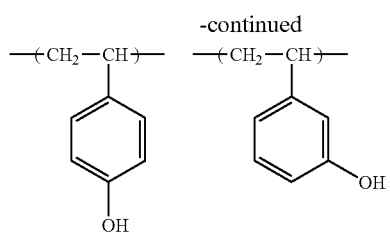
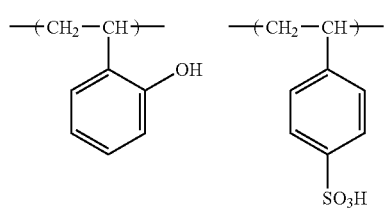
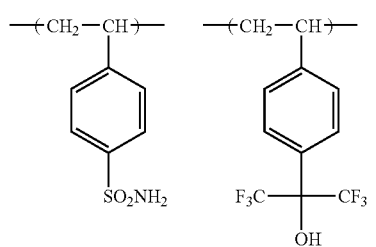
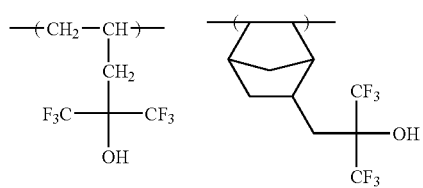
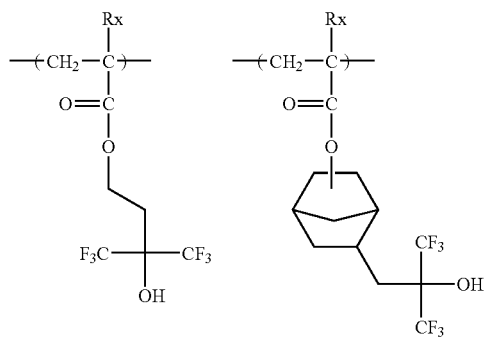
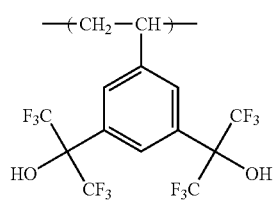
-continued
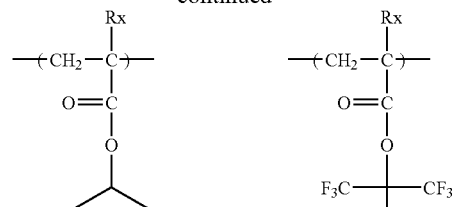
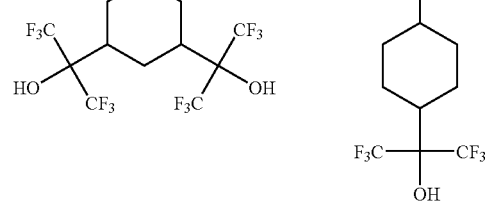
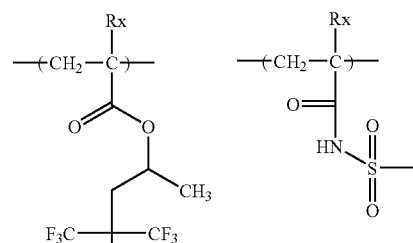
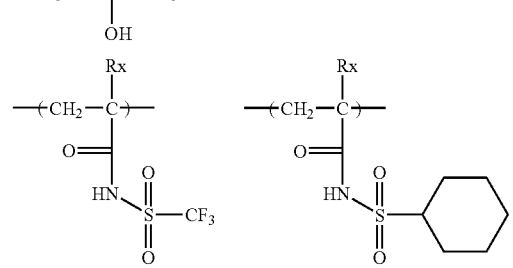
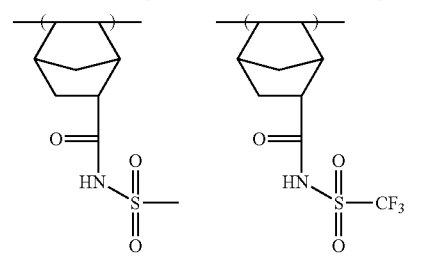
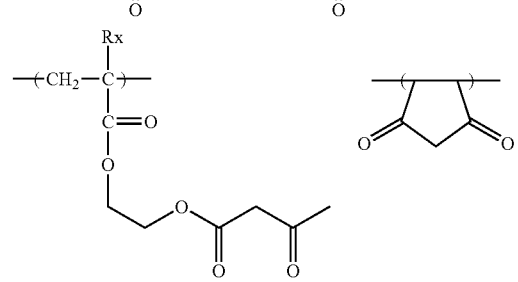
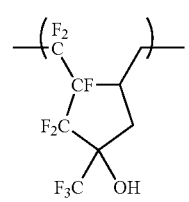
As the group (y) that is decomposed by the action of an alkali developer, resulting in an increase of solubility in the alkali developer, there can be mentioned, for example, a group having a lactone structure, an acid anhydride group, an acid imide group or the like. A group having a lactone structure is preferred.

As the repeating unit having a group (y) that is decomposed by the action of an alkali developer, resulting in an increase of solubility in the alkali developer, preferred use is made of both of a repeating unit resulting from bonding of a group (y) that is decomposed by the action of an alkali developer, resulting in an increase of solubility in the alkali developer, to the principal chain of a resin such as a repeating unit of acrylic ester or methacrylic ester, and a repeating unit resulting from polymerization with the use of a chain transfer agent or polymerization initiator having a group (y) resulting in an increase of solubility in an alkali developer to thereby introduce the same in a polymer chain terminal.

The content of repeating units having a group (y) resulting in an increase of solubility in an alkali developer is preferably in the range of 1 to 40 mol %, more preferably 3 to 30 mol % and still more preferably 5 to 15 mol % based on all the repeating units of the polymer.

As specific examples of the repeating units having a group (y) resulting in an increase of solubility in an alkali developer, there can be mentioned those similar to the repeating units having a lactone structure set forth with respect to the resins as the component (A).

As the repeating unit having a group (z) that is decomposed by the action of an acid in the hydrophobic resin (HR), there can be mentioned those similar to the repeating units having an acid decomposable group set forth with respect to the resin (A). The content of repeating units having a group (z) that is decomposed by the action of an acid in the hydrophobic resin (HR) is preferably in the range of 1 to 80 mol %, more preferably 10 to 80 mol % and still more preferably 20 to 60 mol % based on all the repeating units of the polymer.

The hydrophobic resin (HR) may further have any of the repeating units of the following general formula (IV).

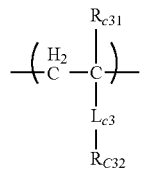

(IV)

In the general formula (IV), $R_{c31}$ represents a hydrogen atom, an alkyl group, an alkyl group substituted with a fluorine atom, a cyano group or —CH$_2$—O-Rac$_2$ group, wherein Rac$_2$ represents a hydrogen atom, an alkyl group or an acyl group. $R_{c31}$ is preferably a hydrogen atom, a methyl group, a hydroxymethyl group or a trifluoromethyl group, especially preferably a hydrogen atom or a methyl group.

$R_{c32}$ represents a group having any of an alkyl group, a cycloalkyl group, an alkenyl group and a cycloalkenyl group. These groups may optionally be substituted with a fluorine atom or a silicon atom.

$L_{c3}$ represents a single bond or a bivalent connecting group.

In the general formula (IV), the alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

Preferably, $R_{c32}$ represents an unsubstituted alkyl group or an alkyl group substituted with a fluorine atom.

The bivalent connecting group represented by $L_{c3}$ is preferably an alkylene group (preferably having 1 to 5 carbon atoms), an oxy group, a phenylene group or an ester bond (group of the formula —COO—).

Further, the hydrophobic resin (HR) may preferably have any of the repeating units of general formula (CII-AB) below.

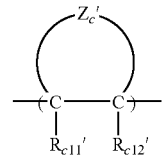

(CII-AB)

In the general formula (CII-AB), each of $R_{c11'}$ and $R_{c12'}$ independently represents a hydrogen atom, a cyano group, a halogen atom or an alkyl group.

Zc' represents an atomic group for forming an alicyclic structure which contains two bonded carbon atoms (C—C).

Specific examples of the repeating units of the general formula (IV) and general formula (CII-AB) will be shown below, which however in no way limit the scope of the present invention. In the formulae, Ra represents H, CH$_3$, CH$_2$OH, CF$_3$ or CN.

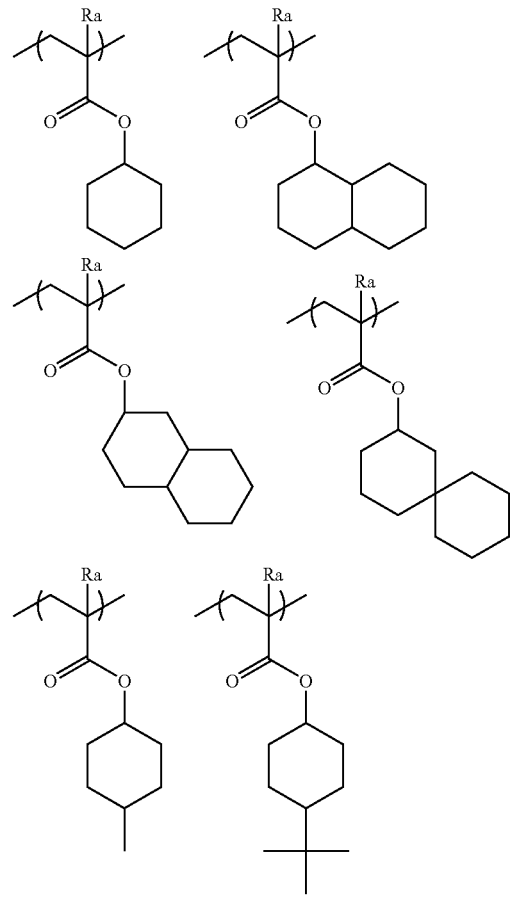

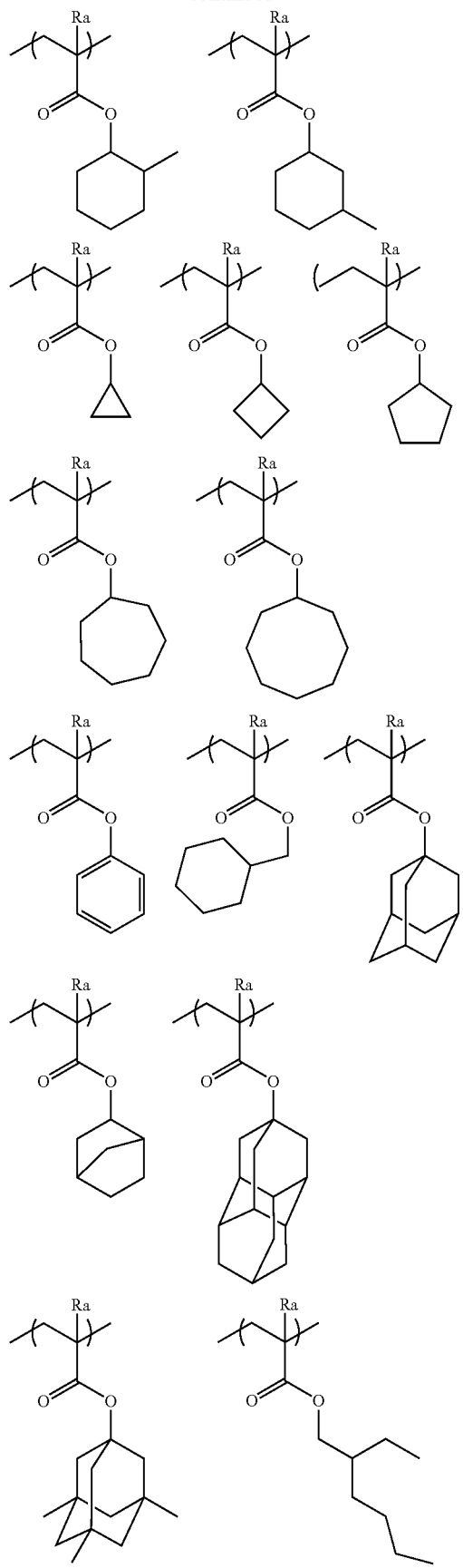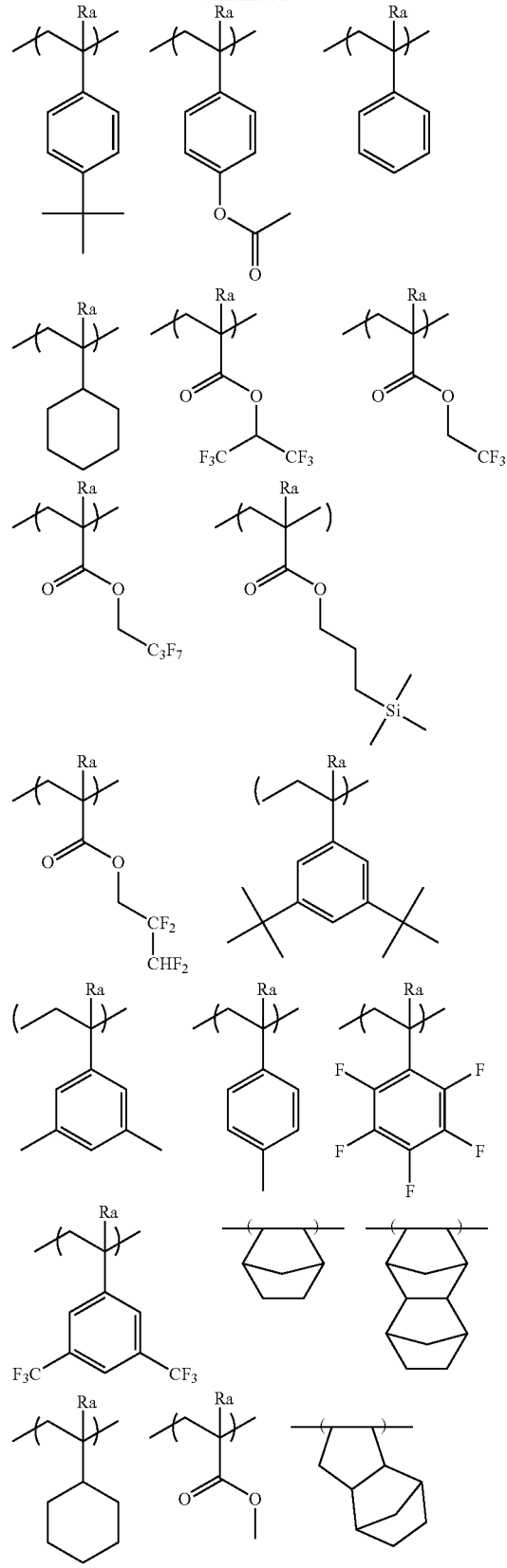
When the hydrophobic resin (HR) has a fluorine atom, the content of fluorine atom(s) is preferably in the range of 5 to 80 mass %, more preferably 10 to 80 mass %, based on the molecular weight of the hydrophobic resin (HR). The repeating unit containing a fluorine atom preferably exists in the hydrophobic resin (HR) in an amount of 10 to 100 mass %, more preferably 30 to 100 mass %.

When the hydrophobic resin (HR) has a silicon atom, the content of silicon atom(s) is preferably in the range of 2 to 50 mass %, more preferably 2 to 30 mass %, based on the molecular weight of the hydrophobic resin (HR). The repeating unit containing a silicon atom preferably exists in the hydrophobic resin (HR) in an amount of 10 to 100 mass %, more preferably 20 to 100 mass %.

The weight average molecular weight of the hydrophobic resin (HR) in terms of standard polystyrene molecular weight is preferably in the range of 1000 to 100,000, more preferably 1000 to 50,000 and still more preferably 2000 to 15,000.

Impurities, such as metals, should naturally be of low quantity in the hydrophobic resin (HR), as for the resin as the component (A). The content of residual monomers and oligomer components is preferably 0 to 10 mass %, more preferably 0 to 5 mass % and still more preferably 0 to 1 mass %. Accordingly, there can be obtained a resist being free from a change of in-liquid foreign matter, sensitivity, etc. over time. From the viewpoint of resolving power, resist profile, side wall of resist pattern, roughness, etc., the molecular weight distribution (Mw/Mn, also referred to as the degree of dispersal) thereof is preferably in the range of 1 to 5, more preferably 1 to 3 and still more preferably 1 to 2.

A variety of commercially available products can be used as the hydrophobic resin (HR), and also the resin can be synthesized in accordance with conventional methods (for example, radical polymerization). As general synthesizing methods, there can be mentioned, for example, a batch polymerization method in which a monomer species and an initiator are dissolved in a solvent and heated to thereby carry out polymerization, a dropping polymerization method in which a solution of monomer species and initiator is dropped into a hot solvent over a period of 1 to 10 hours, and the like. The dropping polymerization method is preferred. As a reaction solvent, there can be mentioned, for example, an ether such as tetrahydrofuran, 1,4-dioxane or diisopropyl ether, a ketone such as methyl ethyl ketone or methyl isobutyl ketone, an ester solvent such as ethyl acetate, an amide solvent such as dimethylformamide or dimethylacetamide, or the after-mentioned solvent capable of dissolving the composition of the present invention, such as propylene glycol monomethyl ether acetate, propylene glycol monomethyl ether or cyclohexanone. Preferably, the polymerization is carried out with the use of the same solvent as that used in the positive resist composition of the present invention. This would inhibit any particle generation during storage.

The polymerization reaction is preferably carried out in an atmosphere consisting of an inert gas, such as nitrogen or argon. In the initiation of polymerization, a commercially available radical initiator (azo initiator, peroxide, etc.) is used as the polymerization initiator. Among the radical initiators, an azo initiator is preferred, and azo initiators having an ester group, a cyano group and a carboxyl group are more preferred. As specific preferred initiators, there can be mentioned azobisisobutyronitrile, azobisdimethylvaleronitrile, dimethyl 2,2'-azobis(2-methylpropionate) and the like. The reaction concentration is in the range of 5 to 50 mass %, preferably 30 to 50 mass %. The reaction temperature is generally in the range of 10° to 150° C., preferably 30° to 120° C. and more preferably 60° to 100° C.

After the completion of the reaction, the mixture is allowed to stand still to cool to room temperature and purified. In the purification, use is made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to thereby coagulate the resin in the poor solvent and thus remove residual monomers, etc. and a method of purification in solid form such as washing of a resin slurry obtained by filtration with the use of a poor solvent. For example, the reaction solution is brought into contact with a solvent wherein the resin is poorly soluble or insoluble (poor solvent) amounting to 10 or less, preferably 10 to 5 times the volume of the reaction solution to thereby precipitate the resin as a solid.

The solvent for use in the operation of precipitation or re-precipitation from a polymer solution (precipitation or re-precipitation solvent) is not limited as long as the solvent is a poor solvent for the polymer. According to the type of polymer, use can be made of any one appropriately selected from among a hydrocarbon, a halogenated hydrocarbon, a nitro compound, an ether, a ketone, an ester, a carbonate, an alcohol, a carboxylic acid, water, a mixed solvent containing these solvents and the like. Of these, it is preferred to employ a solvent containing at least an alcohol (especially methanol or the like) or water as the precipitation or re-precipitation solvent.

The amount of precipitation or re-precipitation solvent used is generally in the range of 100 to 10,000 parts by mass, preferably 200 to 2000 parts by mass and more preferably 300 to 1000 parts by mass per 100 parts by mass of the polymer solution, according to intended efficiency, yield, etc.

The temperature at which the precipitation or re-precipitation is carried out is generally in the range of about 0° to 50° C., preferably about room temperature (for example, about 20° to 35° C.), according to efficiency and operation easiness. The operation of precipitation or re-precipitation can be carried out by a publicly known method, such as a batch or continuous method, with the use of a common mixing vessel, such as an agitation vessel.

The polymer obtained by the precipitation or re-precipitation is generally subjected to common solid/liquid separation, such as filtration or centrifugal separation, and dried before use. The filtration is carried out with the use of a filter medium ensuring solvent resistance, preferably under pressure. The drying is performed at about 30° to 100° C., preferably about 30° to 50° C. at ordinary pressure or reduced pressure (preferably reduced pressure).

Alternatively, after the resin precipitation and separation, the obtained resin may be once more dissolved in a solvent and brought into contact with a solvent wherein the resin is poorly soluble or insoluble. Specifically, the method may include the steps of, after the completion of the radical polymerization reaction, bringing the polymer into contact with a solvent wherein the polymer is poorly soluble or insoluble to thereby precipitate a resin (step a), separating the resin from the solution (step b), re-dissolving the resin in a solvent to thereby obtain a resin solution (A) (step c), thereafter bringing the resin solution (A) into contact with a solvent wherein the resin is poorly soluble or insoluble amounting to less than 10 times (preferably 5 times or less) the volume of the resin solution (A) to thereby precipitate a resin solid (step d) and separating the precipitated resin (step e).

Specific examples of the hydrophobic resins (HR) will be shown below. The following Table 1 shows the molar ratio of individual repeating units (corresponding to individual repeating units in order from the left), weight average molecular weight and degree of dispersal with respect to each of the resins.
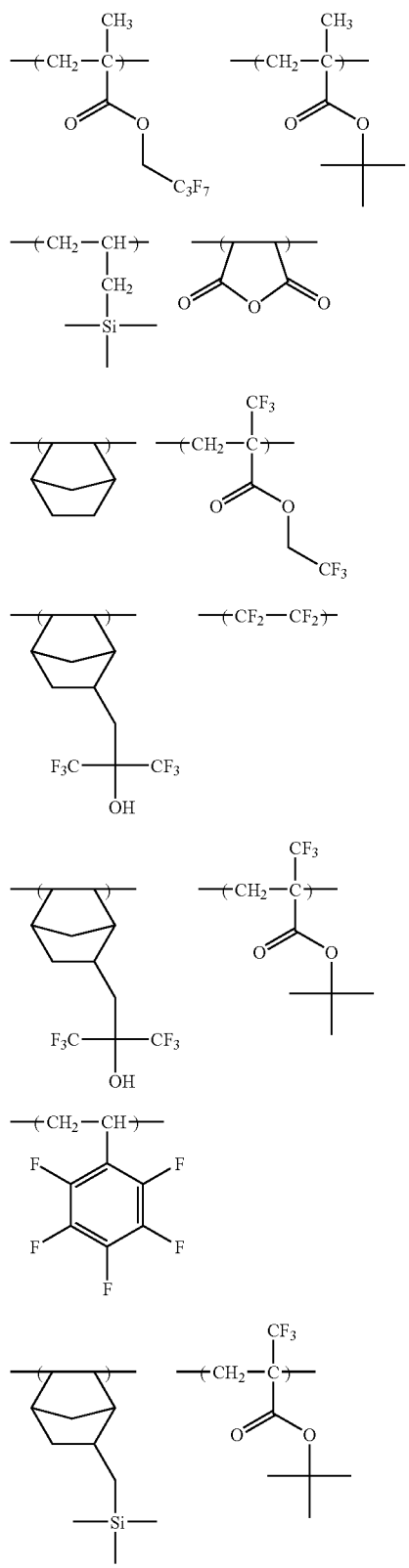
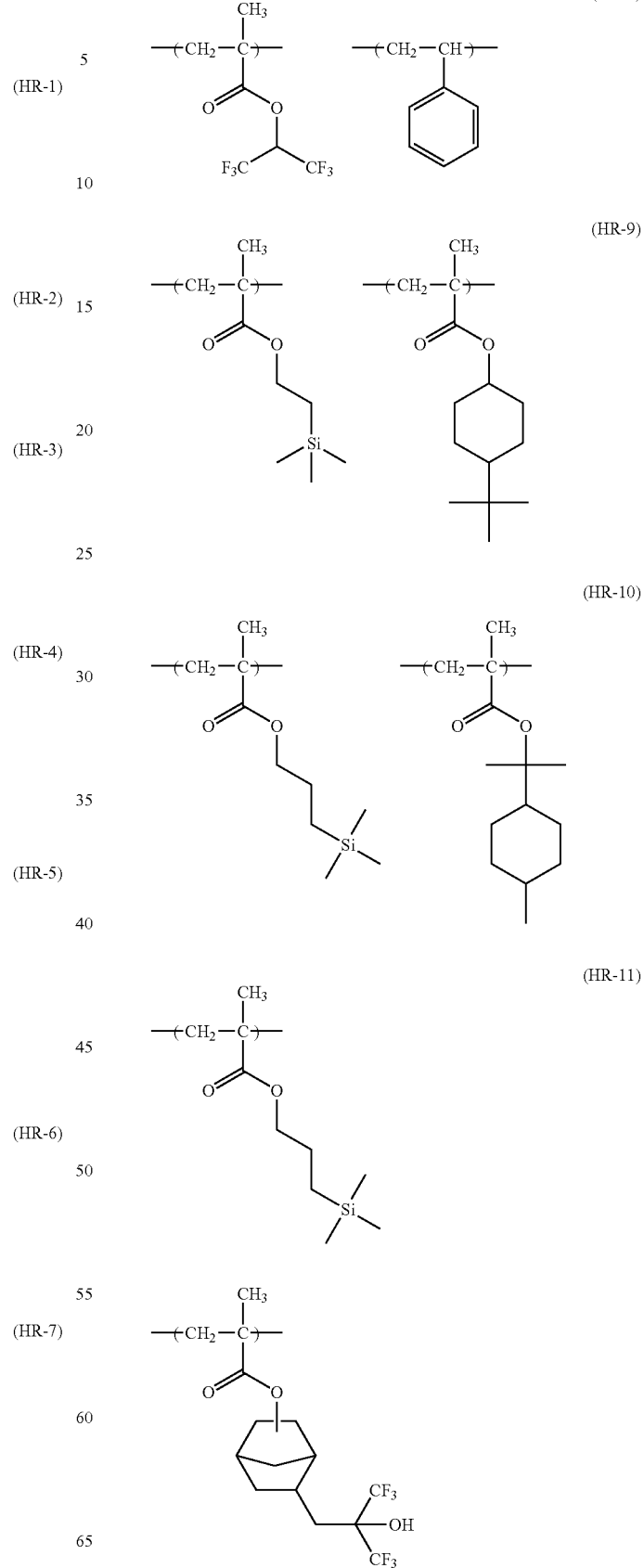

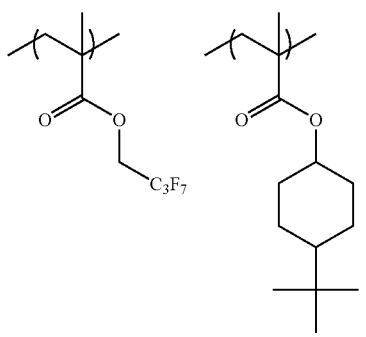 (HR-12)
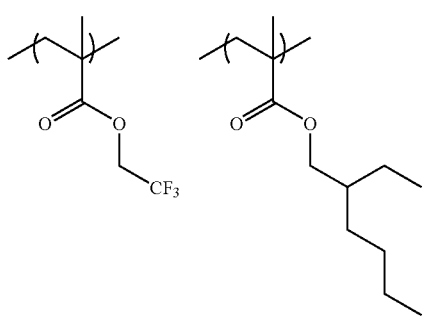 (HR-13)
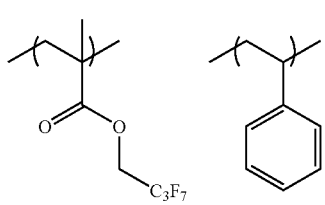 (HR-14)
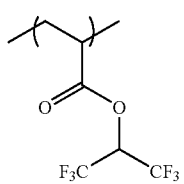 (HR-15)
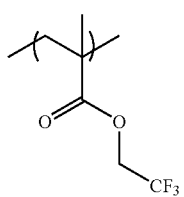 (HR-16)
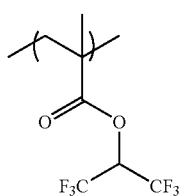 (HR-17)
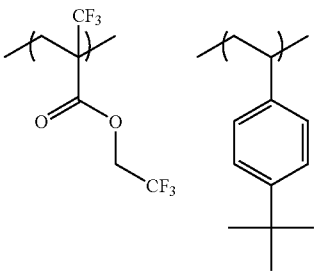 (HR-18)
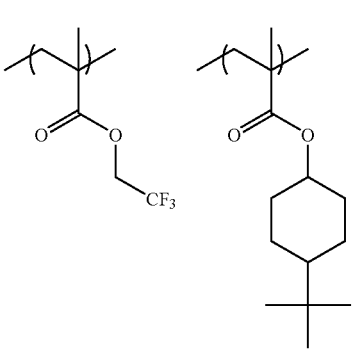 (HR-19)
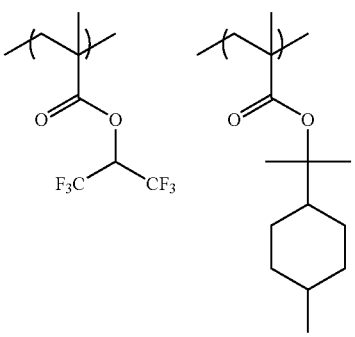 (HR-20)
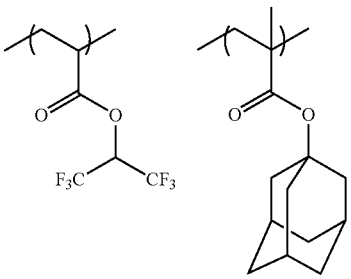 (HR-21)
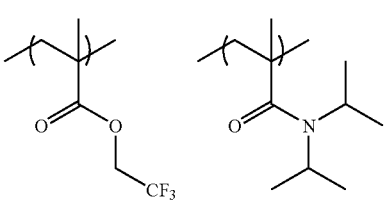 (HR-22)

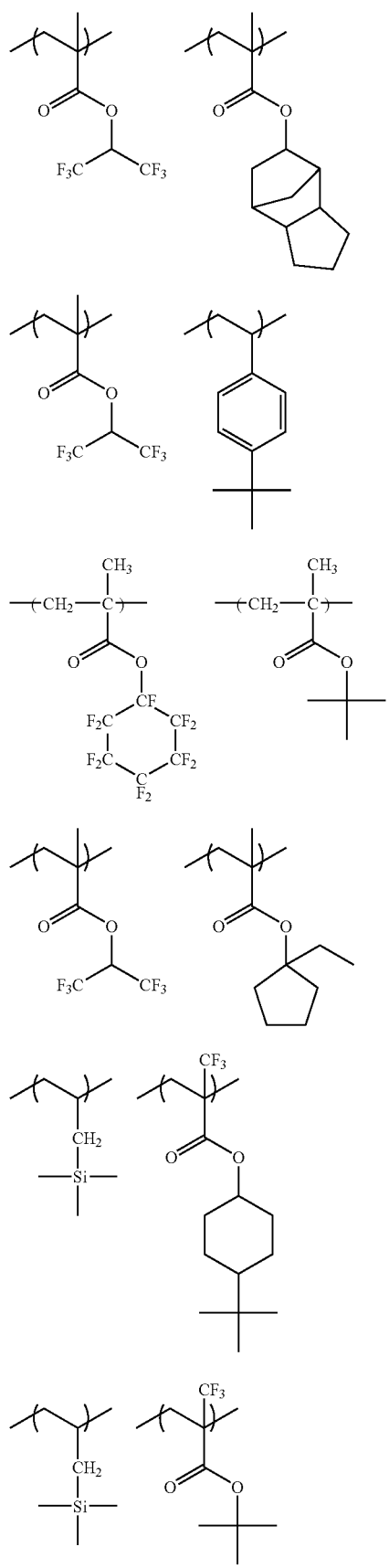
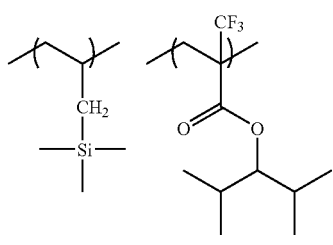
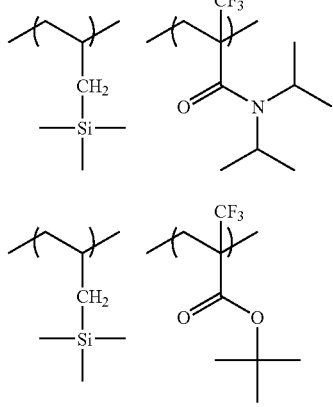
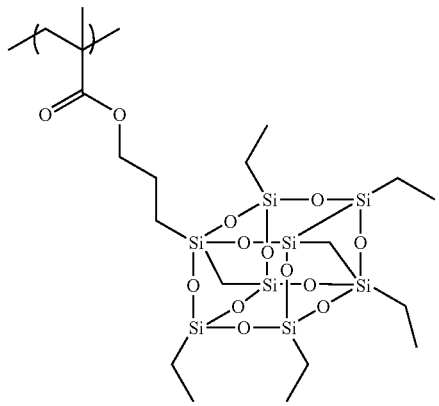
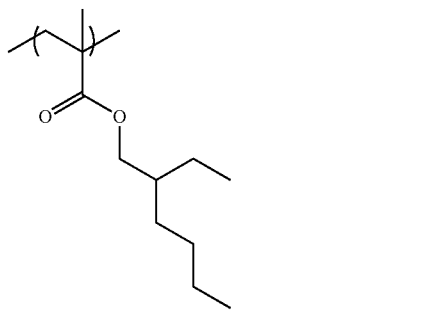
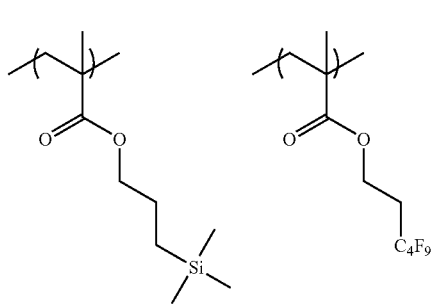

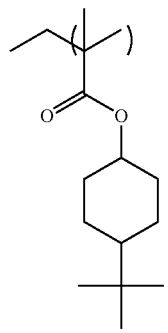
(HR-34)
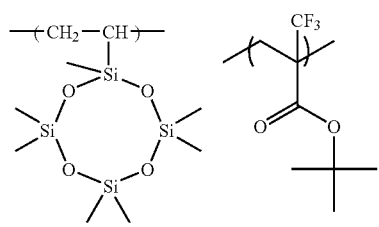
(HR-35)
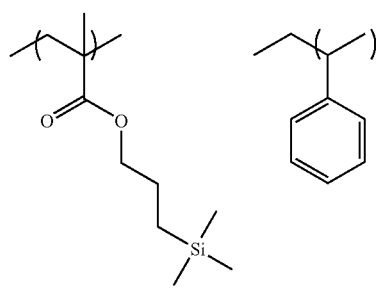
(HR-36)
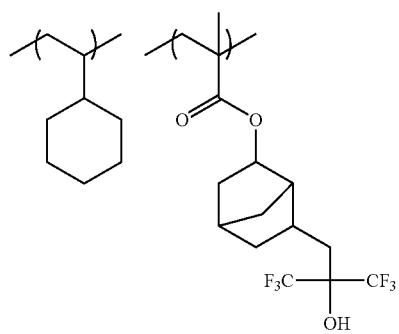
(HR-37)
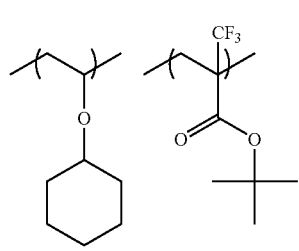
(HR-38)
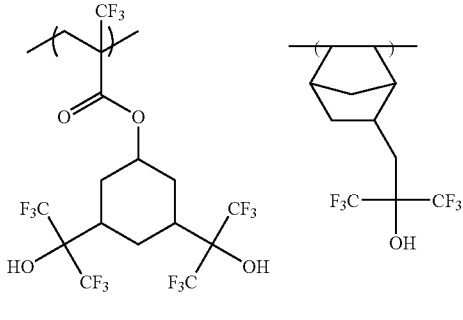
(HR-39)
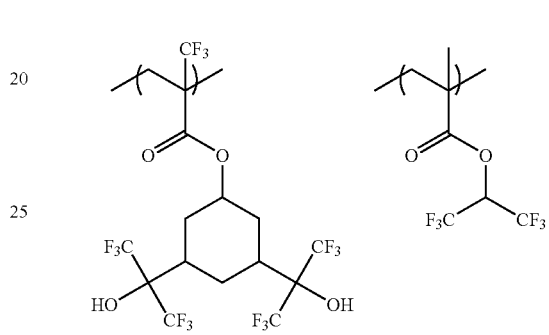
(HR-40)
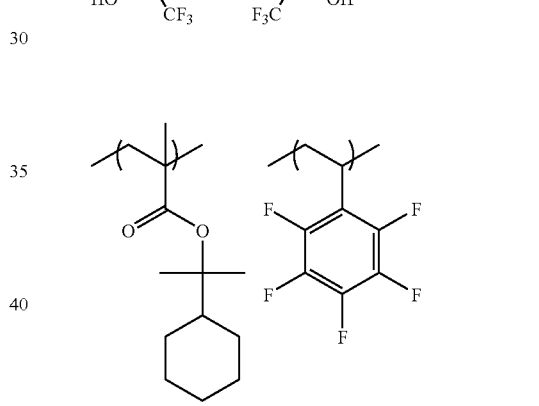
(HR-41)
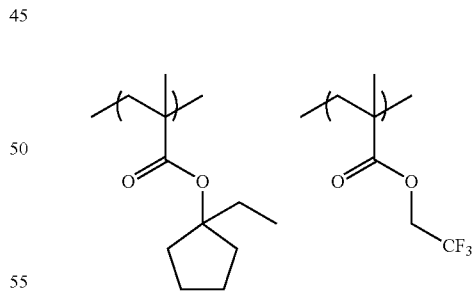
(HR-42)
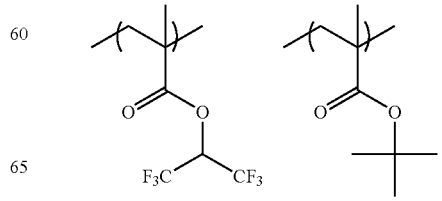

(HR-43)
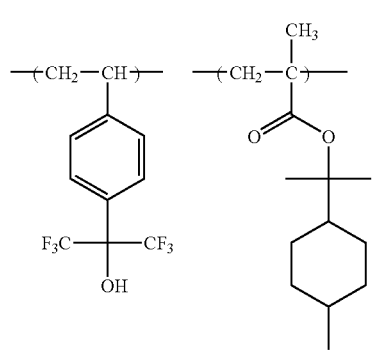
(HR-44)
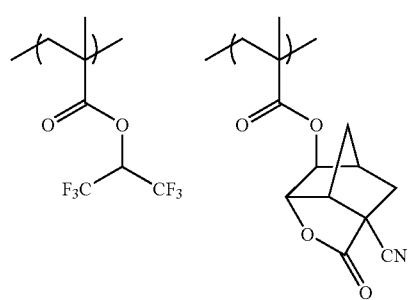
(HR-45)
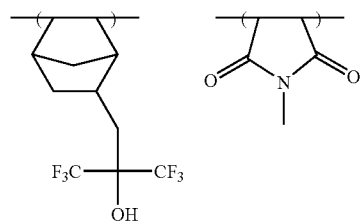
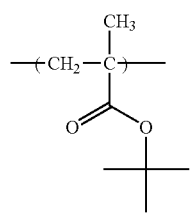
(HR-46)
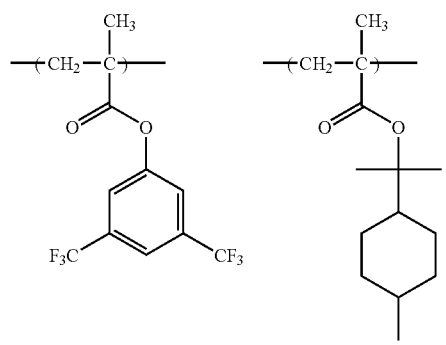
(HR-47)
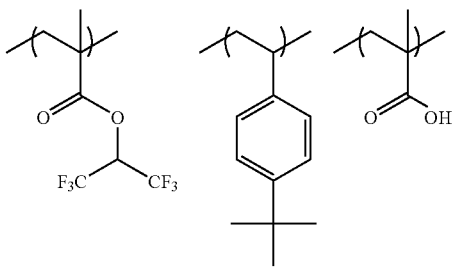
(HR-48)
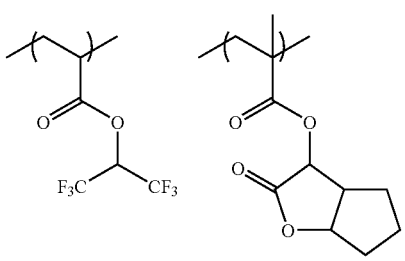
(HR-49)
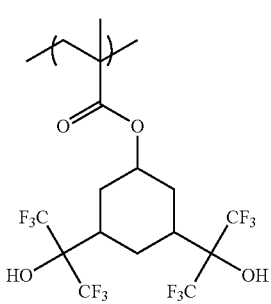
(HR-50)
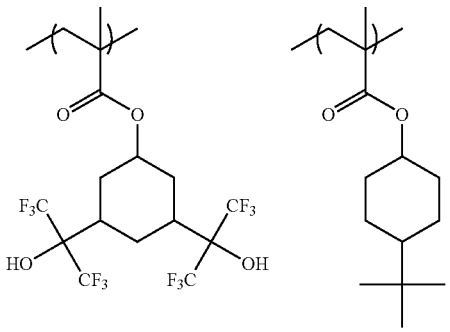
(HR-51)
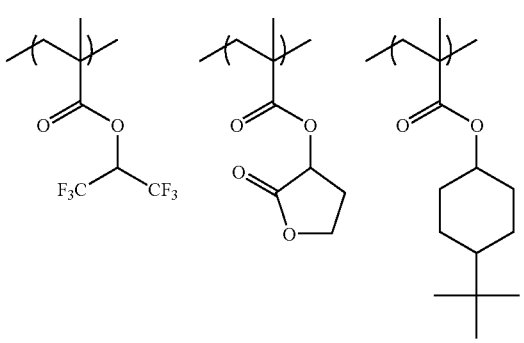

(HR-52)
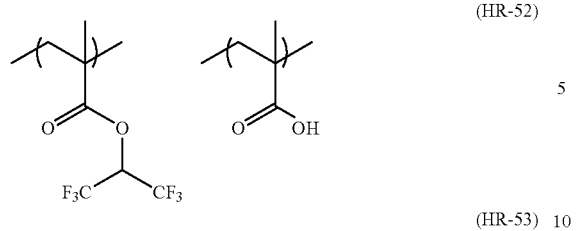
(HR-53)
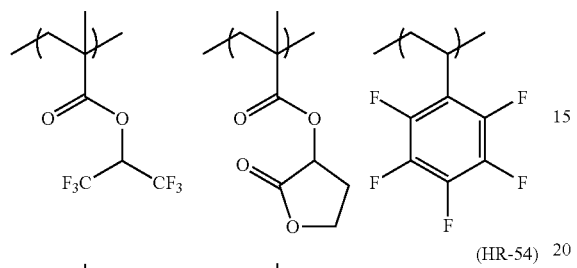
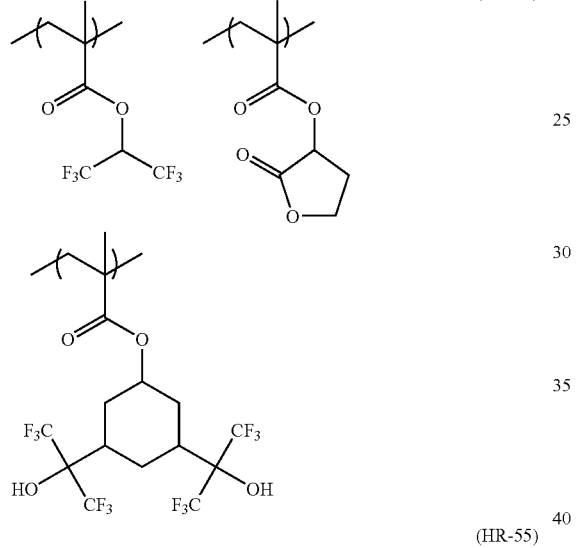
(HR-55)
(HR-56)
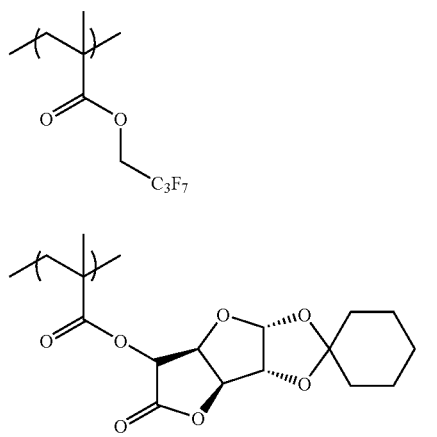
(HR-57)
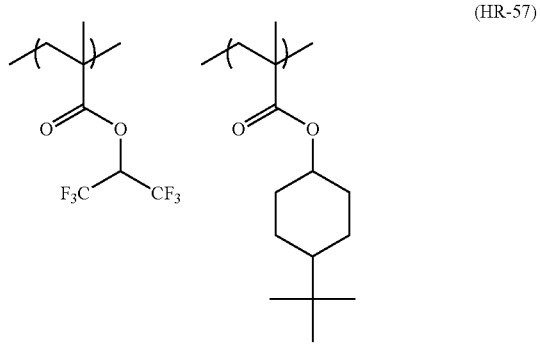
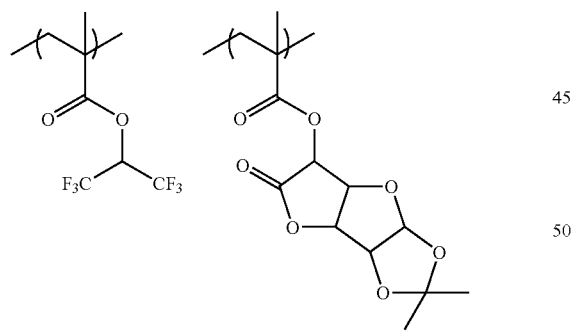
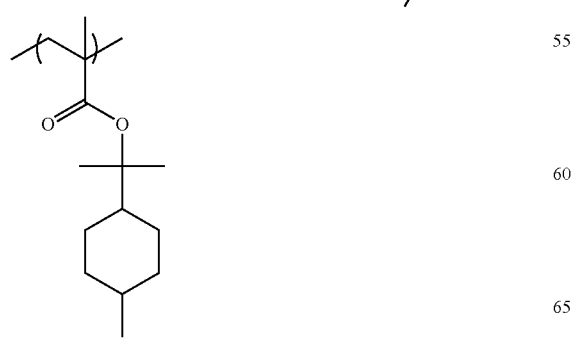
(HR-58)
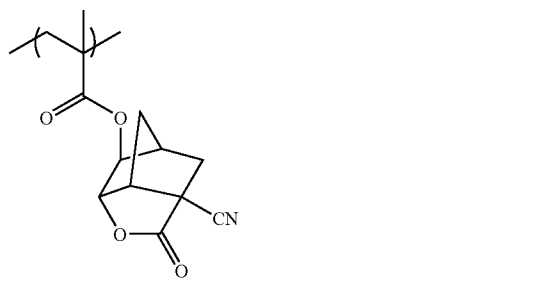
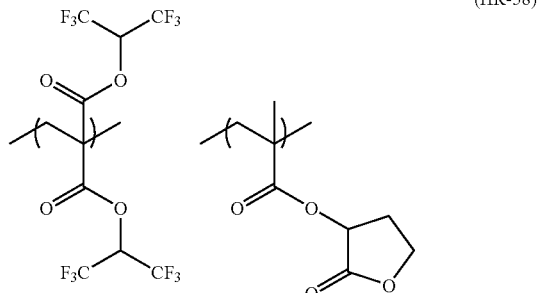
(HR-59)
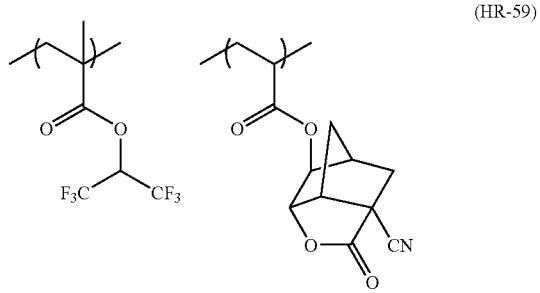

-continued
(HR-60)
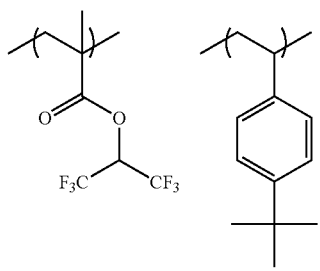
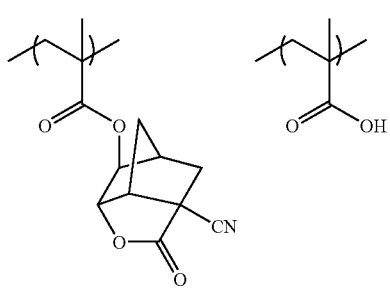
(HR-61)
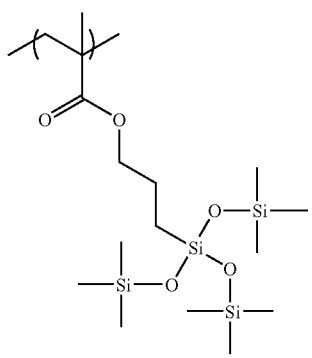
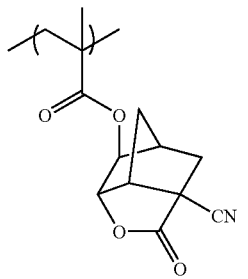
(HR-62)
-continued
(HR-63)
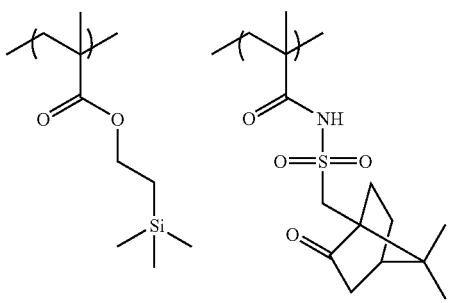
(HR-64)
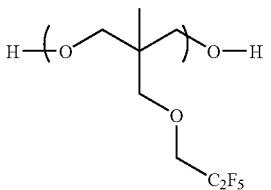
(HR-65)
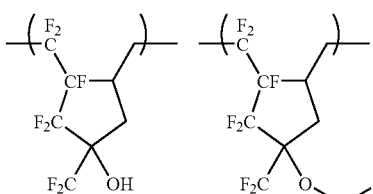
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
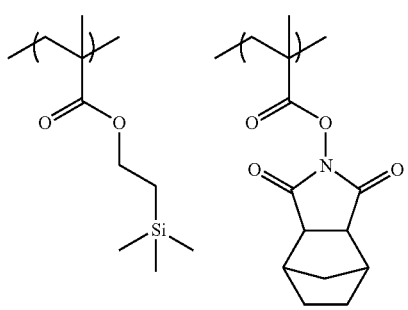

TABLE 1-continued

| Resin | Composition | Mw | Mw/Mn |
|---|---|---|---|
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

For the prevention of direct contact of a resist film with a liquid for liquid immersion, a film that is highly insoluble in the liquid for liquid immersion (hereinafter also referred to as a "top coat") may be provided between the resist film from the positive photosensitive composition of the present invention and the liquid for liquid immersion. The functions to be fulfilled by the top coat are applicability to an upper layer portion of the resist, transparency in radiation of especially 193 nm and being highly insoluble in the liquid for liquid immersion. Preferably, the top coat does not mix with the resist and is uniformly applicable to an upper layer of the resist.

From the viewpoint of 193 nm transparency, the top coat preferably consists of a polymer not abundantly containing an aromatic moiety. As such, there can be mentioned, for example, a hydrocarbon polymer, an acrylic ester polymer, polymethacrylic acid, polyacrylic acid, polyvinyl ether, a siliconized polymer, a fluoropolymer or the like. The aforementioned hydrophobic resins (HR) also find appropriate application in the top coat. From the viewpoint of contamination of an optical lens by leaching of impurities from the top coat into the liquid for liquid immersion, it is preferred to reduce the amount of residual monomer components of the polymer contained in the top coat.

At the detachment of the top coat, use may be made of a developer, or a separate peeling agent may be used. The peeling agent preferably consists of a solvent having a lower permeation into the resist film. Detachability by an alkali developer is preferred from the viewpoint of simultaneous attainment of the detachment step with the development processing step for the resist film. The top coat is preferred to be acidic from the viewpoint of detachment with the use of an alkali developer. However, from the viewpoint of non-intermixability with the resist film, the top coat may be neutral or alkaline.

The less the difference in refractive index between the top coat and the liquid for liquid immersion, the higher the resolving power. In an ArF excimer laser (wavelength: 193 nm), when water is used as the liquid for liquid immersion, the top coat for ArF liquid immersion exposure preferably has a refractive index close to that of the liquid for liquid immersion. From the viewpoint of approximation of the refractive index to that of the liquid for liquid immersion, it is preferred for the top coat to contain a fluorine atom. From the viewpoint of transparency and refractive index, it is preferred to reduce the thickness of the film.

Preferably, the top coat does not mix with the resist film and also does not mix with the liquid for liquid immersion. From this viewpoint, when the liquid for liquid immersion is water, it is preferred for the solvent used in the top coat to be highly insoluble in the solvent used in the positive resist composition and be a non-water-soluble medium. When the liquid for liquid immersion is an organic solvent, the top coat may be soluble or insoluble in water.

EXAMPLE

Example A

<Example of Polymer Synthesis>

Polymer (P1-1)

In a nitrogen stream, 53.6 g of cyclohexanone was placed in a three-necked flask and heated at 80° C. A solution obtained by dissolving the following monomer A, monomer B, monomer C and monomer D amounting to 5.61, 2.36, 13.66 and 5.40 g, respectively and further 1.497 g of a polymerization initiator (dimethyl 2,2'-azobis(2-methylpropionate) (V601) produced by Wako Pure Chemical Industries, Ltd.) in 100.0 g of cyclohexanone was dropped thereinto over a period of 6 hours. After the completion of the dropping, reaction was continued at 80° C. for 2 hours. The reaction mixture was allowed to stand still to cool and was dropped into a mixed liquid consisting of heptane/ethyl acetate (900 g/100 g) over a period of 20 minutes. The thus precipitated powder was collected by filtration and dried, thereby obtaining 18.1 g of a desired polymer (P1-1). The weight average molecular weight (Mw) of the obtained polymer (P1-1) in terms of standard polystyrene molecular weight was 6900 and the dispersity (Mw/Mn) thereof was 1.75.

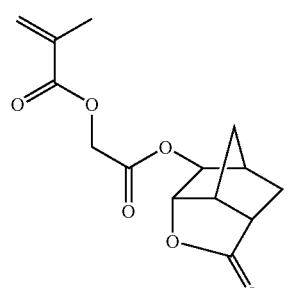

A

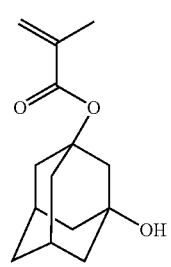

B

-continued

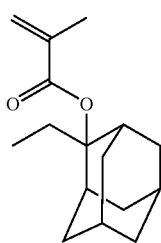

C

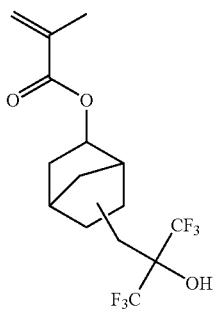

D

In the same manner, the other polymers to be described hereinafter were synthesized.

The structural units and ratios thereof employed in the production of each of the polymers and the weight average molecular weights (Mw) and dispersities (Mw/Mn) of the obtained polymers are described hereinafter.

<Preparation of Resist>

The components indicated in the Table 2 below were dissolved in solvents, thereby obtaining solutions of 5 mass % solid content. These solutions were passed through a polyethylene filter of 0.1 μm pore size, thereby obtaining positive resist compositions. The thus obtained positive resist compositions were evaluated by the following methods. The results are given in Table 3 to be described hereinafter.

In the component addition ratio appearing in Table 2, the total mass of polymer 1 and polymer 2 is 90 mass % based on the total solid content of the composition. The ratio in use of two or more items is a mass ratio.

TABLE 2

| Resist | Polymer 1 (SP/MPa$^{1/2}$) | Polymer 2 (SP/MPa$^{1/2}$) | ΔSP | Polymer 1/ Polymer 2 | *Adamantane content (mol %) in polymer 1 | Acid generator (mass %) | Basic comp. (mass %) | Additive (mass %) | Solv. |
|---|---|---|---|---|---|---|---|---|---|
| 1 | P1-1 (22.28) | P2-1 (22.61) | 0.33 | 10/90 | 65 | PAG2 (7.5) | Q1 (1.0) | — | S1/S2 = 6/4 |
| 2 | P1-2 (22.77) | P2-1 (22.61) | 0.16 | 30/70 | 55 | PAG2 (5.5) PAG3 (2.0) | Q1 (0.55) | — | S3 |
| 3 | P1-3 (22.83) | P2-1 (22.61) | 0.22 | 20/80 | 65 | PAG2 (8.0) | Q1 (0.3) Q3 (0.5) | AD-1 (0.5) | S1/S2 = 6/4 |
| 4 | P1-4 (22.96) | P2-1 (22.61) | 0.35 | 10/90 | 60 | PAG1 (7.0) | Q2 (1.5) | — | S1/S2/S4 = 6/3/1 |
| 5 | P1-5 (24.94) | P2-2 (23.11) | 1.83 | 10/90 | 10 | PAG2 (3.0) PAG4 (3.0) | Q3 (0.6) | — | S1/S2 = 6/4 |
| 6 | P1-6 (23.67) | P2-2 (23.11) | 0.56 | 20/80 | 10 | PAG2 (7.0) | Q4 (0.7) | — | S1/S2 = 6/4 |
| 7 | P1-7 (25.10) | P2-2 (23.11) | 1.99 | 10/90 | 0 | PAG2 (7.5) | Q1 (0.75) | — | S1/S2 = 6/4 |
| 8 | P1-8 (22.83) | P2-2 (23.11) | 0.28 | 30/70 | 0 | PAG3 (8.0) | Q4 (0.85) | AD-3 (1.0) | S1/S2 = 6/4 |
| 9 | P1-1 (22.28) | P2-3 (21.82) | 0.46 | 20/80 | 65 | PAG3 (1.5) PAG4 (5.5) | Q1 (0.80) | AD-3 (0.5) | S1/S2 = 6/4 |
| 10 | P1-2 (22.77) | P2-3 (21.82) | 0.95 | 30/70 | 55 | PAG3 (7.5) | Q1 (0.5) | — | S1/S2/S5 = 60/35/5 |
| 11 | P1-3 (22.83) | P2-3 (21.82) | 1.01 | 10/90 | 65 | PAG2 (5.0) PAG4 (2.0) | Q1 (0.75) | — | S1/S3/S5 = 5/4/1 |
| 12 | P1-4 (22.96) | P2-3 (21.82) | 1.14 | 8/92 | 60 | PAG2 (4.0) PAG4 (3.5) | Q4 (0.75) | — | S1/S2 = 6/4 |
| 13 | P1-5 (24.94) | P2-4 (23.40) | 1.54 | 10/90 | 10 | PAG1 (3.5) PAG4 (3.5) | Q2 (0.9) | — | S3/S5 = 97/3 |
| 14 | P1-6 (23.67) | P2-4 (23.40) | 0.27 | 40/60 | 10 | PAG4 (8.0) | Q1 (0.70) | AD-2 (1.0) | S1/S2/S3 = 5/4/1 |
| 15 | P1-7 (25.10) | P2-4 (23.40) | 1.7 | 10/90 | 0 | PAG2 (7.5) | Q3 (0.80) | — | S3/S4/S6 = 8/1/1 |
| 16 | P1-8 (22.83) | P2-4 (23.40) | 0.57 | 20/80 | 0 | PAG2 (5.0) PAG1 (2.0) | Q1 (0.75) | — | S1/S2 = 6/4 |
| 17 | — | P2-1 (22.61) | — | — | — | PAG2 (7.5) | Q1 (0.75) | — | S1/S2 = 6/4 |
| 18 | P1-1 (22.28) | — | — | — | 65 | PAG2 (7.5) | Q1 (0.75) | — | S1/S2 = 6/4 |
| 19 | P1-2 (22.77) | P1-1 (22.28) | 0.49 | Polymer1-2/ Polymer1-1 = 50/50 | — | PAG2 (7.5) | Q1 (0.75) | — | S1/S2 = 6/4 |

*Content(mol %) of "monomer unit having adamantyl group directly linked to its side chain" in polymer1

The particulars of the compounds of the Table 2 above are as follows.
Polymer 1
P1-1
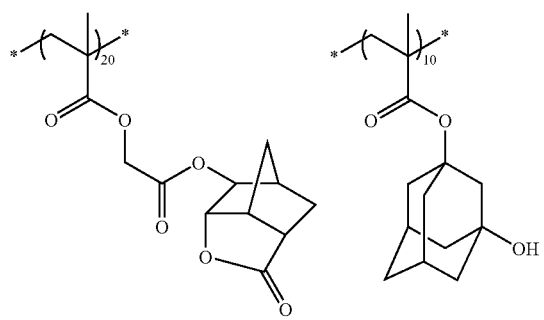
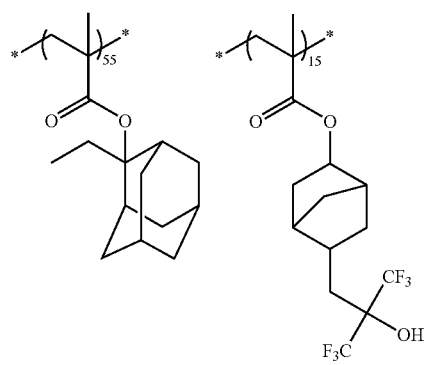
Mw 6900, Mw/Mn = 1.75
P1-2
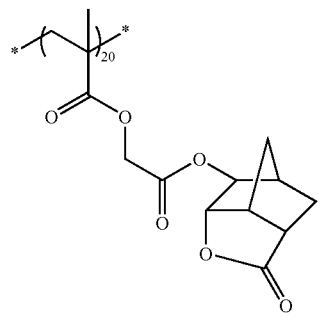
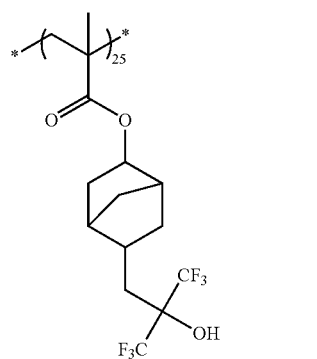
Mw 8200, Mw/Mn = 1.74
P1-3
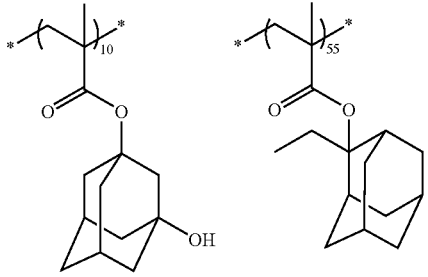
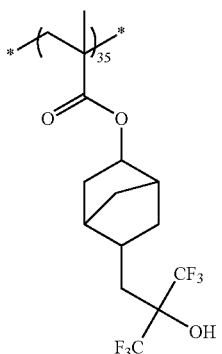
Mw 7600, Mw/Mn = 1.81
P1-4
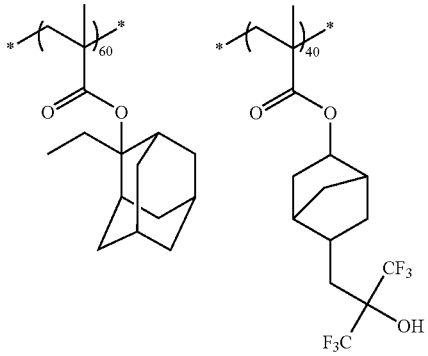
Mw 9100, Mw/Mn = 1.80
P1-5
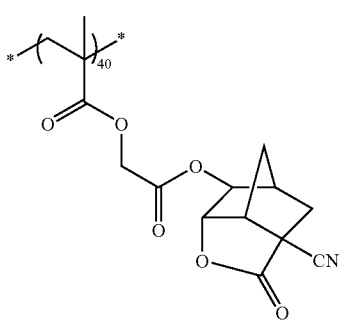

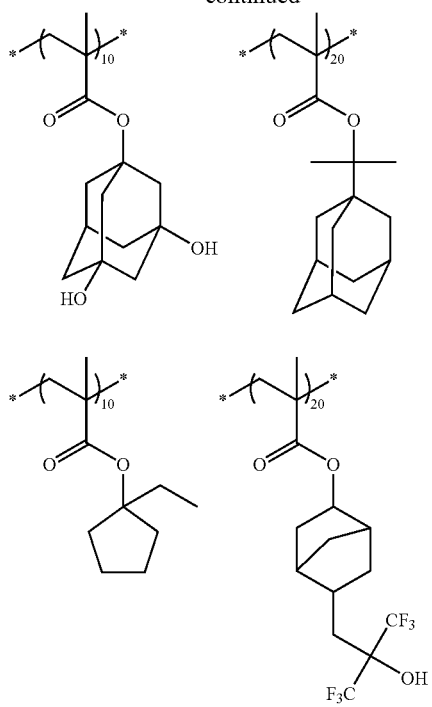
Mw 8400, Mw/Mn = 1.81
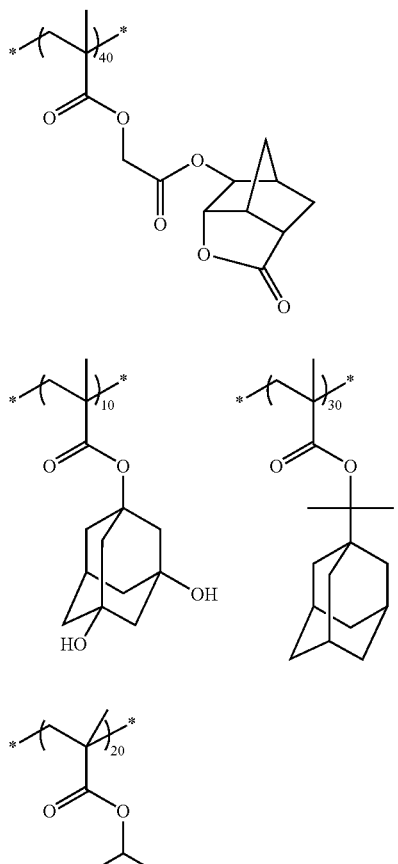
Mw 6800, Mw/Mn = 1.69
P1-6
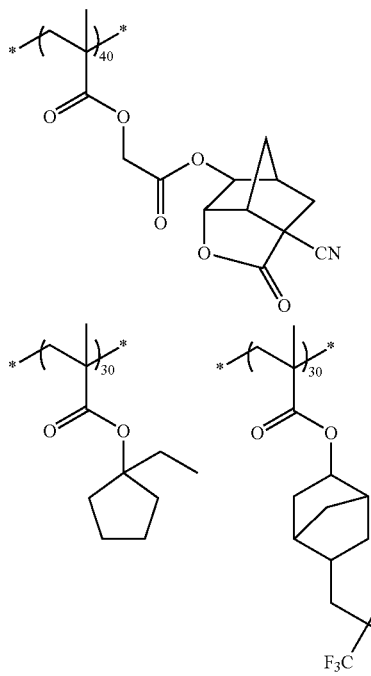
Mw 9100, Mw/Mn = 1.81
P1-7
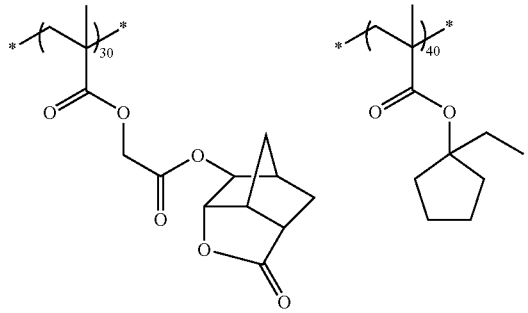
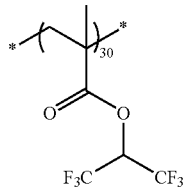
Mw 7500, Mw/Mn = 1.76
P1-8
Polymer 2
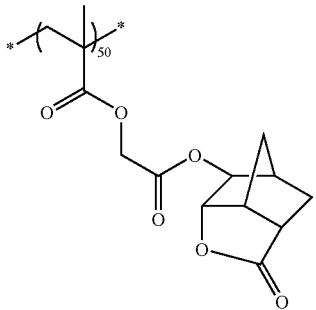
P2-1

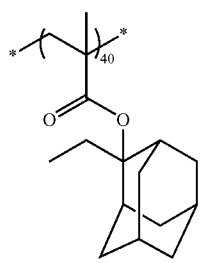
Mw 8800,
Mw/Mn = 1.85
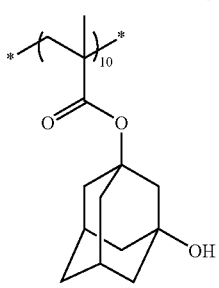 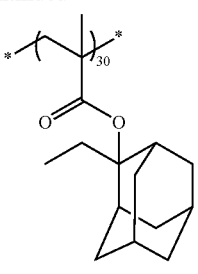
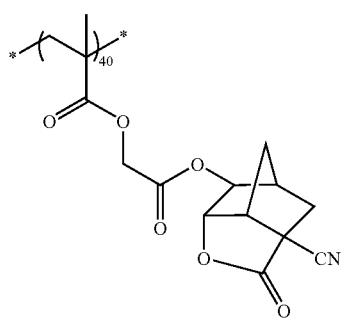
P2-2
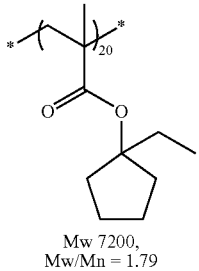
Mw 7200,
Mw/Mn = 1.79
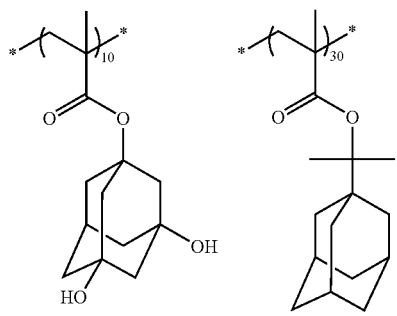
P2-4
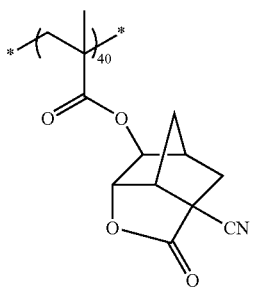 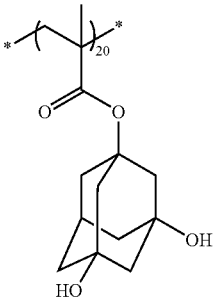
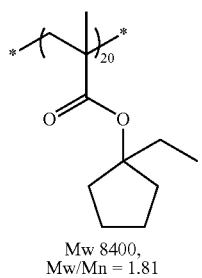
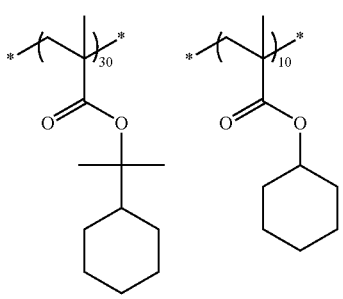
Mw 8400,
Mw/Mn = 1.81
Mw 8100, Mw/Mn = 1.90
P2-3
Acid generator
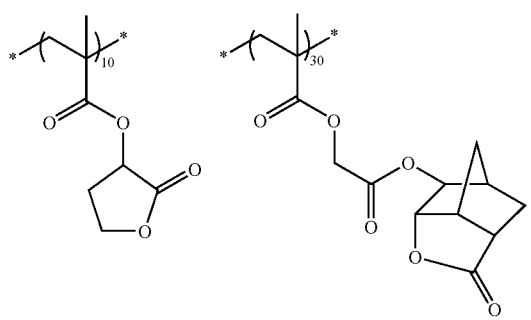
PAG1
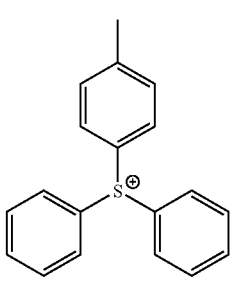 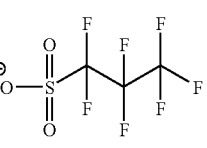

PAG2

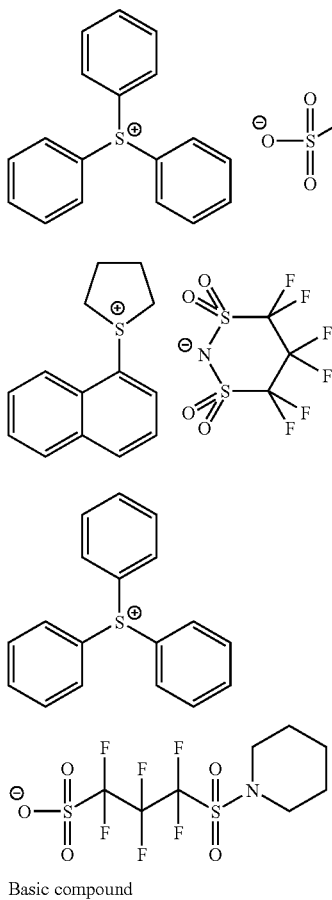

PAG3

PAG4

Basic compound

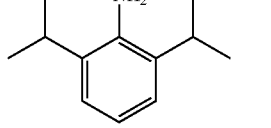

Q1

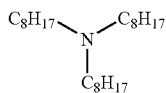

Q2

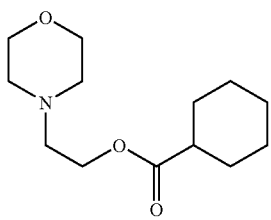

Q3

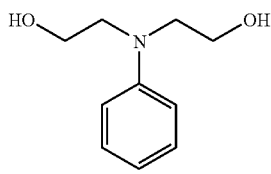

Q4

Additive

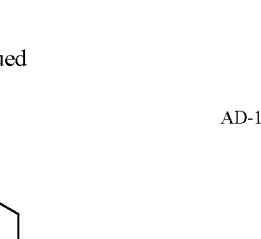

AD-1

AD-2

AD-3

(Solvent)
S1: propylene glycol monomethyl ether acetate (PGMEA),
S2: propylene glycol monomethyl ether (PGME),
S3: cyclohexanone,
S4: 2-heptanone,
S5: γ-butyrolactone, and
S6: ethyl acetate.

Imaging Performance Test
[Exposure Condition: ArF Dry Exposure}

An organic antireflection film ARC29A (produced by Nissan Chemical Industries, Ltd.) was applied onto a silicon wafer and baked at 205° C. for 60 seconds, thereby forming a 78 nm antireflection film. Each of the above prepared positive resist compositions was applied thereonto and baked for 60 seconds at the temperature (PB) indicated in the Table 3, thereby forming a 100-nm resist film. The resultant wafer was exposed through a 6% half-tone mask of 75 nm 1:1 line and space pattern by means of an ArF excimer laser scanner (manufactured by ASML, PAS5500/1100, NA0.75). Thereafter, the exposed wafer was heated for 60 seconds at the temperature (PEB) indicated in the Table 3, developed with an aqueous solution of tetramethylammonium hydroxide (2.38 mass %) for 30 seconds, rinsed with pure water and spin dried, thereby obtaining a resist pattern.

[Sensitivity]
The optimum exposure intensity (Eopt) was defined as the exposure intensity that reproduces a 75 nm line and space 1/1 mask pattern. The smaller the obtained value, the higher the sensitivity.

[LWR]
The line pattern finished at 75 nm in the above evaluation was observed by means of a scanning electron microscope (model S-9260, manufactured by Hitachi, Ltd.). With respect to a 2 μm region of each longitudinal edge of the line pattern, the distance from a reference line on which the edge was to be present was measured at 50 points. The standard deviation thereof was determined, and 3σ was computed. The smaller the value thereof, the higher the performance exhibited.

[Exposure Latitude (EL)]
The optimum exposure intensity was defined as the exposure intensity that reproduces a line and space mask pattern of 75 nm line width. The exposure intensity width in which when the exposure intensity was varied, the pattern size allowed 75 nm±10% was measured. The exposure latitude is the quotient of the value of the exposure intensity width divided by the optimum exposure intensity, the quotient expressed by a percentage. The greater the value of the exposure latitude, the less the change of performance by exposure intensity changes and the better the exposure latitude (EL).

[Pattern Collapse (PC)]

A 75-nm line/space=1/1 line pattern was formed in the same manner as in the above evaluation of LWR. The pattern formed when the exposure intensity was changed from the exposure intensity (E1) reproducing this mask pattern to the overexposure side by 10 mJ·cm$^{-2}$ was observed by means of a scanning electron microscope (SEM). The evaluation mark ○* was given when no pattern collapse was observed. The evaluation mark ○ was given when the occurrence of pattern collapse was slight. The evaluation mark × was given when the occurrence of pattern collapse was observed.

[Development Defect]

Each of the resist compositions was uniformly applied onto an 8-inch silicon substrate having undergone a hexamethyldisilazane treatment by means of a spin coater, and heated and dried on a hot plate at 120° C. for 60 seconds, thereby obtaining a 100-nm resist film. This resist film without being exposed was heated on a hot plate at 110° C. for 90 seconds, developed with a 2.38 mass % aqueous solution of tetramethylammonium hydroxide at 23° C. for 60 seconds, rinsed with pure water for 30 seconds and dried. On the thus obtained sample wafer, the number of development defects was counted by means of a KLA-2360 (manufactured by KLA-Tencor Corporation). The count results are expressed with standardization of the number of defects in Comparative Example 1 to 1.

[Surface Coverage Ratio]

The surface coverage ratio refers to the ratio of surface coverage by polymer 1 in the film obtained by applying a PGMEA/PGME=60/40 (mass ratio) solution containing polymer 1 and polymer 2 in a mass ratio of 10:90 (solid content 5 mass %) by spin coating so as to make a film thickness of 120 nm and heating the applied solution at 110° C. for 60 seconds. In Table 3, the surface coverage ratio is indicated as SCR1(10).

With respect to each of the above films, the ratio of surface coverage by polymer 1 was determined by the following procedure.

When the contact angle of a film consisting only of polymer 1 is referred to as $\theta_1$, the contact angle of a film consisting only of polymer 2 as $\theta_2$, and the contact angle of a resist film consisting of the blend of the polymers as $\theta_R$, the surface coverage ratios of polymer 1 and polymer 2 are respectively represented by $\phi_1$ and $\phi_2$ satisfying the following formula.

$$\cos \theta_R = \phi_1 \cos \theta_1 + \phi_2 \cos \theta_2 \; (\phi_1+\phi_2=100)$$

The actual measurement of $\theta_1$, $\theta_2$ and $\theta_R$ was carried out by the contact angle measuring method described below, and $\phi_1$ was calculated according to the above given formula. The ratio of surface coverage by polymer 1 was defined as the $\phi_1$. The ratio of surface coverage by polymer 1 when the content of polymer 1 was 10 mass % with respect to the polymer 1/polymer 2 blend ratio was indicated as SCR1(10).

[Measurement of Contact Angle]

In a clean room conditioned at 24° C. and 45% humidity, the static in-air water droplet contact angles of a film consisting only of each of the polymers used in the resist and the resist film from the polymers were measured by means of a DropMaster con tact angle meter (manufactured by Kyowa Interface Science Co., Ltd.).

[Gradient Slope (Kg)]

A model film was prepared from each of the resist compositions in which all the components other than polymer 1 and polymer 2 were removed. From the variable-angle XPS measurement data of the obtained resist film, the gradient slope was calculated by the following formula.

$$\text{Gradient slope } (Kg) = \Delta(F/C)/\Delta(d \sin \theta)$$

[SP Value]

The SP values were calculated by the Okitsu method (Journal of the Adhesive Society of Japan, Vol. 29, No. 5 (1993), pages 204-211, Role of solubility parameter (SP), First report, Method of determining SP from molar attraction constant).

TABLE 3

| Ex. | Resist | PB Temp. (° C.) | PEB Temp. (° C.) | Sensitivity (mJ/cm$^2$) | LWR (nm) | EL (%) | PC | Development defect | SCR1(10) (%) | Gradient slope [Kg] |
|---|---|---|---|---|---|---|---|---|---|---|
| 1 | 1 | 90 | 90 | 48 | 7.8 | 14.8 | ○* | 1.5 | 43 | −0.045 |
| 2 | 2 | 90 | 90 | 50 | 8.0 | 14.9 | ○* | 1.5 | 60 | −0.060 |
| 3 | 3 | 90 | 90 | 53 | 7.9 | 14.9 | ○* | 1.4 | 85 | −0.075 |
| 4 | 4 | 90 | 90 | 53 | 8.4 | 14.3 | ○* | 1.4 | 95 | −0.080 |
| 5 | 5 | 90 | 90 | 45 | 7.5 | 15.1 | ○* | 1 | 30 | −0.030 |
| 6 | 6 | 90 | 90 | 44 | 7.2 | 15.5 | ○* | 1 | 40 | −0.045 |
| 7 | 7 | 90 | 90 | 42 | 7.0 | 15.7 | ○* | 0.8 | 65 | −0.050 |
| 8 | 8 | 90 | 90 | 40 | 7.0 | 16.2 | ○* | 0.7 | 80 | −0.100 |
| 9 | 9 | 90 | 90 | 47 | 7.6 | 15.1 | ○* | 1.7 | 40 | −0.050 |
| 10 | 10 | 90 | 90 | 46 | 7.8 | 15.2 | ○* | 1.6 | 58 | −0.055 |
| 11 | 11 | 90 | 90 | 46 | 7.7 | 15.2 | ○* | 1.3 | 80 | −0.065 |
| 12 | 12 | 90 | 90 | 47 | 7.7 | 15.3 | ○* | 1.4 | 92 | −0.065 |
| 13 | 13 | 115 | 115 | 40 | 7.5 | 14.0 | ○* | 0.9 | 30 | −0.030 |
| 14 | 14 | 115 | 115 | 38 | 7.3 | 14.2 | ○* | 0.8 | 41 | −0.050 |
| 15 | 15 | 115 | 115 | 38 | 7.2 | 14.1 | ○* | 0.9 | 67 | −0.055 |
| 16 | 16 | 115 | 115 | 36 | 7.0 | 14.2 | ○* | 0.5 | 82 | −0.095 |
| Comp. 1 | 17 | 90 | 90 | 55 | 9.2 | 13.2 | ○ | 1 | — | — |
| Comp. 2 | 18 | 90 | 95 | 60 | 10.2 | 10.5 | ○ | 4 | — | — |
| Comp. 3 | 19 | 90 | 90 | 52 | 9.1 | 12.2 | ○ | 1 | — | 0 |

Example B

<Example of Polymer Synthesis>

In the same manner as in polymer (P1-1) used in Example A, polymers (P1-9)-(P1-13) and (P2-5)-(P2-8) indicated below were synthesized.

<Preparation of Resist>

The components indicated in the Table 4 below were dissolved in solvents, thereby obtaining solutions. These solutions were passed through a polyethylene filter of 0.1 μm pore size, thereby obtaining positive resist compositions. The thus obtained positive resist compositions were evaluated by the following methods. The results are given in Table 5 to be described hereinafter.

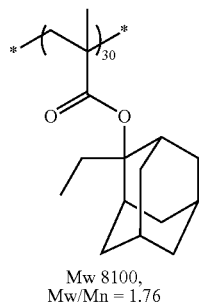

Mw 8100, Mw/Mn = 1.76

TABLE 4

| Ex. | Resist | Polymer 1 (mass %) | Polymer 2 (mass %) | *Adamantane content (mol %) in polymer 1 | Acid generator (mass %) | Basic comp. (mass %) | Additive (mass %) | Solv. (mass %) | SCR1(10) (%) |
|---|---|---|---|---|---|---|---|---|---|
| 17 | 20 | P1-9 (20) | P2-5 (80) | 40 | PAG5 (7) PAG6 (3) | Q3 (1) | AD-4 (2) | S1/S3 = 6/4 (2200) | 40 |
| 18 | 21 | P1-10 (20) | P2-6 (80) | 20 | PAG5 (5) PAG7 (5) | Q3 (1) | AD-4 (2) | S1/S3 = 6/4 (2200) | 50 |
| 19 | 22 | P1-11 (20) | P2-7 (80) | 30 | PAG8 (7) PAG9 (3) | Q3 (1) | AD-4 (2) | S1/S2 = 6/4 (2200) | 62 |
| 20 | 23 | P1-12 (20) | P2-8 (80) | 0 | PAG8 (3) PAG10 (8) | Q3 (1) | AD-4 (2) | S1/S2 = 6/4 (2200) | 85 |
| 21 | 24 | P1-13 (20) | P2-7 (80) | 10 | PAG8 (10) | Q3 (1) | AD-4 (2) | S1/S2/S5 = 59/39/2 (2200) | 80 |
| 22 | 25 | P1-8 (20) | P2-7 (80) | 0 | PAG8 (10) | Q3 (1) | AD-4 (2) | S1/S2/S5 = 59/39/2 (2200) | 72 |
| Comp. 4 | 26 | P1-9 (100) | — | 40 | PAG8 (10) | Q3 (1) | AD-4 (2) | S1/S3 = 6/4 (2200) | — |

*Content(mol %) of "monomer unit having adamantyl group directly linked to its side chain" in polymer1

In any of the combinations of polymer 1 and polymer 2, the static contact angle of the polymer 1 is greater than that of the polymer 2.

The particulars of the compounds of Table 4 above are as follows. The P1-8 for polymer 1, the Q3 as a basic compound and the solvent are the same as used in Example A.

<Polymer 1>

P1-9

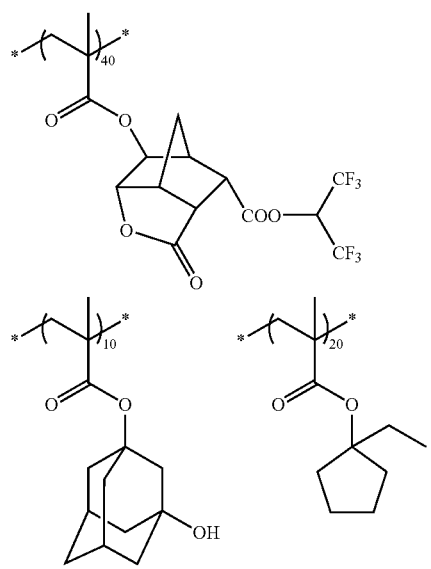

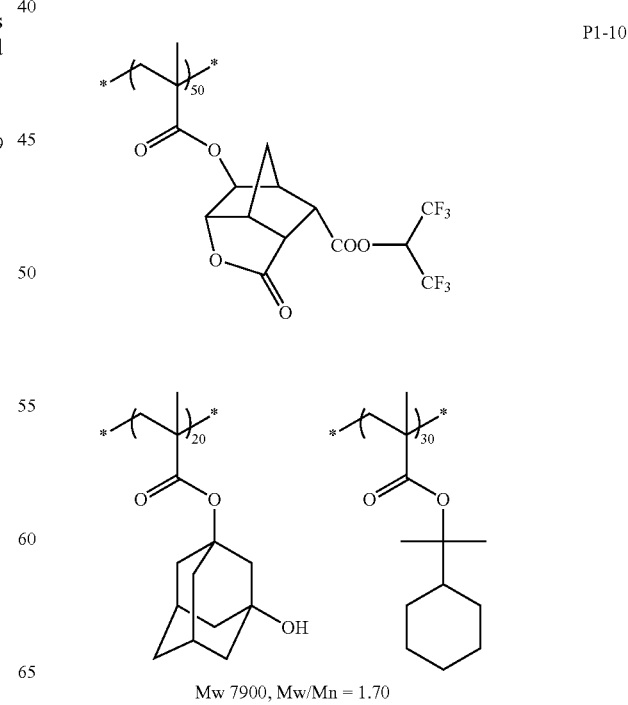

P1-10

Mw 7900, Mw/Mn = 1.70

-continued
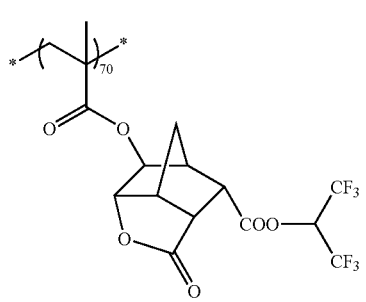
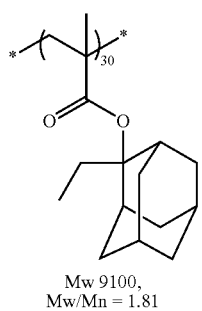
Mw 9100,
Mw/Mn = 1.81
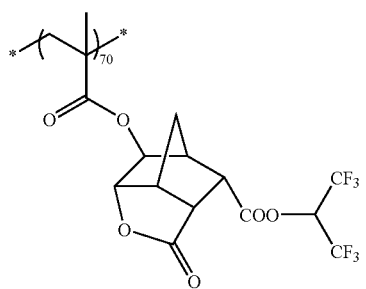
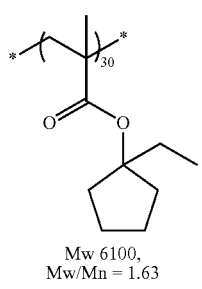
Mw 6100,
Mw/Mn = 1.63
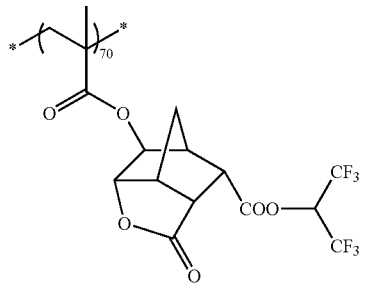
P1-11
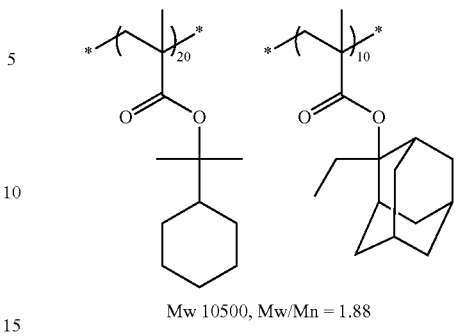
Mw 10500, Mw/Mn = 1.88
<Polymer 2>
P1-12
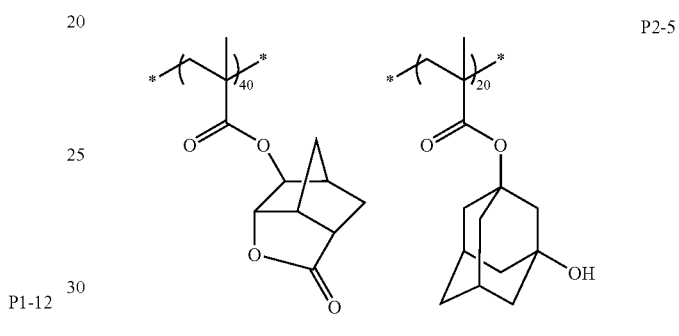 P2-5
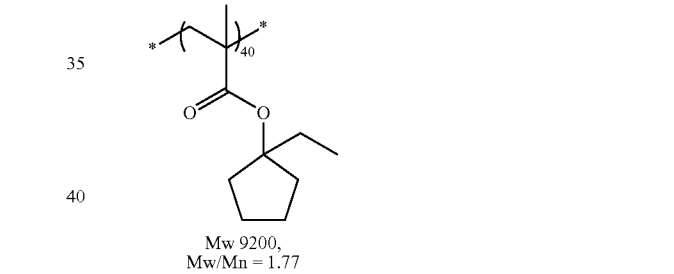
Mw 9200,
Mw/Mn = 1.77
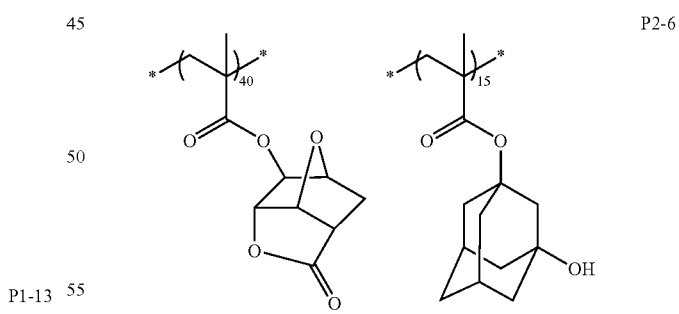 P2-6
P1-13
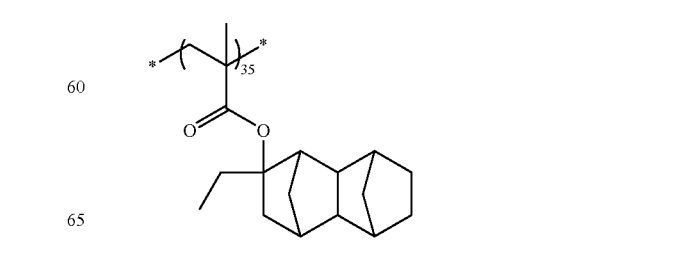

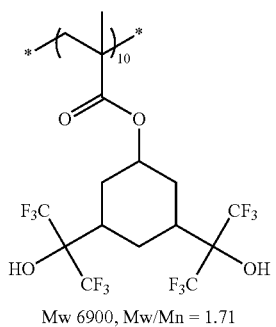
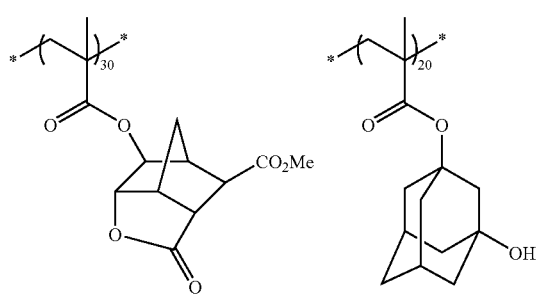
P2-7
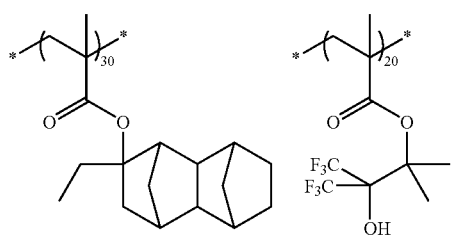
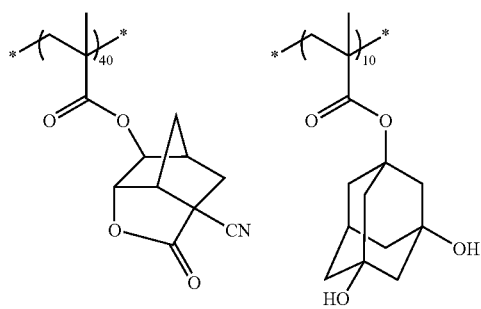
P2-8
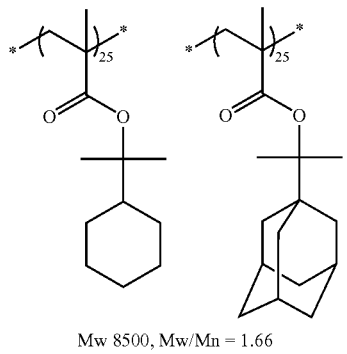
<Acid generator>
PAG5
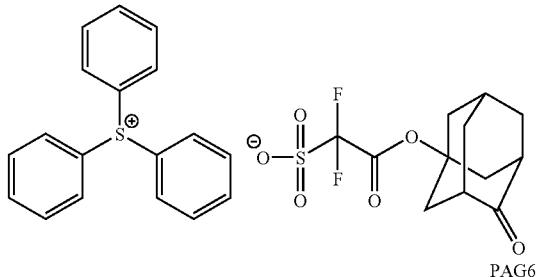
PAG6
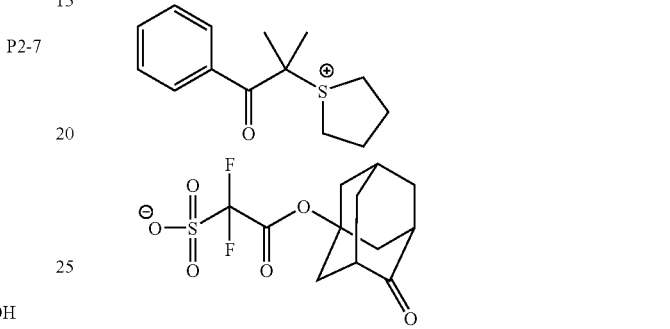
PAG7
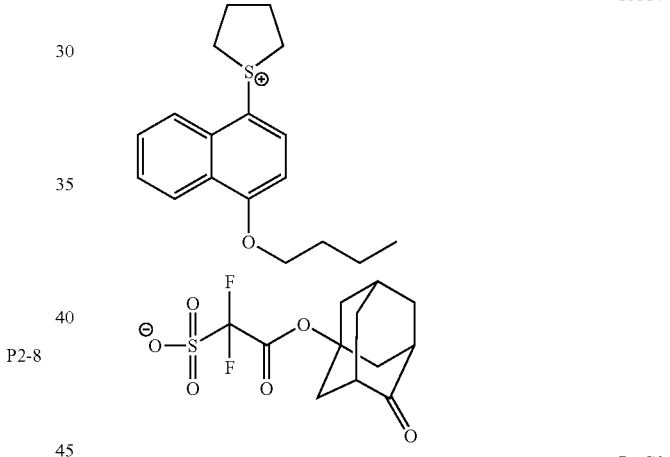
PAG8
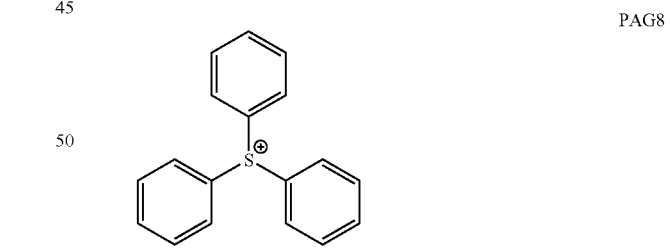
PAG9
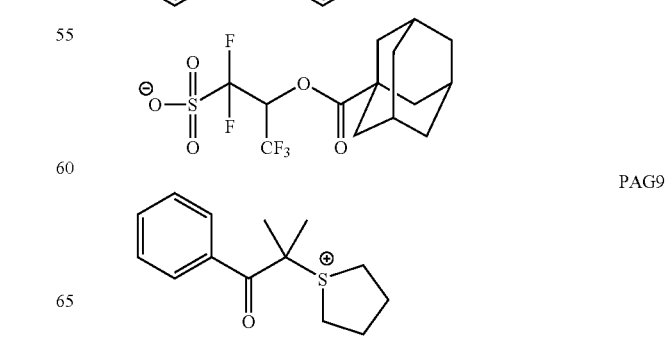

-continued

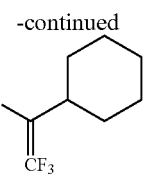

PAG10

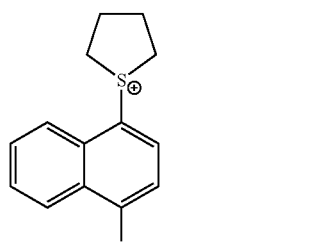

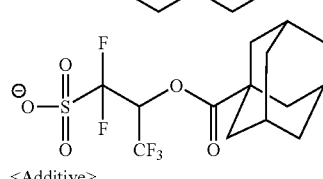

<Additive>

AD-4

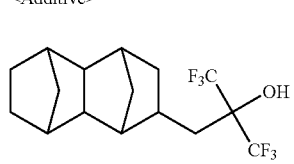

Imaging Performance Test
[Exposure Condition: ArF Liquid Immersion Exposure]
An organic antireflection film ARC29A (produced by Nissan Chemical Industries, Ltd.) was applied onto a silicon wafer and baked at 205° C. for 60 seconds, thereby forming a 98 nm antireflection film. Each of the above prepared positive resist compositions was applied thereonto and baked for 60 seconds at 100° C., thereby forming a 120-nm resist film. The resultant wafer was exposed through a 6% half-tone mask of 65 nm 1:1 line and space pattern by means of an ArF excimer laser scanner (manufactured by ASML, XT1700i, NA 0.85). Ultrapure water was used as the liquid for liquid immersion. Thereafter, the exposed wafer was heated for 60 seconds at 100° C., developed with an aqueous solution of tetramethylammonium hydroxide (2.38 mass %) for 30 seconds, rinsed with pure water and spin dried, thereby obtaining a resist pattern.

[LWR]
Evaluation was made in the same manner as employed for the LWR in Example A, except that the pattern size was changed from 75 nm to 45 nm.

[Exposure Latitude (EL)]
Evaluation was made in the same manner as employed for the EL in Example A, except that the pattern size was changed from 75 nm to 45 nm.

[Pattern Collapse (PC)]
Evaluation was made in the same manner as employed for the PC in Example A, except that the pattern size was changed from 75 nm to 45 nm.

[Development Defect]
Evaluation was made in the same manner as employed for the development defect in Example A.

[Surface Coverage Ratio]
Evaluation was made in the same manner as employed for the surface coverage ratio in Example A.

TABLE 5

| Ex. | Resist | LWR (nm) | EL (%) | PC | Development defect |
|---|---|---|---|---|---|
| 17 | 20 | 5.5 | 17.5 | ○* | 1 |
| 18 | 21 | 4.2 | 17.2 | ○* | 0.45 |
| 19 | 22 | 3.9 | 19.4 | ○* | 0.7 |
| 20 | 23 | 5.4 | 19.2 | ○* | 0.01 |
| 21 | 24 | 4.0 | 19.7 | ○* | 0.15 |
| 22 | 25 | 5.7 | 18.9 | ○* | 0.01 |
| Comp. 4 | 26 | 7.2 | 14.2 | X | 1 |

What is claimed is:
1. A resist composition comprising two or more polymers, as resin (A), containing a first polymer and a second polymer and a compound that when exposed to actinic rays or radiation, generates an acid, wherein the content of the first polymer based on the resin (A) is in a range of 5 to 40 mass % and the content of the second polymer based on the resin (A) is in a range of 60 to 95 mass %, and wherein when the resist composition is formed into a dry resist film, the mixing ratios of at least the first and second polymers in the resist film exhibit a gradient distribution such that the mixing ratios continuously change in entirety or partially in the direction of the depth from the surface of the resist film on the air side toward a support, and wherein the mixing ratio of the first polymer at a superior portion of the resist film is higher than that of the second polymer, while the mixing ratio of the second polymer at an inferior portion of the resist film is higher than that of the first polymer, and
wherein both the first polymer and the second polymer have a repeating unit represented by general formula (AI) indicated below:

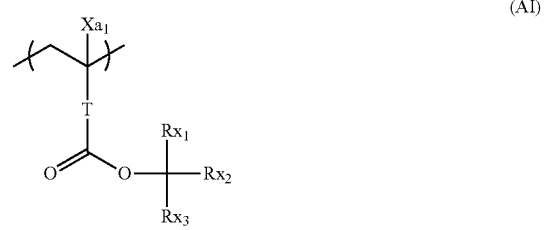

(AI)

wherein in general formula (AI):
$Xa_1$ represents a hydrogen atom, a methyl group, a trifluoromethyl group or a hydroxymethyl group,
T represents a single bond or a bivalent connecting group, and
each of $Rx_1$ to $Rx_3$ independently represents an alkyl group (linear or branched) or a cycloalkyl group (monocyclic or polycyclic), provided that at least two of $Rx_1$ to $Rx_3$ are bonded with each other to thereby form a cycloalkyl group (monocyclic or polycyclic),
wherein the second polymer contains a unit having any of fluoroalcohol partial structures of general formula FA-1 below:

FA-1 wherein in general formula FA-1: each of $R_1$, $R_2$ and $R_3$ independently represents a substituent, provided that any of $R_1$ to $R_3$ is bonded to a polymer and that $R_1$, $R_2$ and $R_3$ may be bonded to each other to thereby form a ring, and wherein each of the first polymer and the second polymer contains a repeating unit having a lactone structure.

2. The resist composition according to claim 1, wherein the first and second polymers satisfy either requirement (i) or requirement (ii) below:
   (i) affinity to air surface: first polymer >second polymer, and
   (ii) affinity to support surface: first polymer <second polymer.

3. The resist composition according to claim 1, wherein the first polymer contains an F atom and/or an Si atom.

4. The resist composition according to claim 1, wherein the second polymer contains an N atom, an Si atom or a Ti atom.

5. The resist composition according to claim 1, wherein the first polymer and/or the second polymer contains two or more repeating units that generate an alkali-soluble group by acid decomposition.

6. The resist composition according to claim 1, wherein at least one of the repeating units represented by the general formula (AI) contained in the first polymer and the second polymer has a 5- or 6-membered monocyclic hydrocarbon protective group.

7. The resist composition according to claim 1, wherein the repeating unit having the lactone structure contained in the second polymer is represented by the general formula (1):

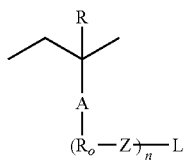

(1)

wherein:
R represents a hydrogen atom or an optionally substituted alkyl group;
A represents:

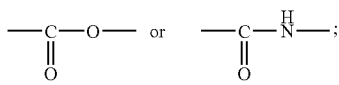

$R_0$, represents an optionally substituted alkylene group, an optionally substituted cycloalkylene group or a combination thereof;
Z, represents an ether bond, an ester bond, an amido bond, a urethane bond or a urea bond;
L represents a substituent with a lactone structure; and
n represents the number of repetitions and is an integer of 1 to 5.

8. A method of forming a pattern, comprising the steps of forming the resist composition according to claim 1 into a resist film, exposing the resist film to light and developing the exposed film.

9. The resist composition according to claim 1, wherein the first polymer contains a repeating unit with a lactone structure having a substituent containing a fluorine atom.

10. The resist composition according to claim 9, wherein the repeating unit with the lactone structure is represented by general formula (F5):

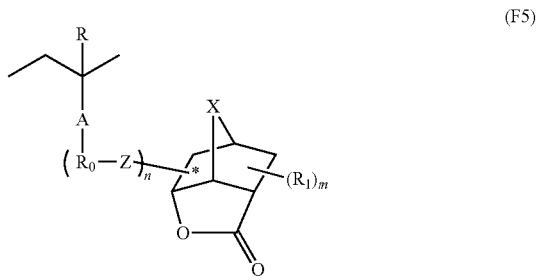

(F5)

wherein:
R represents a hydrogen atom or an optionally substituted alkyl group;
A represents:

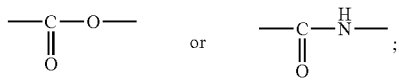

$R_0$, represents an optionally substituted alkylene group, an optionally substituted cycloalkylene group or a combination thereof;
Z, represents an ether bond, an ester bond, an amido bond, a urethane bond or a urea bond;
$R_1$, represents an optionally substituted alkyl group, an optionally substituted cycloalkyl group, an optionally substituted ester group, a cyano group, a hydroxyl group or an alkoxy group, with the proviso that in the presence of two or more groups, two $R_1$s may be bonded with each other to thereby form a ring and provided that at least one $R_1$ represents a substituent containing a fluorine atom;
X represents an alkylene group, an oxygen atom or a sulfur atom;
m represents the number of substituents and is an integer of 1 to 5; and
n represents the number of repetitions and is an integer of 1 to 5.

11. The resist composition according to claim 1, wherein the first polymer and/or the second polymer contains a repeating unit having at least two groups selected from the group consisting of a lactone group, a hydroxyl group, a cyano group and an alkali soluble group.

12. The resist composition according to claim 1, wherein the content of the first polymer based on the resin (A) is in the range of 7 to 30 mass % and the content of the second polymer based on the resin (A) is in the range of 70 to 93 mass %.

13. The resist composition according to claim 1, wherein the compound that when exposed to actinic rays or radiation, generates an acid is represented by general formula (I):

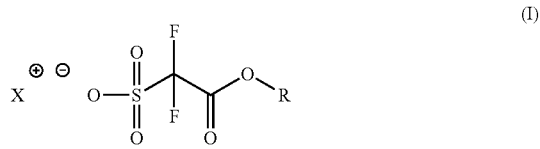

(I)

wherein in general formula (I):

X+ represents an organic counter ion, and R represents a hydrogen atom or a substituent having 1 or more carbon atoms.

14. The resist composition according to claim 1, wherein the compound that when exposed to actinic rays or radiation, generates an acid is represented by general formula (ZI-4):

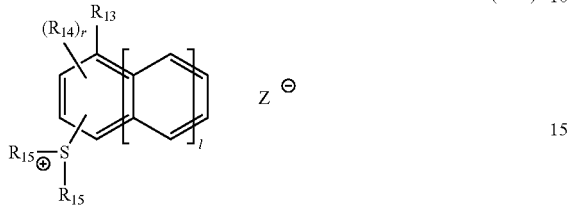

(ZI-4)

wherein in general formula (ZI-4):

$R_{13}$ represents a hydrogen atom, a fluorine atom, a hydroxyl group, an alkyl group, a cycloalkyl group, an alkoxy group or an alkoxycarbonyl group, $R_{14}$, represents an alkyl group, a cycloalkyl group, an alkoxy group, an alkylsulfonyl group or a cycloalkylsulfonyl group, each of $R_{15}$s independently represents an alkyl group or a cycloalkyl group, provided that the two $R_{15}$s may be bonded to each other to thereby form a ring, l is an integer of 0 to 2, r is an integer of 0 to 10, and $Z^-$ represents a nonnucleophilic anion.

* * * * *